United States Patent
Toyotaka et al.

(10) Patent No.: US 9,507,220 B2
(45) Date of Patent: Nov. 29, 2016

(54) LIQUID CRYSTAL DISPLAY DEVICE AND DRIVING METHOD THEREOF

(75) Inventors: Kouhei Toyotaka, Atsugi (JP); Ryo Arasawa, Isehara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 429 days.

(21) Appl. No.: 13/193,769

(22) Filed: Jul. 29, 2011

(65) Prior Publication Data
US 2012/0033151 A1 Feb. 9, 2012

(30) Foreign Application Priority Data

Aug. 6, 2010 (JP) ................... 2010-178173

(51) Int. Cl.
*G02F 1/1343* (2006.01)
*G02F 1/1362* (2006.01)
(Continued)

(52) U.S. Cl.
CPC ....... *G02F 1/134336* (2013.01); *G09G 3/3426* (2013.01); *G09G 3/3607* (2013.01); *G09G 3/3648* (2013.01); *H01L 27/1225* (2013.01); *H01L 29/7869* (2013.01); *G02F 1/13624* (2013.01); *G02F 2001/134345* (2013.01); *G02F 2001/136245* (2013.01);
(Continued)

(58) Field of Classification Search
CPC ............... G02F 1/133555; G02F 1/13624; G02F 2001/136245; G02F 2203/09; G02F 2001/134345
USPC .......................................... 349/48, 114, 144
See application file for complete search history.

(56) References Cited

U.S. PATENT DOCUMENTS 6,597,348 B1 7/2003 Yamazaki et al.
6,771,334 B2 8/2004 Kubota et al.
(Continued)

FOREIGN PATENT DOCUMENTS

EP 1326129 A 7/2003
JP 2000-180825 A 6/2000
(Continued)

OTHER PUBLICATIONS

Baron et al., "36.4: Can Motion Compensation Eliminate Color Breakup of Moving Objects in Field-Sequential Color Displays?" SID Digest '96: SID International Symposium Digest of Technical Papers, 1996, vol. 27, pp. 843-846.
(Continued)

*Primary Examiner* — Jessica M Merlin
(74) *Attorney, Agent, or Firm* — Robinson Intellectual Property Law Office; Eric J. Robinson

(57) ABSTRACT

A reflective region where display is performed with reflection of incident light through a liquid crystal layer and a transmissive region where display is performed by transmission of light from a backlight are provided, and the reflective mode and the transmissive mode are switched. In the case of displaying a full-color image, a pixel portion includes at least a first region and a second region, a plurality of lights of different hues are sequentially supplied to the first region according to a first order, and a plurality of lights of different hues are also sequentially supplied to the second region according to a second order which is different from the first order. In the transmissive mode, the reflective region is made to display black, so that decrease in contrast due to reflection of external light at the reflective region is prevented.

27 Claims, 29 Drawing Sheets

(51) Int. Cl.
  *H01L 27/12* (2006.01)
  *H01L 29/786* (2006.01)
  *G09G 3/34* (2006.01)
  *G09G 3/36* (2006.01)

(52) U.S. Cl.
  CPC ... *G09G 3/3677* (2013.01); *G09G 2300/0852* (2013.01); *G09G 2310/0235* (2013.01); *G09G 2320/0242* (2013.01); *G09G 2340/06* (2013.01)

(56) References Cited

U.S. PATENT DOCUMENTS

| | | | |
|---|---|---|---|
| 6,836,306 B2 | 12/2004 | Kubota et al. | |
| 6,882,012 B2 | 4/2005 | Yamazaki et al. | |
| 7,145,536 B1 | 12/2006 | Yamazaki et al. | |
| 7,193,593 B2 | 3/2007 | Koyama et al. | |
| 7,224,339 B2 | 5/2007 | Koyama et al. | |
| 7,268,756 B2 | 9/2007 | Koyama et al. | |
| 7,286,192 B2 | 10/2007 | Lin et al. | |
| 7,317,438 B2 | 1/2008 | Yamazaki et al. | |
| 7,385,579 B2 | 6/2008 | Satake | |
| 7,425,937 B2 | 9/2008 | Inukai | |
| 7,567,312 B2 | 7/2009 | Lin et al. | |
| 7,791,571 B2 | 9/2010 | Ohtani et al. | |
| 8,395,573 B2 | 3/2013 | Shibazaki et al. | |
| 8,773,338 B2* | 7/2014 | Miyake | 345/87 |
| 2003/0214472 A1* | 11/2003 | Chen | G02F 1/136213 345/87 |
| 2005/0012097 A1 | 1/2005 | Yamazaki et al. | |
| 2005/0018113 A1* | 1/2005 | Shen et al. | 349/114 |
| 2007/0279359 A1 | 12/2007 | Yoshida et al. | |
| 2007/0279374 A1 | 12/2007 | Kimura et al. | |
| 2008/0035920 A1* | 2/2008 | Takechi et al. | 257/43 |
| 2008/0192158 A1* | 8/2008 | Yoshihara et al. | 349/33 |
| 2008/0252804 A1 | 10/2008 | Saitoh et al. | |
| 2008/0297676 A1* | 12/2008 | Kimura | 349/39 |
| 2008/0297702 A1* | 12/2008 | Cho et al. | 349/68 |
| 2008/0303020 A1* | 12/2008 | Shin et al. | 257/43 |
| 2009/0046216 A1* | 2/2009 | Chen | 349/48 |
| 2009/0321737 A1 | 12/2009 | Isa et al. | |
| 2010/0148177 A1 | 6/2010 | Koyama et al. | |
| 2010/0182282 A1 | 7/2010 | Kurokawa et al. | |
| 2010/0328564 A1* | 12/2010 | Jeong et al. | 349/39 |
| 2011/0157216 A1 | 6/2011 | Yamazaki et al. | |
| 2011/0157253 A1 | 6/2011 | Yamazaki et al. | |
| 2011/0248970 A1 | 10/2011 | Koyama et al. | |
| 2011/0249037 A1 | 10/2011 | Koyama et al. | |
| 2011/0249038 A1 | 10/2011 | Yamazaki et al. | |
| 2011/0273654 A1* | 11/2011 | Wang et al. | 349/143 |
| 2012/0001954 A1 | 1/2012 | Yamazaki et al. | |
| 2012/0001955 A1 | 1/2012 | Yamazaki et al. | |
| 2012/0002127 A1 | 1/2012 | Yamazaki et al. | |
| 2012/0235979 A1 | 9/2012 | Shibazaki et al. | |

FOREIGN PATENT DOCUMENTS

| | | |
|---|---|---|
| JP | 2002-207227 A | 7/2002 |
| JP | 2003-248463 A | 9/2003 |
| JP | 2004-126199 A | 4/2004 |
| JP | 2005-148173 A | 6/2005 |
| JP | 2006-220685 A | 8/2006 |
| JP | 2006-343733 A | 12/2006 |
| JP | 2007-121368 A | 5/2007 |
| JP | 2007-264211 A | 10/2007 |
| JP | 2007-264443 A | 10/2007 |
| JP | 2008-281982 A | 11/2008 |
| JP | 2009-042405 A | 2/2009 |
| JP | 2009-229707 A | 10/2009 |

OTHER PUBLICATIONS

Kurita et al., "Evaluation and Improvement of Picture Quality for Moving Images on Field-sequential Color Displays," IDW '00: Proceedings of the 17th International Display Workshops, 2000, pp. 69-72.

Taira et al., "A15" Field-Sequential Display without Color Break-Up using an AFLC Color Shutter, IDW '00: Proceedings of the 17th International Display Workshops, 2000, pp. 73-76.

Jarvenpaa, "7.2: Measuring Color Breakup of Stationary Images in Field-Sequential-Color Displays," SID Digest '04: SID International Symposium Digest of Technical Papers, 2004, vol. 35, pp. 82-85.

* cited by examiner

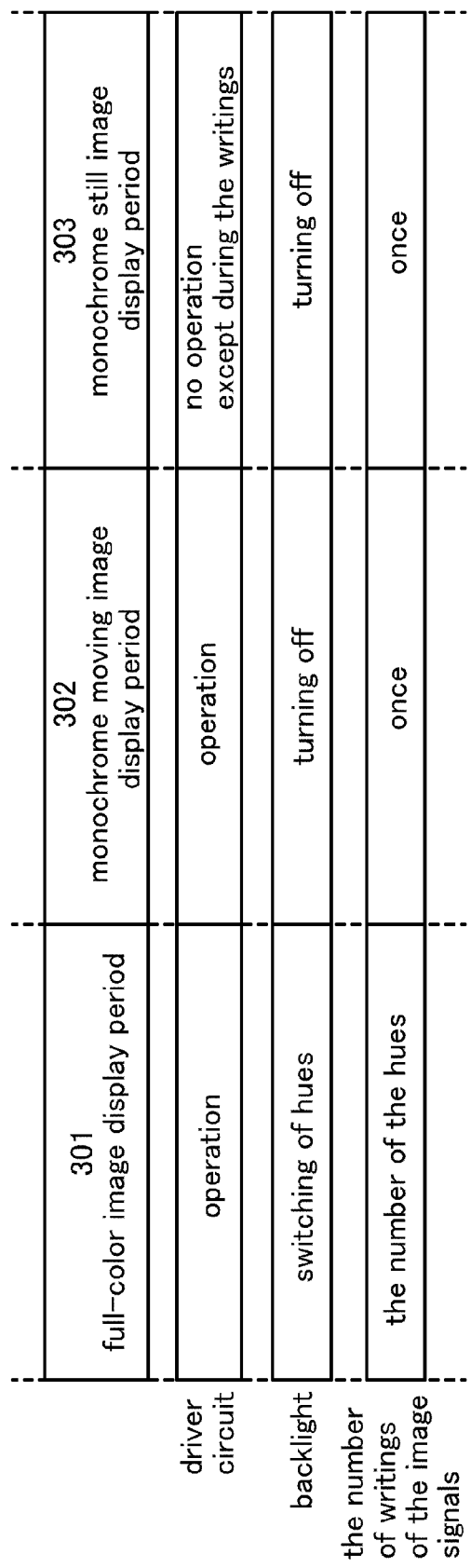

FIG. 20A
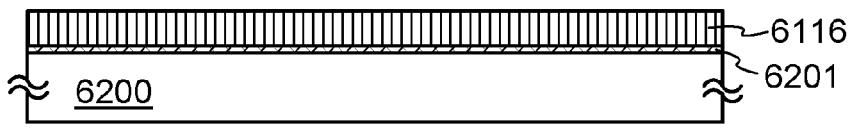
FIG. 20B
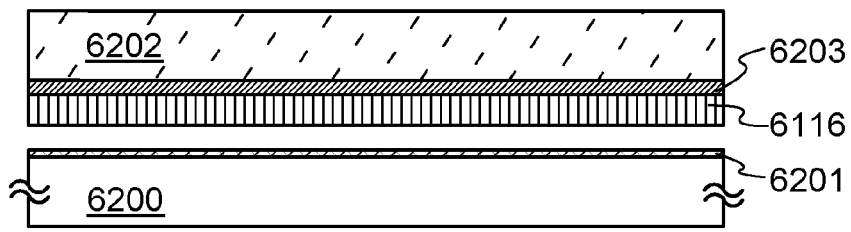
FIG. 20C
FIG. 20C'
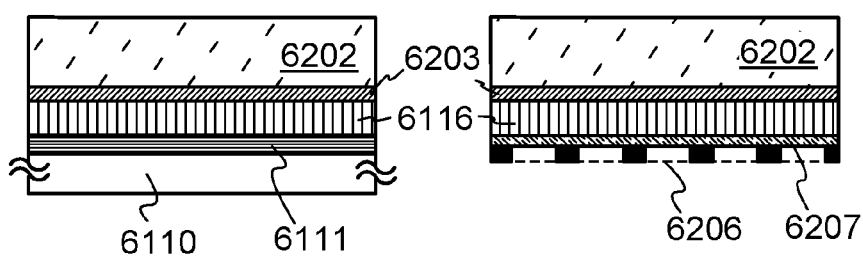
FIG. 20D
FIG. 20D'
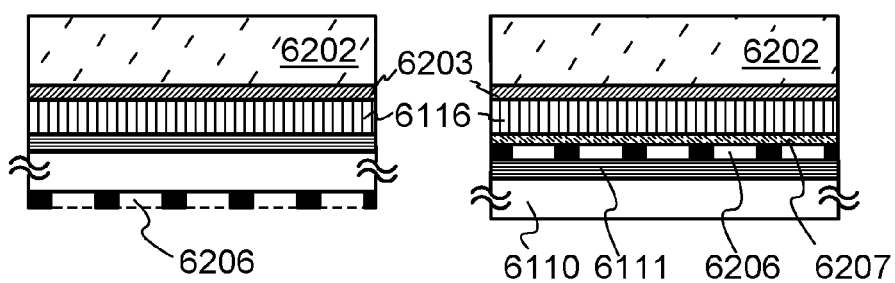
FIG. 20E
FIG. 20E'
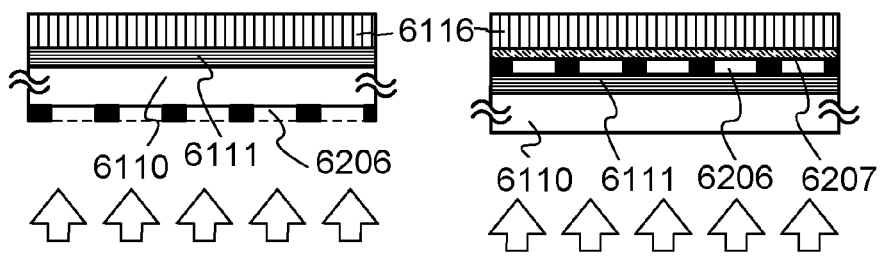

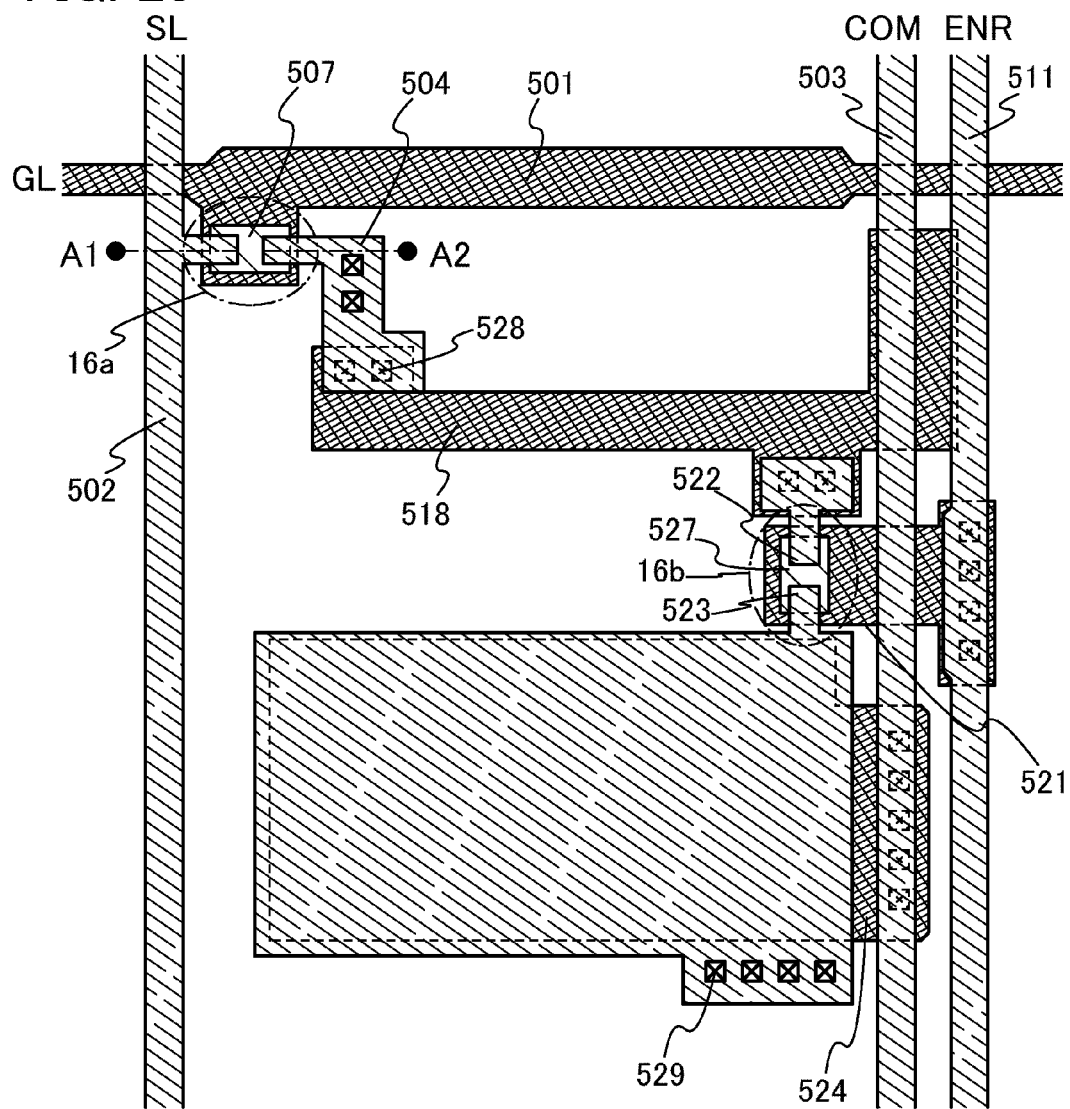

LIQUID CRYSTAL DISPLAY DEVICE AND DRIVING METHOD THEREOF

BACKGROUND OF THE INVENTION

1. Field of the Invention

The present invention relates to a liquid crystal display device and a method for driving the liquid crystal display device.

2. Description of the Related Art

It is known that liquid crystal display devices are roughly divided into two kinds of liquid crystal display devices: transmissive liquid crystal display devices and reflective liquid crystal display devices.

In a transmissive liquid crystal display device, a backlight such as a cold cathode fluorescent lamp is used, and a state in which light from the backlight is transmitted through a liquid crystal and output to the outside of the liquid crystal display device or a state in which light is not output is selected using optical modulation action of liquid crystal, whereby bright and dark images are displayed. Further, those displays are combined to display an image.

In a reflective liquid crystal display device, a state in which external light, in other words, incident light is reflected at a pixel electrode and output to the outside of the device or a state in which incident light is not output to the outside of the device is selected using optical modulation action of liquid crystal, whereby bright and dark images are displayed. Further, those displays are combined to display an image.

A color filter method and a field-sequential method are known as display methods of liquid crystal display devices. Liquid crystal display devices in which images are displayed by a field-sequential method are provided with a plurality of light sources exhibiting different colors (e.g., red (R), green (G), and blue (B)). A desired color is produced in such a manner that the plurality of light sources exhibiting different colors sequentially emit light and transmission of a light of each color is controlled in each pixel, so that color display is performed. That is, a field-sequential method is a method in which a desired color is realized with division of the display period into respective display periods for respective lights of colors.

Patent Document 1 discloses a liquid crystal display device in which images are displayed by a field-sequential method. Specifically, Patent Document 1 discloses a liquid crystal display device in which pixels each include a transistor for controlling input of an image signal, a signal storage capacitor for holding the image signal, and a transistor for controlling transfer of electric charge from the signal storage capacitor to a display pixel capacitor. In the liquid crystal display device having this structure, writing of an image signal to the signal storage capacitor and display corresponding to electric charge held at the display pixel capacitor can be performed at the same time.

REFERENCE

Patent Document

[Patent Document 1] Japanese Published Patent Application No. 2009-42405

SUMMARY OF THE INVENTION

An object of one embodiment of the present invention is to provide a liquid crystal display device capable of image display according to an environment around the liquid crystal display device, e.g., in a bright environment or a dim environment.

Another object is to provide a liquid crystal display device capable of image display in both modes of a reflective mode in which external light is used as a light source and a transmissive mode in which a backlight is used.

One embodiment of the present invention is a liquid crystal display device which is provided with a region (a reflective region) where display is performed with reflection of incident light through a liquid crystal layer and a region (a transmissive region) where display is performed with transmission of light from a backlight and can switch the transmissive mode and the reflective mode. In the transmissive mode, a first transistor connected to a first pixel electrode in the transmissive region is driven and a second transistor connected to a second pixel electrode in the reflective region is turned off. The first pixel electrode is formed using a conductive material transmitting light, and the second pixel electrode is formed using a conductive material reflecting light.

In the transmissive mode, a period in which the second transistor connected to the second pixel electrode in the reflective region is turned on is provided every one frame or every plural frames, and an image signal of black is held in the reflective region during the period. An image signal of black is held in the reflective region in the transmissive mode, so that reduction in contrast due to reflection of external light at the reflective region can be prevented.

The reflective region and the transmissive region are provided in one pixel and a signal line for supplying an image signal is shared by the reflective region and the transmissive region, whereby the number of wirings per pixel can be reduced. Specifically, the first transistor in the transmissive region is connected to a signal line and the second transistor in the reflective region is connected to the signal line via the first transistor. In the reflective mode, the first transistor and the second transistor are turned on, so that an image signal is supplied from the signal line to the reflective region.

Display in the transmissive region is performed by a novel field-sequential method in which image signal writing and lighting of the backlight are sequentially performed not in the whole pixel portion but in each given region of the pixel portion. Note that as light sources of the backlight, a plurality of light-emitting diodes (LEDs) are used, with which lower power consumption than a cold cathode fluorescent lamp and adjustment of intensity of light can be realized.

The novel field-sequential method enables reduction of the phenomenon that a user sees display which is changed (degraded) from display based on original display data. Such a phenomenon is caused by lack of specific display data due to block of the display for a short time, such as a user's blink, and is referred to as a color break or color breakup.

One embodiment of the present invention disclosed in this specification includes a panel including a pixel portion and a driving circuit which controls input of image signals to the pixel portion; and a backlight. The backlight includes a plurality of light sources emitting lights of different hues. In addition, in one embodiment of the present invention, driving methods of the light sources are switched depending on whether a full-color image is displayed or a monochrome image is displayed.

When a full-color image is displayed, a transmissive mode utilizing the novel field-sequential method is set, and the pixel portion is divided into a plurality of regions and lighting of the light sources is controlled per region. Specifically, the pixel portion includes at least a first region and a second region, a plurality of lights of different hues are sequentially supplied to the first region according to a first order, and a plurality of lights of different hues are also sequentially supplied to the second region according to a second order which is different from the first order.

When a monochrome image is displayed, supply of light from the light sources is stopped and a reflective mode is set, so that a still image or a moving image is displayed by utilizing external light in the entire reflective region in the pixel portion or per region.

In one embodiment of the present invention, when the monochrome image is a still image, the driving frequency is lower than that in the case where the monochrome image is a moving image. Further, in one embodiment of the present invention, a liquid crystal element and an insulated gate field effect transistor whose off-state current is extremely low (hereinafter referred to simply as a transistor) for controlling holding of a voltage applied to the liquid crystal element are provided in a pixel portion of a liquid crystal display device in order to lower the driving frequency. With the use of the transistor whose off-state current is extremely low, the period in which a voltage applied to the liquid crystal element is held can be longer. Accordingly, for example, in the case where image signals each having the same image information are written to a pixel portion for some consecutive frame periods, like a still image, display of an image can be maintained even when the driving frequency is low, in other words, the number of writings of image signals in a certain period is reduced.

One embodiment of the present invention is a liquid crystal display device including a plurality of light sources emitting lights of different hues and a pixel portion including a plurality of pixels. Each pixel includes a first pixel electrode transmitting light, a second pixel electrode reflecting light, a first transistor, and a second transistor. One of a source and a drain of the first transistor is electrically connected to a signal line, the other of the source and the drain of the first transistor is electrically connected to the first pixel electrode and one of a source and a drain of the second transistor, and the other of the source and the drain of the second transistor is electrically connected to the second pixel electrode.

One embodiment of the present invention is the above liquid crystal display device, in which color display is performed by dividing the pixel portion into a plurality of regions, controlling lighting of a plurality of light sources emitting lights of different hues in each of the plurality of regions, and driving the first transistor to apply a voltage to a part of a liquid crystal layer overlapping with the first pixel electrode, and monochrome display is performed by driving the first transistor and the second transistor to apply a voltage to a part of the liquid crystal layer overlapping with the second pixel electrode in a period during which a plurality of light sources is off.

One embodiment of the present invention is the above liquid crystal display device, in which the pixel portion is divided into at least a first region and a second region, a plurality of lights of different hues are sequentially supplied to the first region according to a first order, and a plurality of lights of different hues are also sequentially supplied to the second region according to a second order which is different from the first order.

The above transistors each include, in a channel formation region, a semiconductor material having a wider band gap and a lower intrinsic carrier density than silicon. With a channel formation region including a semiconductor material having the above characteristics, a transistor with an extremely low off-state current can be realized. As an example of such a semiconductor material, an oxide semiconductor having a band gap which is approximately three times as wide as that of silicon can be given. In contrast to a transistor formed using a normal semiconductor material, such as silicon or germanium, a transistor that has the above-described structure and is used as a switching element for holding a voltage applied to a liquid crystal element can effectively prevent leakage of electric charge from the liquid crystal element.

The above-described pixel portion includes a region where the transmittance of a liquid crystal layer is controlled according to a voltage of a full-color image signal that is input, a first transistor which controls holding of a voltage that is to be applied to the liquid crystal layer overlapping with the above-described region, a region where the reflectance of the liquid crystal layer is controlled according to a voltage of a monochrome image signal that is input, and a second transistor which controls holding of a voltage that is to be applied to the liquid crystal layer overlapping with the latter region. A channel formation region of each of the first and second transistors includes a semiconductor material having a wider band gap and a lower intrinsic carrier density than a silicon semiconductor, such as an oxide semiconductor.

Note that an oxide semiconductor which is purified (purified OS) by reduction of an impurity such as moisture or hydrogen which serves as an electron donor (donor) can be made to be an i-type (intrinsic) oxide semiconductor or an oxide semiconductor extremely close to an i-type semiconductor (a substantially i-type oxide semiconductor) by supplying oxygen to the oxide semiconductor to reduce oxygen deficiency in the oxide semiconductor. A transistor including the i-type or substantially i-type oxide semiconductor has a characteristic of extremely low off-state current.

The hydrogen concentration in the purified oxide semiconductor which is measured by secondary ion mass spectrometry (SIMS) is less than or equal to $5 \times 10^{19}/cm^3$, preferably less than or equal to $5 \times 10^{18}/cm^3$, further preferably less than or equal to $5 \times 10^{17}/cm^3$, still further preferably less than or equal to $1 \times 10^{16}/cm^3$.

In addition, the carrier density of the i-type or substantially i-type oxide semiconductor, which is measured by Hall effect measurement, is less than $1 \times 10^{14}/cm^3$, preferably less than $1 \times 10^{12}/cm^3$, further preferably less than $1 \times 10^{11}/cm^3$. Furthermore, the band gap of the oxide semiconductor is 2 eV or more, preferably 2.5 eV or more, further preferably 3 eV or more. The transistor including the i-type or substantially i-type oxide semiconductor can have low off-state current.

The analysis of the concentration of hydrogen in the oxide semiconductor film is described here. The concentrations of hydrogen in the oxide semiconductor film and a conductive film are measured by secondary ion mass spectrometry (SIMS). It is known that it is difficult to obtain data in the proximity of a surface of a sample or in the proximity of an interface between stacked films formed using different materials by the SIMS analysis in principle. Thus, in the case where distributions of the hydrogen concentrations of the films in thickness directions are analyzed by SIMS, an average value in a region where the films are provided, the value is not greatly changed, and almost the same value can be obtained are employed as the hydrogen concentration. Further, in the case where the thickness of the film is small, a region where almost the same value can be obtained cannot be found in some cases due to the influence of the hydrogen concentration of the films adjacent to each other. In this case, the maximum value or the minimum value of the hydrogen concentration of a region where the films are provided is employed as the hydrogen concentration in the film. Furthermore, in the case where a mountain-shaped peak having the maximum value and a valley-shaped peak having the minimum value do not exist in the region where the films are provided, the value of the inflection point is employed as the hydrogen concentration.

Various experiments can actually prove low off-state current of the transistor including the i-type or substantially i-type oxide semiconductor film as an active layer. For example, even with an element with a channel width of $1\times10^6$ μm and a channel length of 10 μm, in a range of from 1 V to 10 V of voltage (drain voltage) between a source electrode and a drain electrode, it is possible that off-state current (which is drain current in the case where voltage between a gate electrode and the source electrode is 0 V or less) is less than or equal to the measurement limit of a semiconductor parameter analyzer, that is, less than or equal to $1\times10^{-13}$ A. In this case, it can be found that an off-state current density corresponding to a value obtained by dividing the off-state current by the channel width of the transistor is less than or equal to 100 zA/μm. In addition, a capacitor and a transistor were connected to each other and an off-state current density was measured by using a circuit in which electric charge flowing into or from the capacitor was controlled by the transistor. In the measurement, the i-type or substantially i-type oxide semiconductor film was used for a channel formation region of the transistor, and the off-state current density of the transistor was measured from a change in the amount of charge of the capacitor per unit time. As a result, it was found that in the case where the voltage between the source electrode and the drain electrode of the transistor was 3V, a lower off-state current density of several tens yoctoampere per micrometer (yA/μm) was able to be obtained. Thus, in a semiconductor device according to one embodiment of the present invention, the off-state current density of the transistor in which the i-type or substantially i-type oxide semiconductor film is used as an active layer can be set to less than or equal to 100 yA/μm, preferably less than or equal to 10 yA/μm, further preferably less than or equal to 1 yA/μm depending on the voltage between the source electrode and the drain electrode. Accordingly, the transistor including the i-type or substantially i-type oxide semiconductor film as an active layer has much lower off-state current than a transistor including silicon having crystallinity.

As the oxide semiconductor, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, an In—O-based oxide semiconductor, a Sn—O-based oxide semiconductor, a Zn—O-based oxide semiconductor, or the like can be used. Note that in this specification, for example, an In—Sn—Ga—Zn—O-based oxide semiconductor means a metal oxide including indium (In), tin (Sn), gallium (Ga), and zinc (Zn). There is no particular limitation on the composition ratio. The above oxide semiconductor may include silicon oxide. Note that the oxide semiconductor may be amorphous or crystallized partly or entirely.

When a crystalline oxide semiconductor is used as the oxide semiconductor, the oxide semiconductor is preferably formed over a level (flat) surface. Specifically, the oxide semiconductor is preferably formed over a surface whose average surface roughness (Ra) is 1 nm or less, further preferably 0.3 nm or less. Ra can be measured using an atomic force microscope (AFM).

The oxide semiconductor preferably includes In, and further preferably includes In and Zn. In addition, Ga, Sn, Hf, Al, or a lanthanoid may be included in the above oxide semiconductor. Dehydration or dehydrogenation is effective for purification of the oxide semiconductor.

In this specification, oxide semiconductors can be represented by the chemical formula, $InMO_3(ZnO)_m(m>0)$, for example. Here, M represents one or more metal elements selected from Sn, Zn, Ga, Al, Mn, and Co.

With one embodiment of the present invention, it is possible to realize a liquid crystal display device capable of image display using a reflective mode utilizing external light as a light source and a transmissive mode utilizing a backlight according to an environment around the liquid crystal display device, e.g., in a bright environment or a dim environment. For example, a moving image is displayed using a transmissive mode, and a still image is displayed using a reflective mode.

In the transmissive mode, black is displayed in the reflective region, so that reduction in contrast due to reflection of external light at the reflective region can be prevented.

With the use of a transistor whose off-state current is extremely low, a period during which a voltage applied to a liquid crystal element is held can be longer. Accordingly, for example, the driving frequency with which a still image is displayed can be lower than that with which a moving image is displayed. Therefore, a liquid crystal display device with reduced power consumption in displaying a still image can be realized.

BRIEF DESCRIPTION OF THE DRAWINGS

FIG. 3 schematically shows operations of a liquid crystal display device and a backlight.

FIGS. 20A, 20B, 20C, 20C', 20D, 20D', 20E, and 20E' are cross-sectional views illustrating methods for manufacturing liquid crystal display devices.

FIG. 23 illustrates an example of a top view of a pixel.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

(Embodiment 1)

Figure 1:
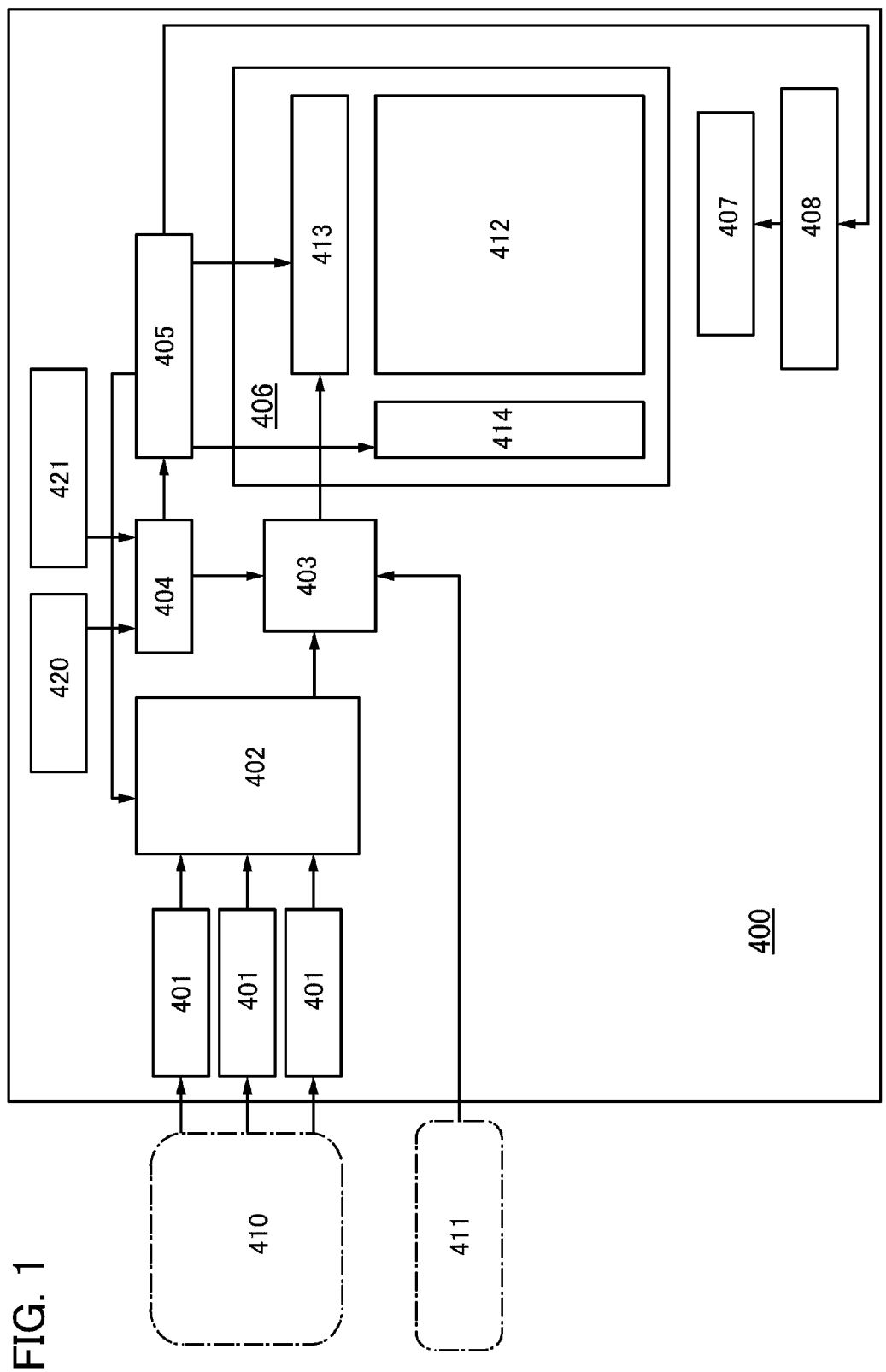
FIG. 1 is a block diagram showing a structure of a liquid crystal display device.

In this embodiment, a liquid crystal display device including a still-image mode and a moving-image mode will be described with reference to FIG. 1. Note that in this specification, a mode performed in such a way that a display device determines image signals input to the display device as a still image is described as a still-image mode, and a mode performed in such a way that the display device determines the image signals input to the display device as a moving image is described as a moving-image mode.

A liquid crystal display device 400 in this embodiment includes a plurality of image memories 401, an image data selection circuit 402, a selector 403, a CPU 404, a controller 405, a panel 406, a backlight 407, and a backlight control circuit 408.

Image data corresponding to a full-color image (full-color image data 410), which are input to the liquid crystal display device 400, are stored in the plurality of image memories 401. The full-color image data 410 include image data corresponding to their respective hues. The image data corresponding to the respective hues are stored in the respective image memories 401.

As the image memories 401, for example, memory circuits such as dynamic random access memories (DRAMs) or static random access memories (SRAMs) can be used.

The image data selection circuit 402 reads the full-color image data, which are stored in the plurality of image memories 401 and correspond to the respective hues, and sends the full-color image data to the selector 403 according to a command from the controller 405.

In addition, image data corresponding to a monochrome image (monochrome image data 411) are also input to the liquid crystal display device 400. Then, the monochrome image data 411 are input to the selector 403.

Note that an image displayed with color gradations by using a plurality of light sources of colors having different hues is a full-color image. In addition, an image displayed by using a reflective electrode with the light sources turned off is a monochrome image.

Although the structure in which the monochrome image data 411 are directly input to the selector 403 is employed in this embodiment, the structure of one embodiment of the present invention is not limited to this structure. The monochrome image data 411 may also be stored in the image memories 401 and then read by the image data selection circuit 402 similarly to the full-color image data 410. In that case, the selector 403 is included in the image data selection circuit 402.

Alternatively, the monochrome image data 411 may be formed by synthesizing the full-color image data 410 in the liquid crystal display device 400.

The CPU 404 controls the selector 403 and the controller 405 so that the operations of the selector 403 and the controller 405 are switched between full-color image display and monochrome image display.

Specifically, in the case of the full-color image display, the selector 403 selects the full-color image data 410 and supplies them to the panel 406 in accordance with a command from the CPU 404. In addition, the controller 405 supplies the panel 406 with a driving signal which is synchronized with the full-color image data 410 and/or a power supply potential which is to be used when the full-color image is displayed, in accordance with a command from the CPU 404.

In the case of the monochrome image display, the selector 403 selects the monochrome image data 411 and supplies them to the panel 406 in accordance with a command from the CPU 404. In addition, the controller 405 supplies the panel 406 with a driving signal which is synchronized with the monochrome image data 411 and/or a power supply potential which is to be used when the monochrome image is displayed, in accordance with a command from the CPU 404.

The panel 406 includes a pixel portion 412 in which each pixel includes a liquid crystal element, and drivers circuits such as a scan line driver circuit 414 and a signal line driver circuit 413. The full-color image data 410 or the monochrome image data 411 from the selector 403 are supplied to the signal line driver circuit 413. In addition, the driving signals and/or the power supply potential from the controller 405 are/is supplied to the scan line driver circuit 414 and/or the signal line driver circuit 413.

Note that the driving signals include a signal line driver circuit start pulse signal (SSP) and a signal line driver circuit clock signal (SCK) which control the operation of the signal line driver circuit 413; a scan line driver circuit start pulse signal (GSP) and a scan line driver circuit clock signal (GCK) which control the operation of the scan line driver circuit 414; and the like.

A plurality of light sources which emit lights of different hues are provided in the backlight 407. The controller 405 controls driving of the light sources included in the backlight 407 through the backlight control circuit 408.

Note that switching between full-color image display and monochrome image display can be performed by hand. In that case, an input device 420 may be provided in the liquid crystal display device 400 so that the CPU 404 controls the switching in accordance with a signal from the input device 420. For example, a user controls switching between full-color image display and monochrome image display with the use of a switch or the like provided for the liquid crystal display device 400.

The liquid crystal display device 400 described in this embodiment may also include a photometric circuit 421. The photometric circuit 421 measures the brightness of an environment where the liquid crystal display device 400 is used. The CPU 404 may control the switching between full-color image display and monochrome image display in accordance with the brightness detected by the photometric circuit 421.

For example, in the case where the liquid crystal display device 400 in this embodiment is used in a dim environment, the CPU 404 may select full-color image display in accordance with a signal from the photometric circuit 421; in the case where the liquid crystal display device 400 is used in a bright environment, the CPU 404 may select monochrome image display in accordance with a signal from the photometric circuit 421. Note that a threshold value may be set in the photometric circuit 421 so that the backlight is turned on when the brightness of a usage environment becomes less than the threshold value.

Next, an example of a specific structure of the panel of the liquid crystal display device according to one embodiment of the present invention will be described.

Figure 2A:
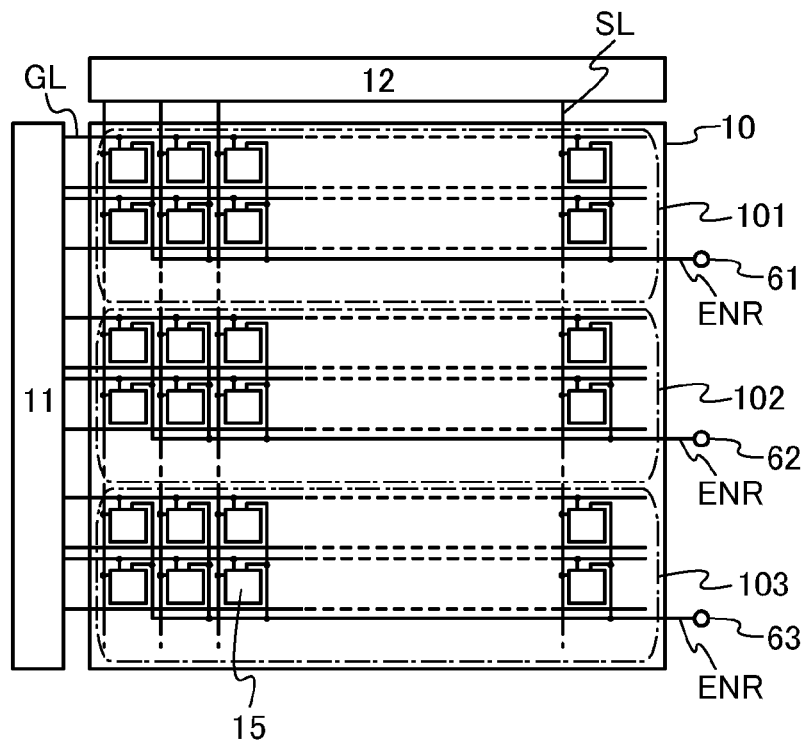
FIGS. 2A and 2B illustrate configurations of a panel and a pixel.

FIG. 2A illustrates a structural example of the liquid crystal display device. The liquid crystal display device illustrated in FIG. 2A includes a pixel portion 10, a scan line driver circuit 11, and a signal line driver circuit 12. In one embodiment of the present invention, the pixel portion 10 is divided into a plurality of regions. Specifically, the pixel portion 10 is divided into three regions (a region 101, a region 102, and a region 103) in FIG. 2A. Each region includes a plurality of pixels 15 arranged in a matrix.

In addition, m scan lines GL whose potentials are controlled by the scan line driver circuit 11, n signal lines SL whose potentials are controlled by the signal line driver circuit 12, and enable lines ENR connected to terminals 61 to 63 are provided for the pixel portion 10. The m scan lines GL are divided into a plurality of groups in accordance with the number of regions of the pixel portion 10. For example, the m scan lines GL are divided into three groups because the pixel portion 10 is divided into three regions in FIG. 2A. The scan lines GL in each group are connected to the plurality of pixels 15 in each corresponding region. Specifically, each scan line GL is connected to n pixels 15 in each corresponding row among the plurality of pixels 15 arranged in a matrix in the corresponding region.

FIG. 2A illustrates a structure in which the enable line ENR included in the region 101 is connected to the terminal 61, the enable line ENR included in the region 102 is connected to the terminal 62, and the enable line ENR included in the region 103 is connected to the terminal 63. A terminal connected to an enable line ENR is provided in each region of the pixel portion 10, whereby a potential supplied to the enable line ENR through the terminal can be controlled in each region. Each of the terminals 61 to 63 may be provided in plural. In particular, when the liquid crystal display device has a larger screen or higher definition, an increase in wiring resistance is likely to cause a voltage drop; however, distribution of each of the terminals 61 to 63 in plural can make a voltage drop due to an increase in wiring resistance less likely to occur. Alternatively, all the enable lines ENR included in the pixel portion 10 can be connected to one terminal.

Regardless of the above regions, each of the signal lines SL is connected to m pixels 15 in each corresponding column among the plurality of pixels 15 arranged in a matrix of m rows by n columns in the pixel portion 10.

Figure 2B:
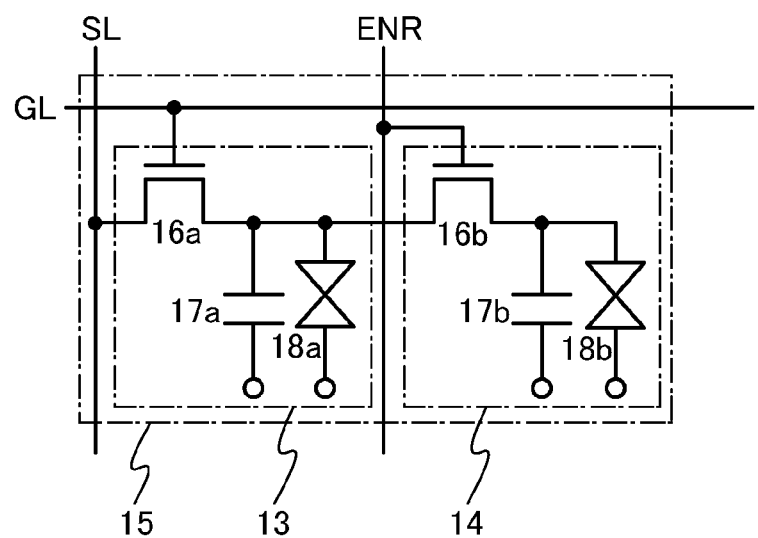

FIG. 2B illustrates an example of a circuit configuration of one of the pixels 15 included in the liquid crystal display device illustrated in FIG. 2A.

The pixel 15 is broadly divided into a transmissive region 13 where light from the backlight is transmitted through a pixel electrode formed using a light-transmitting conductive film and a reflective region 14 where a reflective electrode reflects incident light through a liquid crystal layer. The transmissive region 13 includes a first pixel transistor 16a, a first liquid crystal element 18a, and a first capacitor 17a. A gate of the first pixel transistor 16a is connected to the scan line GL, a first terminal serving as one of a source and a drain of the first pixel transistor 16a is connected to the signal line SL, a second terminal serving as the other of the source and the drain of the first pixel transistor 16a is connected to one electrode of the first liquid crystal element 18a and a first electrode of the first capacitor 17a. The other electrode of the first liquid crystal element 18a is connected to a common electrode. A second electrode of the first capacitor 17a is connected to a capacitor line. The first capacitor 17a functions as a storage capacitor for holding a voltage applied to the first liquid crystal element 18a.

The reflective region 14 includes a second pixel transistor 16b, a second liquid crystal element 18b, and a second capacitor 17b. A gate of the second pixel transistor 16b is connected to an enable line ENR, a first terminal serving as one of a source and a drain of the second pixel transistor 16b is connected to the second terminal of the first pixel transistor 16a, a second terminal serving as the other of the source and the drain of the second pixel transistor 16b is connected to one electrode of the second liquid crystal element 18b and a first electrode of the second capacitor 17b. The other electrode of the second liquid crystal element 18b is connected to the common electrode. A second electrode of the second capacitor 17b is connected to the capacitor line. The second capacitor 17b functions as a storage capacitor for holding a voltage applied to the second liquid crystal element 18b.

In the pixel 15 described in this embodiment, when an image is displayed using the reflective region 14, the first capacitor 17a in the transmissive region 13 can be used as a storage capacitor for holding a voltage applied to the second liquid crystal element 18b in the reflective region 14. Thus, a layout area of the storage capacitor can be reduced.

Note that in FIGS. 2A and 2B, the scan lines GL are driven by the scan line driver circuit 11. In addition, image signals are supplied to the signal lines SL from the signal line driver circuit 12.

In general, a driver circuit needs to be driven at extremely high frequency in the case where field-sequential driving is performed. In order to reduce writing time of an image signal to a pixel, the capacitance of the first capacitor 17a in the transmissive region 13 needs to be reduced. When a still image is displayed, the capacitance of the second capacitor 17b in the reflective region 14 may be increased, so that display of an image can be maintained for a long time. However, when the off-state current of each of the transistors connected to the capacitors is high, the capacitance of the first capacitor 17a and the capacitance of the second capacitor 17b need to be increased more than necessary so that image signals can be surely held.

Accordingly, each of the first pixel transistor 16a and the second pixel transistor 16b is preferably a transistor including an oxide semiconductor layer. A transistor including an oxide semiconductor layer has extremely low off-state current, so that the capacitance of the first capacitor 17a and the capacitance of the second capacitor 17b can be reduced. In particular, by use of a transistor having extremely low off-state current as the second pixel transistor 16b, a period during which a voltage applied to the second liquid crystal element 18b can be prolonged. Thus, in the case where image signals each having the same image information are written to the pixel portion 10 for some consecutive frame periods, like a still image, display of an image can be maintained even when the driving frequency is low, in other words, the number of writings of image signals to the pixel portion 10 in a certain period is reduced. For example, the above-described transistor in which an oxide semiconductor film which is purified is used as an active layer is employed as the second pixel transistor 16b, whereby an interval between writings of image signals can be increased to 10 seconds or more, preferably 30 seconds or more, further preferably 1 minute or more. As the interval between writings of image signals is made longer, power consumption can be further reduced.

When an image displayed by plural times of writing of an image signal is seen, human eyes see images which are switched plural times. Accordingly, such switching might cause eye strain. With a structure where the number of writings of image signals is reduced as described in this embodiment, eyestrain can be alleviated.

In addition, the potential of an image signal can be held for a longer period, so that without the second capacitor 17b for holding a potential of an image signal connected to the second liquid crystal element 18b, the quality of the displayed image can be prevented from being lowered.

As each of the first pixel transistor 16a and the second pixel transistor 16b, a transistor including a compound semiconductor such as silicon carbide (SiC) or gallium nitride (GaN) may be used without limitation to a transistor including an oxide semiconductor layer as long as the semiconductor has a wider band gap and a lower intrinsic carrier density than a silicon semiconductor.

Each of the first liquid crystal element 18a and the second liquid crystal element 18b includes a pixel electrode, a counter electrode, and a liquid crystal layer including a liquid crystal to which a voltage between the pixel electrode and the counter electrode is applied.

As examples of a liquid crystal material used in a liquid crystal layer, the following can be given: a nematic liquid crystal, a cholesteric liquid crystal, a smectic liquid crystal, a discotic liquid crystal, a thermotropic liquid crystal, a lyotropic liquid crystal, a low-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and the like.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is only generated within a narrow range of temperature, a chiral agent or an ultraviolet curable resin is added so that the temperature range is improved. The liquid crystal composition which includes a liquid crystal showing a blue phase and a chiral agent is preferable, because it has a short response time of greater than or equal to 10 μsec and less than or equal to 100 μsec. Another reason is because it is optically isotropic and therefore alignment treatment is not necessary and viewing angle dependence is small.

Moreover, the following methods can be used for driving the liquid crystal, for example: a TN (twisted nematic) mode, an STN (super twisted nematic) mode, a VA (vertical alignment) mode, an MVA (multi-domain vertical alignment) mode, an IPS (in-plane-switching) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer network liquid crystal) mode, and a guest-host mode.

Note that the pixel 15 may further include another circuit element such as a transistor, a diode, a resistor, a capacitor, or an inductor as needed.

By inversion driving in which the polarity of the potential of an image signal is inverted using a potential of a counter electrode as a reference potential, deterioration of a liquid crystal called burn-in can be prevented. However, by the inversion driving, the change in the potential supplied to the signal line is increased at the time of changing the polarity of the image signal; thus, a potential difference between a source electrode and a drain electrode of the second pixel transistor 16b is increased. Accordingly, deterioration of characteristics of the second pixel transistor 16b, such as a shift in threshold voltage, is easily caused. In addition, in order to maintain a voltage held in the second liquid crystal element 18b, a low off-state current is required even when the potential difference between the source electrode and the drain electrode is large. In this embodiment, a semiconductor such as an oxide semiconductor is used for the second pixel transistor 16b; therefore, the pressure resistance of the second pixel transistor 16b can be increased and the off-state current can be made extremely low. Therefore, in contrast to a transistor formed using a semiconductor material such as silicon or germanium, the second pixel transistor 16b can be prevented from deteriorating and the voltage held in the second liquid crystal element 18b can be maintained effectively.

Next, an example of the operation of the panel together with the operation of the backlight will be described. FIG. 3 schematically shows operations of the liquid crystal display device and operations of the backlight. As shown in FIG. 3, the operations of the liquid crystal display device according to one embodiment of the present invention is roughly divided into an operation in a period in which a full-color image is displayed (a full-color image display period 301), an operation in a period in which a monochrome moving image is displayed (a monochrome moving image display period 302), and an operation in a period in which a monochrome still image is displayed (a monochrome still image display period 303).

In the full-color image display period 301, one frame period consists of a plurality of subframe periods. In each of the subframe periods, writings of image signals to the pixel portion is being displayed, driving signals are successively supplied to the driver circuits such as the scan line driver circuit and the signal line driver circuit. Therefore, the driver circuits are operated in the full-color image display period 301. In addition, the hue of the light supplied to the pixel portion from the backlight is switched every subframe period. Image signals corresponding to their respective hues are written to the pixel portion sequentially. The image signals corresponding to all of the hues are written in one frame period, whereby one image is formed. Accordingly, in the full-color image display period 301, the number of writings of the image signals to the pixel portion in one frame period is more than one and is determined by the number of the hues of the lights supplied from the backlight.

In the monochrome moving image display period 302, as in the full-color image display period 301, writings of image signals to the pixel portion is performed every frame period. While an image is being displayed, driving signals are successively supplied to the driver circuits such as the scan line driver circuit and the signal line driver circuit. Therefore, the driver circuits are operated in the monochrome moving image display period 302. In the monochrome moving image display period 302, the hue of the light supplied to the pixel portion from the backlight is not switched every frame period, and a light of one hue is successively supplied to the pixel portion. One image can be formed by sequentially writing an image signal corresponding to one hue to the pixel portion in one frame period. Accordingly, in the monochrome moving image display period 302, the number of writings of the image signals to the pixel portion in one frame period is one.

In the monochrome still image display period 303, as in the full-color image display period 301, wirings of image signals to the pixel portion is performed every frame period. However, unlike the full-color image display period 301 and the monochrome moving image display period 302, the driving signals are supplied to the driver circuits during the writings of the image signals to the pixel portion, and after the writings are completed, the supply of the driving signals to the driver circuits is stopped. Therefore, the driver circuits are not operated in the monochrome still image display period 303 except during the writings of the image signals. In the monochrome still-image display period 303, the backlight remains off. In addition, one image is formed by sequentially writing image signals to the pixel portion in one frame period. Accordingly, in the monochrome still image display period 303, the number of writings of the image signals to the pixel portion in one frame period is one.

Note that it is preferable that 60 or more frame periods be provided in one second in the monochrome moving image display period 302 in order to prevent a flicker of an image or the like from being perceived. In the monochrome still image display period 303, one frame period can be extremely prolonged to, for example, one minute or longer. When one frame period is long, the period in which the driver circuits are not operated can be long, so that power consumption of the liquid crystal display device can be reduced.

The liquid crystal display device according to one embodiment of the present invention does not need to be provided with a color filter. Therefore, the cost can be lower than that of a liquid crystal display device including a color filter.

Figure 4A:
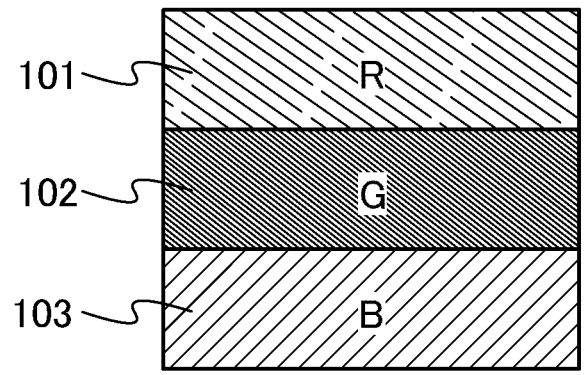
FIGS. 4A to 4C schematically illustrate an example of hues of light supplied to regions.
Figure 4B:
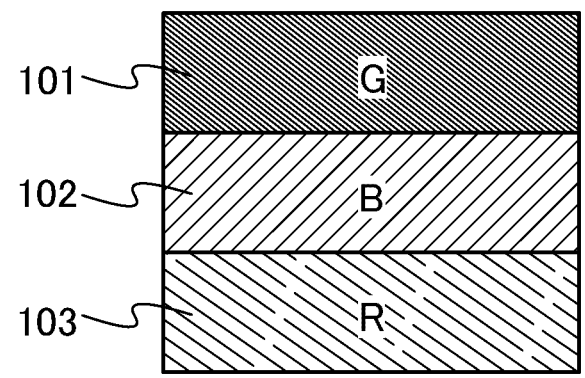
Figure 4C:
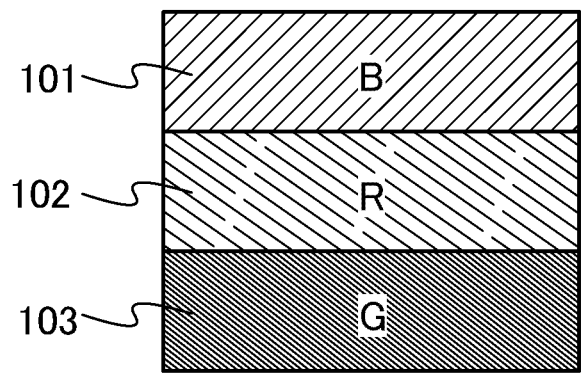

Note that a plurality of lights having different hues are supplied sequentially to each region of the pixel portion in one frame period in the full-color image display period 301. FIGS. 4A to 4C schematically illustrate an example of the hues of lights supplied to the regions. Note that FIGS. 4A to 4C illustrate the case where the pixel portion is divided into three regions as in FIG. 2A. Further, FIGS. 4A to 4C illustrate the case where the backlight supplies lights of red (R), blue (B), and green (G) to the pixel portion.

First, FIG. 4A shows the first subframe period in which a light of red (R) is supplied to the region 101, a light of green (G) is supplied to the region 102, and a light of blue (B) is supplied to the region 103. FIG. 4B shows the second subframe period in which a light of green (G) is supplied to the region 101, a light of blue (B) is supplied to the region 102, and a light of red (R) is supplied to the region 103. FIG. 4C shows the third subframe period, in which a light of blue (B) is supplied to the region 101, a light of red (R) is supplied to the region 102, and a light of green (G) is supplied to the region 103.

The completion of the above subframe periods corresponds to the completion of one frame period. In one frame period, each hue of lights supplied to the regions takes a round of the regions, with which a full-color image can be displayed. In the regions 101, 102, and 103, respectively, the hue of the supplied light is changed in the order of red (R), green (G), and blue (B); the hue of the supplied light is changed in the order of green (G), blue (B), and red (R); and the hue of the supplied light is changed in the order of blue (B), red (R), and green (G). In this manner, the plurality of lights having different hues are supplied sequentially to each of the regions in accordance with the order that is different between the regions.

Note that FIGS. 4A to 4C illustrate the example in which a light having one hue is supplied to one region in each subframe; however, one embodiment of the present invention is not limited to this example. For example, the hues of the lights supplied to the regions may be changed in order of completion of the writing of the image signal. In that case, a region irradiated with the light of the hue does not necessarily correspond to the region formed by dividing the pixel portion.

Figure 5:
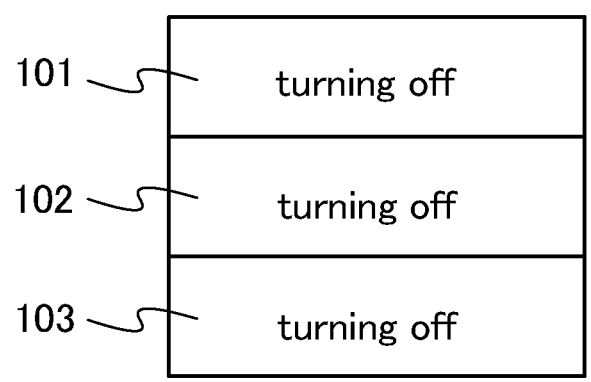
FIG. 5 schematically illustrates an example of turning off of light supplied to regions.

In the monochrome moving-image display period 302 and the monochrome still-image display period 303, all of the plurality of lights of different hues remain off. An example of turning off of the lights in each region is schematically shown in FIG. 5. Note that FIG. 5 shows an example in which the pixel portion is divided into three regions as in FIG. 2A. As shown in FIG. 5, all the light sources of the backlight are off in the regions 101, 102, and 103.

<Structural Example of Scan Line Driver Circuit 11>

Figure 6:
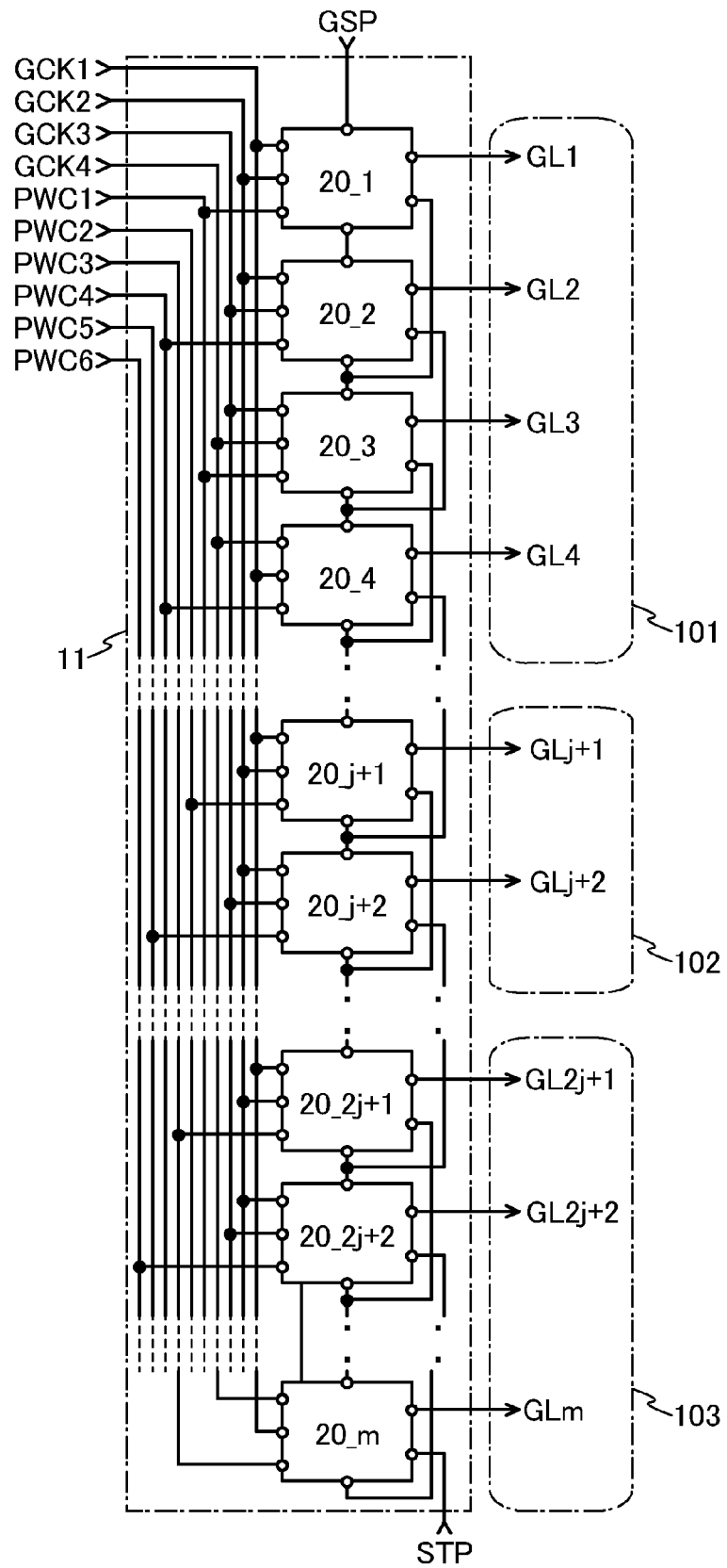
FIG. 6 illustrates a configuration of a scan line driver circuit.

FIG. 6 illustrates a configuration example of the scan line driver circuit 11 illustrated in FIG. 2A. The scan line driver circuit 11 in FIG. 6 includes first to m-th pulse output circuits 20_1 to 20_m. Selection signals are output from the first to m-th pulse output circuits 20_1 to 20_m and supplied to m scan lines GL (scan lines GL1 to GLm).

First to fourth scan line driver circuit clock signals (GCK1 to GCK4), first to sixth pulse width control signals (PWC1 to PWC6), and the scan line driver circuit start pulse signal (GSP) are supplied as driving signals to the scan line driver circuit 11.

Note that FIG. 6 illustrates the case where the first to j-th pulse output circuits 20_1 to 20_j (j is a multiple of 4 and less than m/2) are connected to the scan lines GL1 to GLj provided in the region 101, respectively. Further, the (j+1)-th to 2j-th pulse output circuits 20_j+1 to 20_2j are connected to the scan lines GLj+1 to GL2j provided in the region 102, respectively. Further, the (2j+1)-th to m-th pulse output circuits 20_2j+1 to 20_m are connected to the scan lines GL2j+1 to GLm provided in the region 103, respectively.

The first to m-th pulse output circuits 20_1 to 20_m begin to operate in response to the scan line driver circuit start pulse signal (GSP) that is input to the first pulse output circuit 20_1, and output selection signals whose pulses are shifted sequentially.

Circuits having the same configuration can be applied to the first to m-th pulse output circuits 20_1 to 20_m. A specific connection relation of the first to m-th pulse output circuits 20_1 to 20_m is described with reference to FIG. 7.

Figure 7:
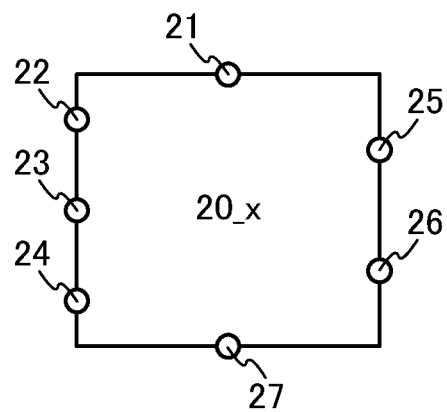
FIG. 7 schematically illustrates an x-th pulse output circuit 20_x.

FIG. 7 schematically illustrates the x-th pulse output circuit 20_x (x is a natural number less than or equal to m). Each of the first to m-th pulse output circuits 20_1 to 20_m has terminals 21 to 27. The terminals 21 to 24 and the terminal 26 are input terminals, and the terminals 25 and 27 are output terminals.

First, the terminal 21 is described. The terminal 21 of the first pulse output circuit 20_1 is connected to a wiring for supplying the scan line driver circuit start pulse signal (GSP). The terminal 21 of each of the second to m-th pulse output circuits 20_2 to 20_m is connected to the terminal 27 of each corresponding previous-stage pulse output circuit.

Next, the terminal 22 is described. The terminal 22 of the (4a-3)-th pulse output circuit 20_(4a-3) (a is a natural number less than or equal to m/4) is connected to a wiring for supplying the first scan line driver circuit clock signal (GCK1). The terminal 22 of the (4a-2)-th pulse output circuit 20_(4a-2) is connected to a wiring for supplying the second scan line driver circuit clock signal (GCK2). The terminal 22 of the (4a-1)-th pulse output circuit 20_(4a-1) is connected to a wiring for supplying the third scan line driver circuit clock signal (GCK3). The terminal 22 of the 4a-th pulse output circuit 20_4a is connected to a wiring for supplying the fourth scan line driver circuit clock signal (GCK4).

Then, the terminal 23 is described. The terminal 23 of the (4a-3)-th pulse output circuit 20_(4a-3) is connected to the wiring for supplying the second scan line driver circuit clock signal (GCK2). The terminal 23 of the (4a-2)-th pulse output circuit 20_(4a-2) is connected to the wiring for supplying the third scan line driver circuit clock signal (GCK3). The terminal 23 of the (4a-1)-th pulse output circuit 20_(4a-1) is connected to the wiring for supplying the fourth scan line driver circuit clock signal (GCK4). The terminal 23 of the 4a-th pulse output circuit 20_4a is connected to the wiring for supplying the first scan line driver circuit clock signal (GCK1).

Next, the terminal 24 is described. The terminal 24 of the (2b-1)-th pulse output circuit 20_(2b-1) (b is a natural number less than or equal to j/2) is connected to a wiring for supplying the first pulse width control signal (PWC1). The terminal 24 of the 2b-th pulse output circuit 20_2b is connected to a wiring for supplying the fourth pulse width control signal (PWC4). The terminal 24 of the (2c-1)-th pulse output circuit 20_(2c-1) (c is a natural number greater than or equal to (j/2+1) and less than or equal to j) is connected to a wiring for supplying the second pulse width control signal (PWC2). The terminal 24 of the 2c-th pulse output circuit 20_2c is connected to a wiring for supplying the fifth pulse width control signal (PWC5). The terminal 24 of the (2d-1)-th pulse output circuit 20_(2d-1) (d is a natural number greater than or equal to (j+1) and less than or equal to m/2) is connected to a wiring for supplying the third pulse width control signal (PWC3). The terminal 24 of the 2d-th pulse output circuit 20_2d is connected to a wiring for supplying the sixth pulse width control signal (PWC6).

Then, the terminal 25 is described. The terminal 25 of the x-th pulse output circuit 20_x is connected to the scan line GLx in the x-th row.

Next, the terminal 26 is described. The terminal 26 of the y-th pulse output circuit 20_y (y is a natural number less than or equal to (m−1)) is connected to the terminal 27 of the (y+1)-th pulse output circuit 20_(y+1). The terminal 26 of the m-th pulse output circuit 20_m is connected to a wiring for supplying a stop signal (STP) for the m-th pulse output circuit. In the case where a (m+1)-th pulse output circuit is provided, the stop signal (STP) for the m-th pulse output circuit corresponds to a signal output from the terminal 27 of the (m+1)-th pulse output circuit 20 (m+1). Specifically, these signals can be supplied to the m-th pulse output circuit 20_m by providing the (m+1)-th pulse output circuit 20 (m+1) as a dummy circuit or by directly inputting these signals from the outside.

The connection relation of the terminal 27 in each of the pulse output circuits has been described above. Therefore, the above description is to be referred to.

<Structure Example 1 of Pulse Output Circuit>

Figure 8A:
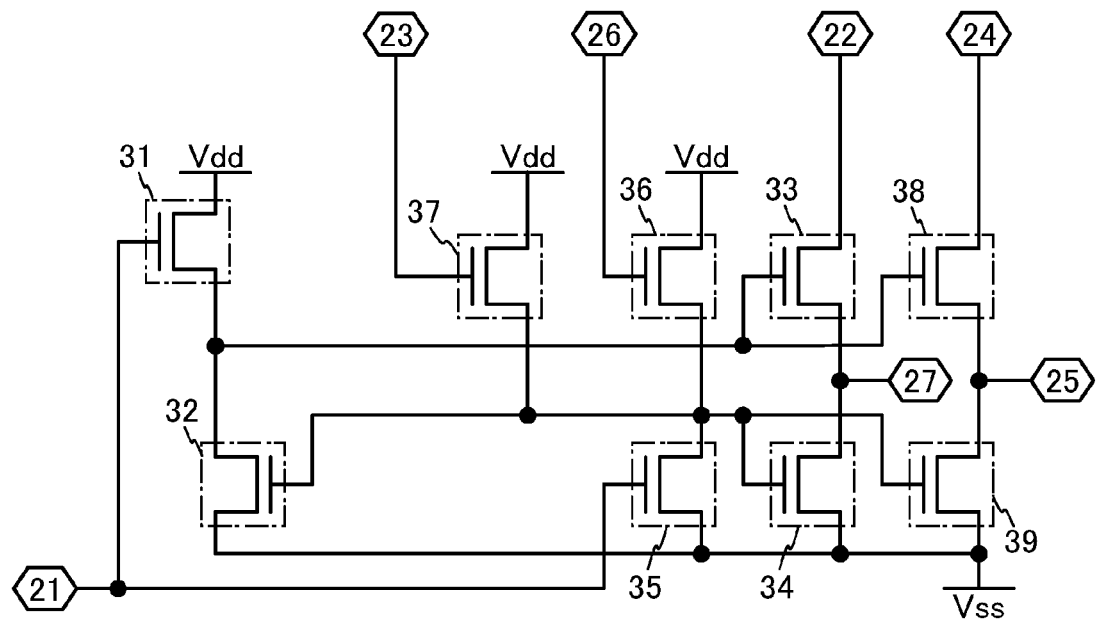
FIG. 8A illustrates a configuration of a pulse output circuit and FIGS. 8B and 8C are timing diagrams thereof.

Next, FIG. 8A illustrates an example of a specific configuration of the x-th pulse output circuit 20_x illustrated in FIG. 7. The pulse output circuit illustrated in FIG. 8A includes transistors 31 to 39.

A gate electrode of the transistor 31 is connected to the terminal 21. A first terminal of the transistor 31 is connected to a node supplied with a high power supply potential (Vdd). A second terminal of the transistor 31 is connected to a gate electrode of the transistor 33 and a gate electrode of the transistor 38.

A gate electrode of the transistor 32 is connected to a gate electrode of the transistor 34 and a gate electrode of the transistor 39. A first terminal of the transistor 32 is connected to a node supplied with a low power supply potential (Vss). A second terminal of the transistor 32 is connected to the gate electrode of the transistor 33 and the gate electrode of the transistor 38.

A first terminal of the transistor 33 is connected to the terminal 22. A second terminal of the transistor 33 is connected to the terminal 27.

A first terminal of the transistor 34 is connected to the node supplied with the low power supply potential (Vss). A second terminal of the transistor 34 is connected to the terminal 27.

A gate electrode of the transistor 35 is connected to the terminal 21. A first terminal of the transistor 35 is connected to the node supplied with the low power supply potential (Vss). A second terminal of the transistor 35 is connected to the gate electrode of the transistor 34 and the gate electrode of the transistor 39.

A gate electrode of the transistor 36 is connected to the terminal 26. A first terminal of the transistor 36 is connected to the node supplied with the high power supply potential (Vdd). A second terminal of the transistor 36 is connected to the gate electrode of the transistor 34 and the gate electrode of the transistor 39. Note that it is possible to employ a structure in which the first terminal of the transistor 36 is connected to a node supplied with a power supply potential (Vcc) which is higher than the low power supply potential (Vss) and lower than the high power supply potential (Vdd).

A gate electrode of the transistor 37 is connected to the terminal 23. A first terminal of the transistor 37 is connected to the node supplied with the high power supply potential (Vdd). A second terminal of the transistor 37 is connected to the gate electrode of the transistor 34 and the gate electrode of the transistor 39. Note that the first terminal of the transistor 37 may be connected to the node supplied with the power supply potential (Vcc).

A first terminal of the transistor 38 is connected to the terminal 24. A second terminal of the transistor 38 is connected to the terminal 25.

A first terminal of the transistor 39 is connected to the node supplied with the low power supply potential (Vss). A second terminal of the transistor 39 is connected to the terminal 25.

Figure 8B:
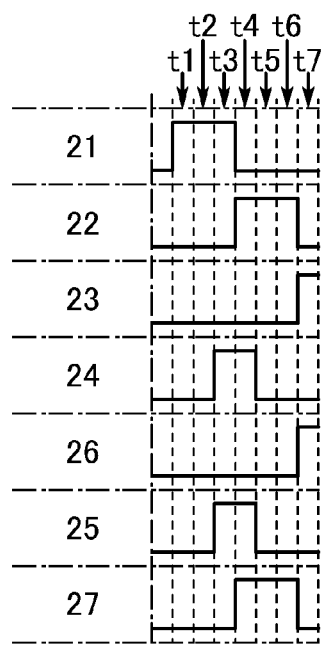

Next, FIG. 8B shows an example of a timing diagram of the pulse output circuit illustrated in FIG. 8A. Periods t1 to t7 shown in FIG. 8B have the same length of time. The length of each of the periods t1 to t7 corresponds to ⅓ of a pulse width of each of the first to fourth scan line driver circuit clock signals (GCK1 to GCK4), and corresponds to ½ of a pulse width of each of the first to sixth pulse width control signals (PWC1 to PWC6).

In the pulse output circuit illustrated in FIG. 8A, a potential input to the terminal 21 is at a high level and potentials input to the terminal 22, the terminal 23, the terminal 24, and the terminal 26 are at a low level in the periods t1 and t2. Consequently, low-level potentials are output from the terminal 25 and the terminal 27.

Next, in the period t3, the potentials input to the terminal 21 and the terminal 24 are at a high level and the potentials input to the terminal 22, the terminal 23, and the terminal 26 are at a low level. Consequently, a high-level potential is output from the terminal 25 and a low-level potential is output from the terminal 27.

Subsequently, in the period t4, the potentials input to the terminal 22 and the terminal 24 are at a high level and the potentials input to the terminal 21, the terminal 23, and the terminal 26 are at a low level. Consequently, high-level potentials are output from the terminal 25 and the terminal 27.

In the periods t5 and t6, the potential input to the terminal 22 is at a high level and the potentials input to the terminal 21, the terminal 23, the terminal 24, and the terminal 26 are at a low level. Consequently, a low-level potential is output from the terminal 25 and a high-level potential is output from the terminal 27.

In the period t7, the potentials input to the terminal 23 and the terminal 26 are at a high level and the potentials input to the terminal 21, the terminal 22, and the terminal 24 are at a low level. Consequently, low-level potentials are output from the terminal 25 and the terminal 27.

Figure 8C:
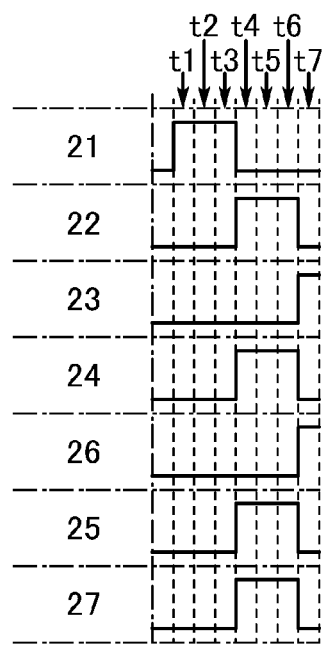

Next, FIG. 8C shows another example of the timing diagram of the pulse output circuit illustrated in FIG. 8A. Periods t1 to t7 in FIG. 8C have the same length of time. The length of each of the periods t1 to t7 corresponds to ⅓ of the pulse width of each of the first to fourth scan line driver circuit clock signals (GCK1 to GCK4), and corresponds to ⅓ of the pulse width of each of the first to sixth pulse width control signals (PWC1 to PWC6).

In the pulse output circuit illustrated in FIG. 8A, the potential input to the terminal 21 is at a high level and the potentials input to the terminal 22, the terminal 23, the terminal 24, and the terminal 26 are at a low level in the periods t1 to t3. Consequently, low-level potentials are output from the terminal 25 and the terminal 27.

Then, in the periods t4 to t6, the potentials input to the terminal 22 and the terminal 24 are at a high level, and the potentials input to the terminal 21, the terminal 23, and the terminal 26 are at a low level. Consequently, high level potentials are output from the terminal 25 and the terminal 27.

<Operation Example of Scan Line Driver Circuit in Full-Color Image Display Period 301>

Next, the operation of the scan line driver circuit 11 in the full-color image display period 301 shown in FIG. 3 will be described, for example, using the scan line driver circuit 11 described with reference to FIG. 6, FIG. 7, and FIG. 8A.

Figure 9:
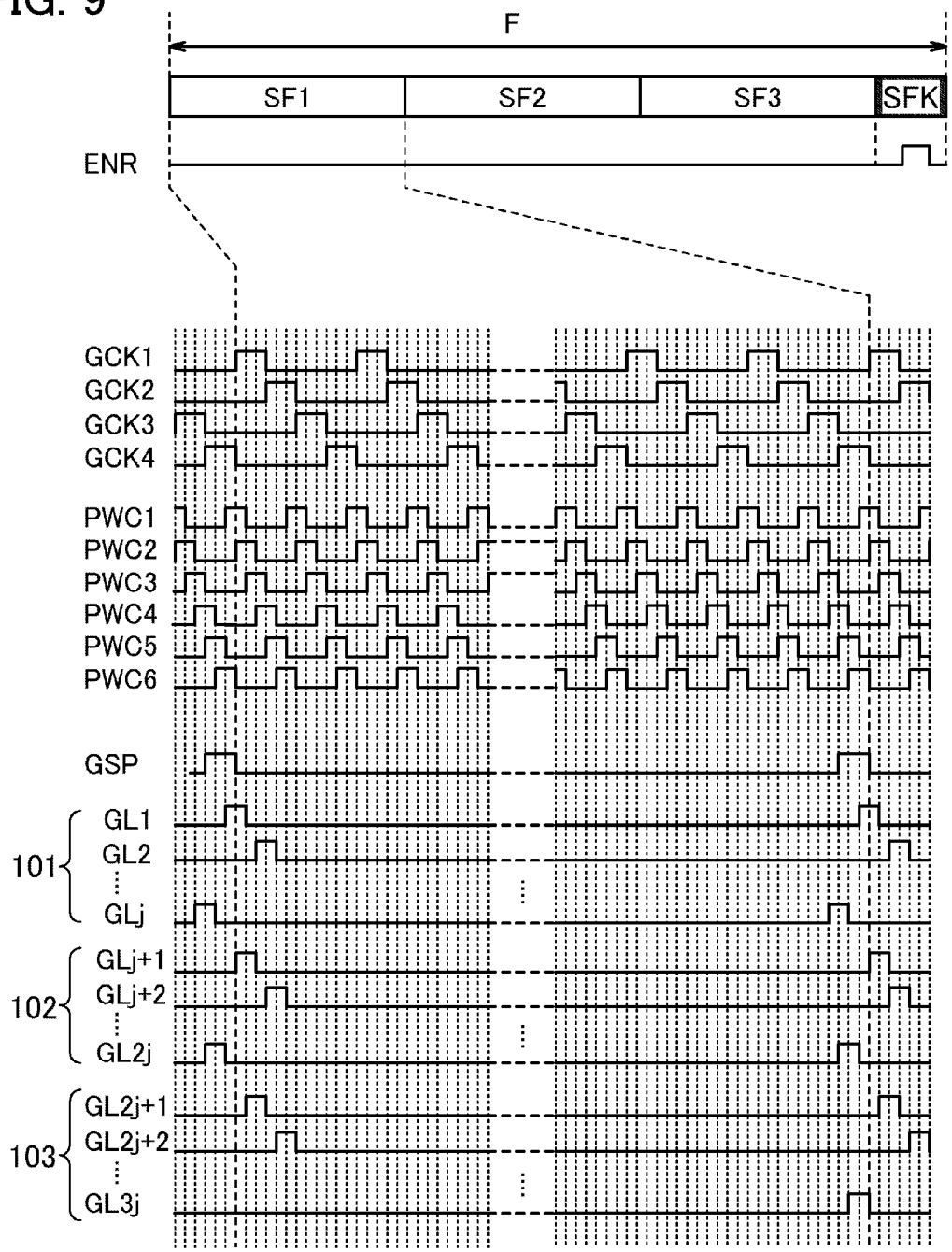
FIG. 9 is a timing diagram of a scan line driver circuit.

FIG. 9 shows an example of a timing diagram of the scan line driver circuit 11 in the full-color image display period 301. A subframe period SF1, a subframe period SF2, a subframe period SF3, and a subframe period SFK are provided in one frame period in FIG. 9. In FIG. 9, a timing diagram of the subframe period SF1 is used as a typical example. Note that FIG. 9 shows an example of the case of m=3j.

In FIG. 9, the scan lines GL1 to GLj are connected to the pixels of the region 101, the scan lines GLj+1 to GL2j are connected to the pixels of the region 102, and the scan lines GL2j+1 to GL3j are connected to the pixels of the region 103.

The first scan line driver circuit clock signal (GCK1) periodically repeats a high-level potential (the high power supply potential (Vdd)) and a low-level potential (the low power supply potential (Vss)), and has a duty ratio of 1/4. Further, the second scan line driver circuit clock signal (GCK2) is a signal whose phase lags behind that of the first scan line driver circuit clock signal (GCK1) by ¼ of its cycle, the third scan line driver circuit clock signal (GCK3) is a signal whose phase lags behind that of the first scan line driver circuit clock signal (GCK1) by ½ of its cycle, and the fourth scan line driver circuit clock signal (GCK4) is a signal whose phase lags behind that of the first scan line driver circuit clock signal (GCK1) by ¾ of its cycle.

The first pulse width control signal (PWC1) periodically repeats a high-level potential (the high power supply potential (Vdd)) and a low-level potential (the low power supply potential (Vss)), and has a duty ratio of 1/3. The second pulse width control signal (PWC2) is a signal whose phase lags behind the first pulse width control signal (PWC1) by ⅙ of its cycle, the third pulse width control signal (PWC3) is a signal whose phase lags behind the first pulse width control signal (PWC1) by ⅓ of its cycle, the fourth pulse width control signal (PWC4) is a signal whose phase lags behind the first pulse width control signal (PWC1) by ½ of its cycle, the fifth pulse width control signal (PWC5) is a signal whose phase lags behind the first pulse width control signal (PWC1) by ⅔ of its cycle, and the sixth pulse width control signal (PWC6) is a signal whose phase lags behind the first pulse width control signal (PWC1) by ⅚ of its cycle.

In FIG. 9, the ratio of the pulse width of each of the first to fourth scan line driver circuit clock signals (GCK1 to GCK4) to the pulse width of each of the first to sixth pulse width control signals (PWC1 to PWC6) is 3:2.

Each of the subframe periods SF starts in response to falling of the potential of the pulse of the scan line driver circuit start pulse signal (GSP). The pulse width of the scan line driver circuit start pulse signal (GSP) is substantially the same as the pulse width of each of the first to fourth scan line driver circuit clock signals (GCK1 to GCK4). The falling of the potential of the pulse of the scan line driver circuit start pulse signal (GSP) is synchronized with rising of the potential of the pulse of the first scan line driver circuit clock signal (GCK1). The falling of the potential of the pulse of the scan line driver circuit start pulse signal (GSP) lags behind rising of the potential of the pulse of the first pulse width control signal (PWC1) by ⅙ of a cycle of the first pulse width control signal (PWC1).

The pulse output circuit illustrated in FIG. 8A is operated by the above signals in accordance with the timing diagram in FIG. 8B. Accordingly, as illustrated in FIG. 9, the selection signals whose pulses are shifted sequentially are supplied to the scan lines GL1 to GLj for the region 101. Further, the phases of the pulses of the selection signals supplied to the scan lines GL1 to GLj are each shifted by a period corresponding to 3/2 of the pulse width. Note that the pulse width of each of the selection signals supplied to the scan lines GL1 to GLj is substantially the same as the pulse width of each of the first to sixth pulse width control signals (PWC1 to PWC6).

As in the case of the region 101, selection signals whose pulses are shifted sequentially are supplied to the scan lines GLj+1 to GL2j for the region 102. Further, the phases of the pulses of the selection signals supplied to the scan lines GLj+1 to GL2j are each shifted by a period corresponding to 3/2 of the pulse width. Note that the pulse width of each of the selection signals supplied to the scan lines GLj+1 to GL2j is substantially the same as the pulse width of each of the first to sixth pulse width control signals (PWC1 to PWC6).

As in the case of the region 101, selection signals whose pulses are shifted sequentially are supplied to the scan lines GL2j+1 to GL3j for the region 103. Further, the phases of the pulses of the selection signals supplied to the scan lines GL2j+1 to GL3j are each shifted by a period corresponding to 3/2 of the pulse width. Note that the pulse width of each of the selection signals supplied to the scan lines GL2j+1 to GL3j is substantially the same as the pulse width of each of the first to sixth pulse width control signals (PWC1 to PWC6).

The phases of the pulses of the selection signals supplied to the scan lines GL1, GLj+1, and GL2j+1 are shifted sequentially by a period corresponding to 1/2 of the pulse width.

In the subframe period SFK, a selection signal is supplied to the enable lines ENR, so that all the second pixel transistors 16b in the pixel portion 10 are turned on. Then, the scan lines GL1 to GLm are selected, to which potentials for displaying black in the reflective region 14 are supplied from the signal lines SL1 to SLn through the first pixel transistors 16a and the second pixel transistors 16b. After that, the potentials of the enable lines ENR are set to potentials for turning off the second pixel transistors 16b.

<Operation Example of Scan Line Driver Circuit in Monochrome Still Image Display Period 303>

Next, the operation of the scan line driver circuit 11 in the monochrome still image display period 303 shown in FIG. 3 will be described.

Figure 10:
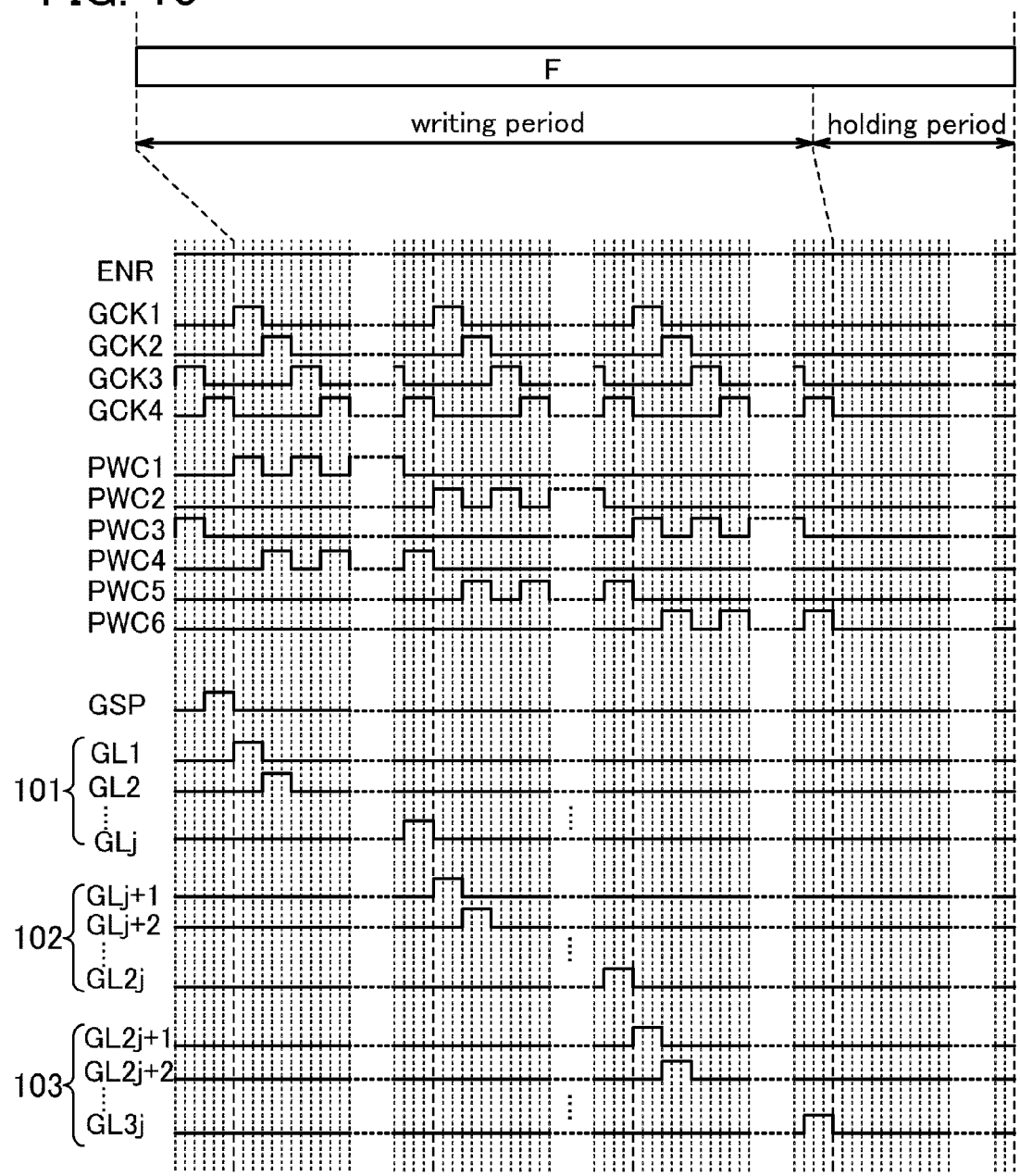
FIG. 10 is a timing diagram of a scan line driver circuit.

FIG. 10 shows an example of a timing diagram of the scan line driver circuit 11 in the monochrome still image display period 303. In FIG. 10, a writing period in which writings of image signals to pixels are performed and a holding period in which the image signals are held are provided in one frame period.

During the monochrome still image display period 303, all the enable lines ENR are always selected, so that all the second pixel transistors 16b remain on.

The first to fourth scan line driver circuit clock signals (GCK1 to GCK4) are the same signals as those in the case of FIG. 9.

The first pulse width control signal (PWC1) and the fourth pulse width control signal (PWC4) periodically repeat a high-level potential (the high power supply potential (Vdd)) and a low-level potential (the low power supply potential (Vss)) and have a duty ratio of 1/2 in the first 1/3 period of the writing period. Further, in the other periods in the writing period, the first pulse width control signal (PWC1) and the fourth pulse width control signal (PWC4) have the low-level potentials. The fourth pulse width control signal (PWC4) is a signal whose phase lags behind that of the first pulse width control signal (PWC1) by 1/2 of its cycle.

The second pulse width control signal (PWC2) and the fifth pulse width control signal (PWC5) periodically repeat a high-level potential (the high power supply potential (Vdd)) and a low-level potential (the low power supply potential (Vss)) and have a duty ratio of 1/2 in the middle 1/3 period of the writing period. In the other periods in the writing period, the second pulse width control signal (PWC2) and the fifth pulse width control signal (PWC5) have the low-level potential. The fifth pulse width control signal (PWC5) is a signal whose phase lags behind the second pulse width control signal (PWC2) by 1/2 of its cycle.

The third pulse width control signal (PWC3) and the sixth pulse width control signal (PWC6) periodically repeat a high-level potential (the high power supply potential (Vdd)) and a low-level potential (the low power supply potential (Vss)) and have a duty ratio of 1/2 in the last 1/3 period of the writing period. In the other periods in the writing period, the third pulse width control signal (PWC3) and the sixth pulse width control signal (PWC6) have the low-level potential. The sixth pulse width control signal (PWC6) is a signal whose phase lags behind the third pulse width control signal (PWC3) by 1/2 of its cycle.

In FIG. 10, the ratio of the pulse width of each of the first to fourth scan line driver circuit clock signals (GCK1 to GCK4) with respect to the pulse width of each of the first to sixth pulse width control signals (PWC1 to PWC6) is 1:1.

A frame period F starts in response to falling of the potential of the pulse of the scan line driver circuit start pulse signal (GSP). The pulse width of the scan line driver circuit start pulse signal (GSP) is substantially the same as the pulse width of each of the first to fourth scan line driver circuit clock signals (GCK1 to GCK4). The falling of the potential of the pulse of the scan line driver circuit start pulse signal (GSP) is synchronized with rising of the potential of the pulse of the first scan line driver circuit clock signal (GCK1). In addition, the falling of the potential of the pulse of the scan line driver circuit start pulse signal (GSP) is synchronized with rising of the potential of a pulse of the first pulse width control signal (PWC1).

The pulse output circuit illustrated in FIG. 8A is operated by the above signals in accordance with the timing diagram in FIG. 8C. Accordingly, as shown in FIG. 10, the selection signals whose pulses are shifted sequentially are supplied to the scan lines GL1 to GLj for the region 101. Further, the phases of the pulses of the selection signals supplied to the scan lines GL1 to GLj are each shifted by a period corresponding to the pulse width. Note that the pulse width of each of the selection signals supplied to the scan lines GL1 to GLj is substantially the same as the pulse width of each of the first to sixth pulse width control signals (PWC1 to PWC6).

After the selection signals whose pulses are shifted sequentially are supplied to all of the scan lines GL1 to GLj for the region 101, the selection signals whose pulses are shifted sequentially are also supplied to the scan lines GLj+1 to GL2j for the region 102. The phases of the pulses of the selection signals supplied to the scan lines GLj+1 to GL2j are each shifted by a period corresponding to the pulse width. Note that the pulse width of each of the selection signals supplied to the scan lines GLj+1 to GL2j is substantially the same as the pulse width of each of the first to sixth pulse width control signals (PWC1 to PWC6).

After the selection signals whose pulses are shifted sequentially are supplied to all of the scan lines GLj+1 to GL2j for the region 102, the selection signals whose pulses are shifted sequentially are also supplied to the scan lines GL2j+1 to GL3j for the region 103. Further, the phases of the pulses of the selection signals supplied to the scan lines GL2j+1 to GL3j are each shifted by a period corresponding to the pulse width. Note that the pulse width of each of the selection signals supplied to the scan lines GL2j+1 to GL3j is substantially the same as the pulse width of each of the first to sixth pulse width control signals (PWC1 to PWC6).

Next, in the holding period, supply of the driving signals and the power supply potential to the scan line driver circuit 11 is stopped. Specifically, first, supply of the scan line driver circuit start pulse signal (GSP) is stopped, whereby output of the selection signal from the pulse output circuit is stopped in the scan line driver circuit 11, and selection by the pulse in all of the scan lines connected to the scan line driver circuit 11 is terminated. After that, supply of the power supply potential Vdd to the scan line driver circuit 11 is stopped. Note that to stop input or to stop supply means, for example, to make a floating state of a wiring to which a signal or a potential is input, or to apply a low-level potential to a wiring to which a signal or a potential is input. By the above-described method, malfunction of the scan line driver circuit 11 in stopping operation can be prevented. In addition, supply of the first to fourth scan line driver circuit clock signals (GCK1 to GCK4) and the first to sixth pulse width control signals (PWC1 to PWC6) to the scan line driver circuit 11 may be stopped.

By stopping the supply of the driving signals and the power supply potential to the scan line driver circuit 11, low-level potentials are supplied to all of the scan lines GL1 to GLj, the scan lines GLj+1 to GL2j, and the scan lines GL2j+1 to GL3j.

Note that in the monochrome moving image display period 302, the operation of the scan line driver circuit 11 in the writing period is the same as that in the monochrome still image display period 303.

<Signal Line Driver Circuit 12>

Figure 11:
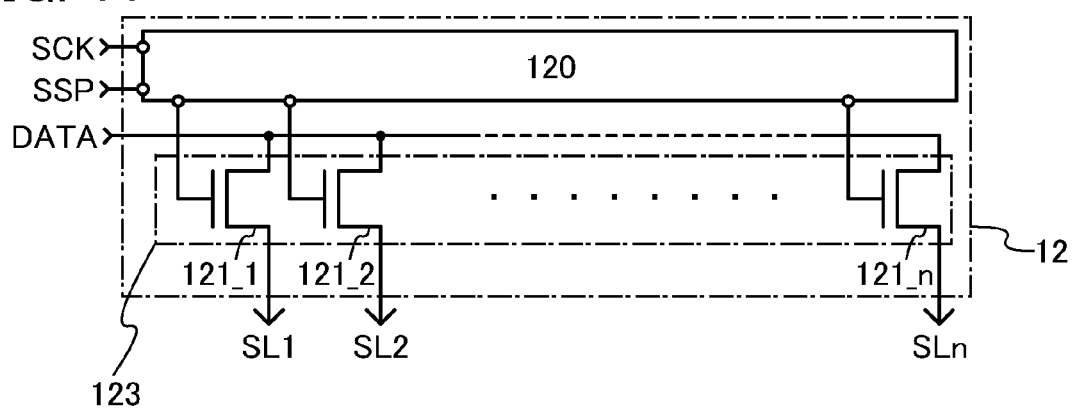
FIG. 11 illustrates a configuration of a signal line driver circuit.

FIG. 11 illustrates a structural example of the signal line driver circuit 12 included in the liquid crystal display device in FIG. 2A. The signal line driver circuit 12 includes a shift register 120 having first to n-th output terminals and a switching element group 123 which controls supply of image signals (DATA) to the signal lines SL1 to SLn.

Specifically, the switching element group 123 includes transistors 121_1 to 121_n. First terminals of the transistors 121_1 to 121_n are connected to a wiring for supplying the image signals (DATA). Second terminals of the transistors 121_1 to 121_n are connected to the signal lines SL1 to SLn, respectively. Gate electrodes of the transistors 121_1 to 121_n are connected to the first to n-th output terminals of the shift register 120, respectively.

The shift register 120 operates in accordance with a driving signal such as a signal line driver circuit start pulse signal (SSP) and a signal line driver circuit clock signal (SCK), and outputs signals whose pulses are shifted sequentially from the first to n-th output terminals. The signals are input to the gate electrodes of the transistors 121_1 to 121_n to turn on the transistors 121_1 to 121_n sequentially.

Figure 12A:
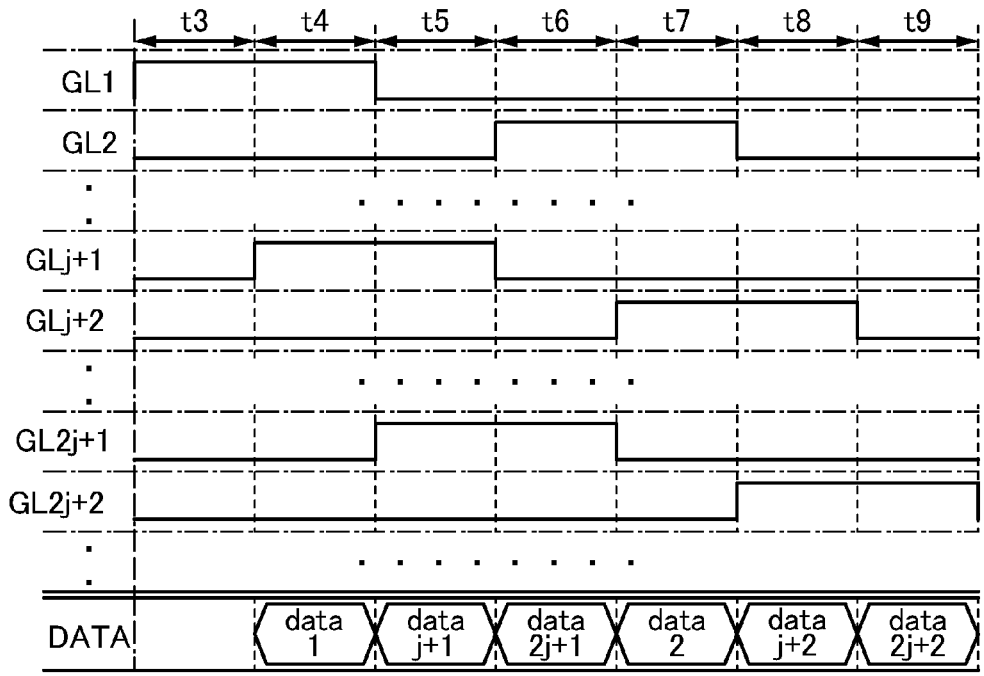
FIGS. 12A and 12B show examples of timing of image signals (DATA) supplied to signal lines.

FIG. 12A shows an example of the timing of image signals (DATA) supplied to the signal lines in the full-color image display period 301. As shown in FIG. 12A, in a period in which pulses of selection signals input to two scan lines overlap with each other, an image signal (DATA) for the scan line whose pulse appears first is sampled and input to the signal lines in the signal line driver circuit 12 illustrated in FIG. 11. Specifically, the pulse of the selection signal input to the scan line GL1 and the pulse of the selection signal input to the scan line GLj+1 overlap with each other in a period t4 corresponding to ½ of the pulse width. Note that the pulse of the scan line GL1 appears before the pulse of the scan line GLj+1. In the period in which the pulses overlap with each other, an image signal (data1) among the image signals (DATA) for the scan line GL1 is sampled and input to the signal lines SL1 to SLn.

In a similar manner, in a period t5, an image signal (dataj+1) for the scan line GLj+1 is sampled and input to the signal lines SL1 to SLn. In a period t6, an image signal (data2j+1) for the scan line GL2j+1 is sampled and input to the signal lines SL1 to SLn. In a period t7, an image signal (data2) for the scan line GL2 is sampled and input to the signal lines SL1 to SLn. Also in a period t8 and subsequent periods, the same operation is repeated and image signals (DATA) are written to the pixel portion.

In other words, input of the image signals to the signal lines SL1 to SLn is performed in the following order: pixels connected to the scan line GLs (s is a natural number less than j); pixels connected to the scan line GLj+s; pixels connected to the scan line GL2j+s; and pixels connected to the scan line GLs+1.

Figure 12B:
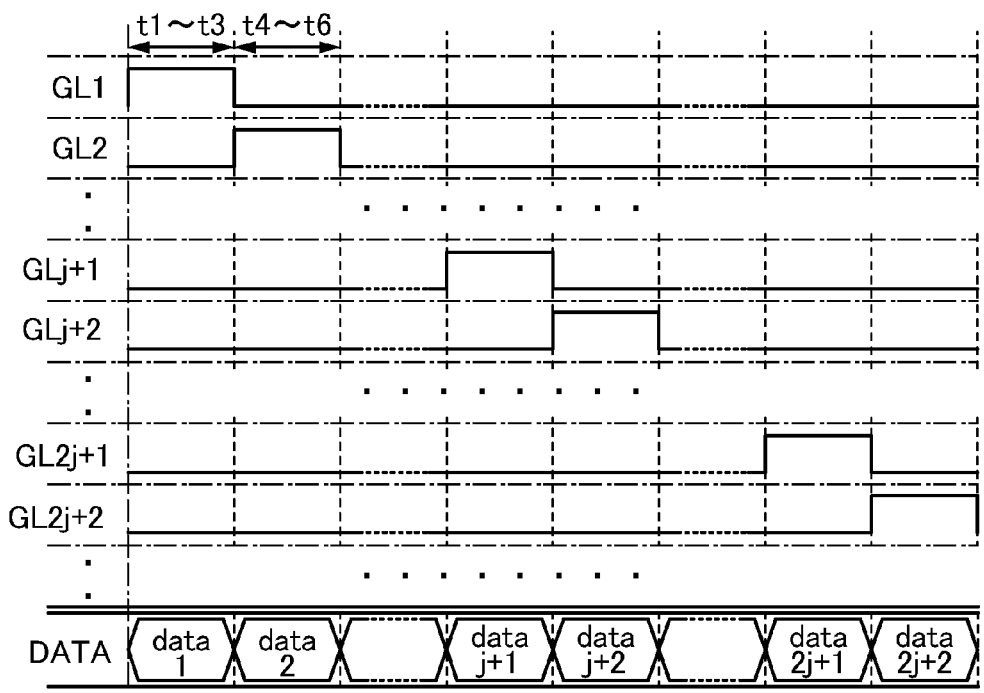

FIG. 12B shows an example of the timing of the image signals (DATA) supplied to the signal lines in the writing period provided in the monochrome moving image display period 302 and the monochrome still image display period 303. As shown in FIG. 12B, in a period in which a pulse of a selection signal input to the scan line appears, the image signal (DATA) to the scan line is sampled and input to the signal lines in the writing period provided in the monochrome moving image display period 302 and the monochrome still image display period 303. Specifically, in a period in which the pulse of the selection signal input to the scan line GL1 appears, the image signal (data1) among the image signals (DATA) for the scan line GL1 is sampled and input to the signal lines SL1 to SLn.

The same operation is repeated in all of the scan lines subsequent to the scan line GL1, whereby image signals (DATA) are written to the pixel portion.

In the holding period in the monochrome still image display period 303, supply of the signal line driver circuit start pulse signal (SSP) to the shift register 120 and supply of the image signals (DATA) to the signal line driver circuit 12 are stopped. Specifically, first, the supply of the signal line driver circuit start pulse signal (SSP) is stopped to stop sampling of an image signal in the signal line driver circuit 12. Then, the supply of the image signals and the supply of the power supply potential to the signal line driver circuit 12 are stopped. By the above-described method, malfunction of the signal line driver circuit 12 in stopping operation can be prevented. In addition, supply of the signal line driver circuit clock signal (SCK) to the signal line driver circuit 12 may be stopped.

<Operation Example of Liquid Crystal Display Device>

Figure 13:
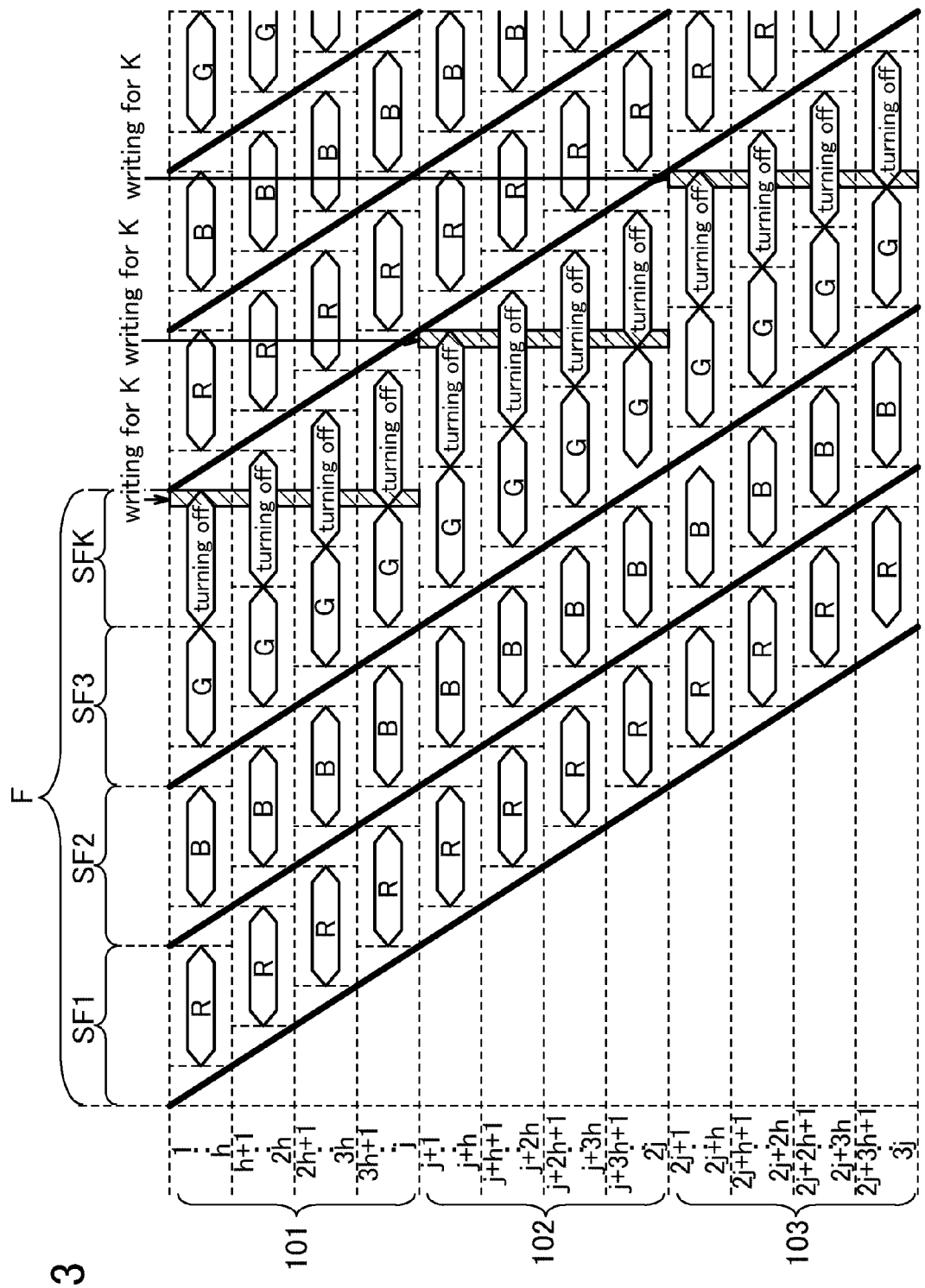
FIG. 13 shows timing of scanning of selection signals and timing of lighting of a backlight.

FIG. 13 shows the timing of scanning of the selection signals and the timing of lighting of the backlight in the full-color image display period 301 in the above-described liquid crystal display device. Note that in FIG. 13, the vertical axis represents rows in the pixel portion, and the horizontal axis represents time.

As shown in FIG. 13, in the liquid crystal display device described in this embodiment, a driving method in which a selection signal is supplied to the scan line GL1 and then a selection signal is supplied to the scan line GLj+1, which is the j-th rows from the scan line GL1, can be used in the full-color image display period 301. Therefore, the image signals can be supplied to the pixels in one subframe period SF in such a manner that n pixels connected to the scan line GL1 to n pixels connected to the scan line GLj are sequentially selected, n pixels connected to the scan line GLj+1 to n pixels connected to the scan line GL2j are sequentially selected, and n pixels connected to the scan line GL2j+1 to n pixels connected to the scan line GL3j are sequentially selected.

Specifically, in a first subframe period SF1 in FIG. 13, image signals for red (R) are written in the pixels connected to the scan lines GL1 to GLj, and then a light of red (R) is supplied to the pixels connected to the scan lines GL1 to GLj. With the above structure, an image for red (R) can be displayed in the region 101 of the pixel portion for the scan lines GL1 to GLj.

Further, in the first subframe period SF1, image signals for green (G) are written in the pixels connected to the scan lines GLj+1 to GL2j, and then a light of green (G) is supplied to the pixels connected to the scan lines GLj+1 to GL2j. With the above structure, an image for green (G) can be displayed in the region 102 of the pixel portion for the scan lines GLj+1 to GL2j.

Further, in the first subframe period SF1, image signals for blue (B) are written in the pixels connected to the scan lines GL2j+1 to GL3j, and then a light of blue (B) is supplied to the pixels connected to the scan lines GL2j+1 to GL3j. With the above structure, an image for blue (B) can be displayed in the region 103 of the pixel portion for the scan lines GL2j+1 to GL3j.

The same operation as in the first subframe period SF1 is repeated in a second subframe period SF2 and a third subframe period SF3. Note that in the second subframe period SF2, an image for blue (B) is displayed in the region 101 of the pixel portion for the scan lines GL1 to GLj; an image for red (R) is displayed in the region 102 of the pixel portion for the scan lines GLj+1 to GL2j; and an image for green (G) is displayed in the region 103 of the pixel portion for the scan lines GL2j+1 to GL3j. In the third subframe period SF3, an image for green (G) is displayed in the region 101 of the pixel portion for the scan lines GL1 to GLj; an image for blue (B) is displayed in the region 102 of the pixel portion for the scan lines GLj+1 to GL2j; and an image for red (R) is displayed in the region 103 of the pixel portion for the scan lines GL2j+1 to GL3j.

In a subframe period SFK, the backlight is turned off, a selection signal is supplied to the enable line ENR in the region 101 through the terminal 61, and image signals for black (K) are written to the region 101 of the pixel portion for the scan lines GL1 to GLj. A selection signal is supplied to the enable line ENR in the region 102 through the terminal 62, and image signals for black (K) are written to the region 102 of the pixel portion for the scan lines GLj+1 to GL2j. Further, a selection signal is supplied to the enable line ENR in the region 103 through the terminal 63, and image signals for black (K) are written to the region 103 of the pixel portion for the scan lines GL2j+1 to GL3j.

In the above manner, the first to third subframe periods SF1 to SF3 and the subframe period SFK in all of the scan lines GL are terminated, that is, one frame period is completed, whereby a full-color image can be displayed in the pixel portion.

Alternatively, it is also possible to write image signals for black (K) to all the pixels 15 in the pixel portion 10 at once, instead of writing image signals for black (K) to each region. In that case, the backlight of the region 101 is turned off after the third frame period SF3 is terminated in the region 101, the backlight of the region 102 is turned off after the third frame period SF3 is terminated in the region 102, and the backlight of the region 103 is turned off after the third frame period SF3 is terminated in the region 103. After the backlight is turned off in all the regions, a selection signal is supplied to all the enable lines ENR, the scan lines GL1 to GL3j are selected, and image signals for black (K) are written to all the pixels 15.

In order to write image signals for black (K) to all the pixels 15 in the pixel portion 10 at once, periods are needed in which the subframe periods SFK of the regions 101 to 103 overlap with each other. Accordingly, the backlight remains off for a long time in each region. This becomes a factor of a decrease in visibility, such as a decrease in luminance and a flicker phenomenon. For improvement of visibility, the driver circuits and the pixel transistors are required to be operated at even higher speed.

On the other hand, in the case where image signals for black (K) are written in the subframe period SFK for each region instead of writing image signals for black (K) to all the pixels 15 in the pixel portion 10 at once, a period during which the backlight remains off in each region can be shortened to the minimum. Further, since there is no period in which the backlight of the pixel portion 10 is entirely turned off, a decrease in visibility such as a decrease in luminance and a flicker phenomenon is less likely to be caused.

During the full-color image display period 301, an image is displayed using the backlight. Accordingly, an image is displayed using the transmissive region 13 without using the reflective region 14, in the pixel 15. It is possible to employ the following structure: the second pixel transistor 16b is not provided in the reflective region 14, and one electrode of the second liquid crystal element 18b and the first electrode of the second capacitor 17b in the reflective region 14 are connected to the second terminal of the first pixel transistor 16a in the transmissive region 13. In that case, however, image signals are written to the second capacitor 17b and the second liquid crystal element 18b which do not contribute to display in the full-color image display period 301, whereby power consumption and writing time are increased.

In the pixel 15 of this embodiment, the second pixel transistor 16b is provided in the reflective region 14 and is turned off during the full-color image display period 301, so that increase in power consumption can be suppressed and writing time of an image signal can be reduced. A subframe period SFK is provided in each frame period, during which an image signal of black is held in the reflective region 14, so that a decrease in contrast due to reflection of external light at the reflective region 14 during the full-color image display period 301 can be prevented.

This embodiment describes a structure in which a subframe period SFK is provided every one frame; however, by using a transistor including an oxide semiconductor layer as the second pixel transistor 16b, the writing interval of image signals to the reflective region 14 by a subframe period SFK can be as long as several hundreds of frames or several thousands of frames; thus, power consumption can be further suppressed.

Note that in one embodiment of the present invention, each of the regions may be further divided into regions. In the divided regions, lighting of the backlight may start sequentially in response to the termination of writings of image signals. For example, the following method may be employed: in the region 101, image signals for red (R) are written to the pixels connected to the scan lines GL1 to GL*h* (*h* is a natural number less than or equal to *j*/4); and then, a light of red (R) is supplied to the pixels connected to the scan lines GL1 to GL*h* while image signals for red (R) are written to the pixels connected to the scan lines GL*h*+1 to GL2*h*.

Figure 14:
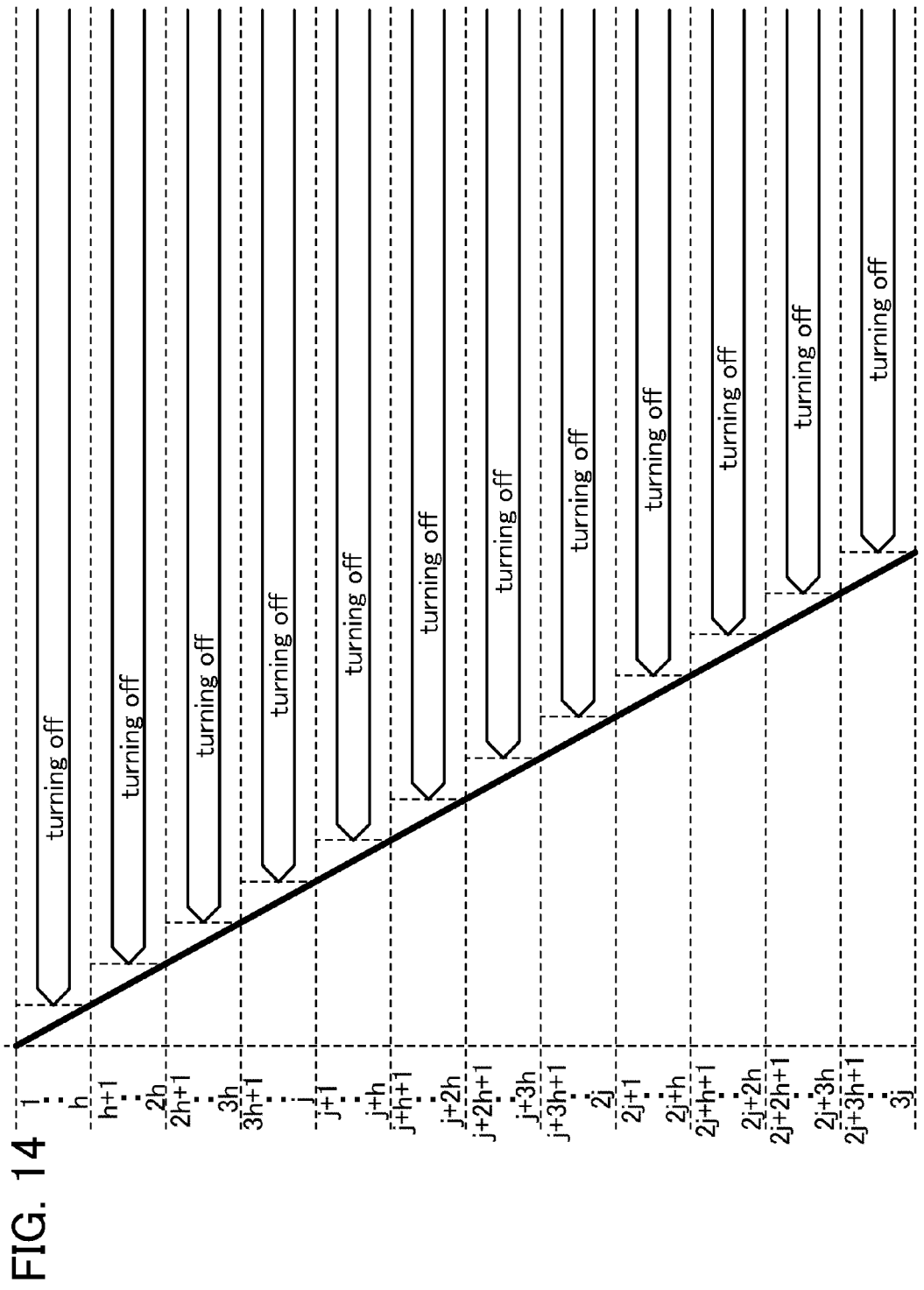
FIG. 14 shows timing of scanning of selection signals and timing of turning off of a backlight.

FIG. 14 shows the timing of scanning of the selection signals and the timing of turning off of the backlight in the monochrome still image display period 303 in the above-described liquid crystal display device. Note that in FIG. 14, the vertical axis represents the row in the pixel portion, and the horizontal axis represents time.

As shown in FIG. 14, the selection signals are supplied sequentially to the scan lines GL1 to GL3*j* in the monochrome still image display period 303 in the liquid crystal display device described in this embodiment.

Specifically, in FIG. 14, after a selection signal is supplied to all the enable lines ENR, so that all the second pixel transistors 16*b* are turned on, and image signals are written to pixels 15 connected to the scan lines GL1 to GL*h* for the region 101, at the same time as writings of image signals to pixels 15 connected to the scan lines GL*h*+1 to GL2*h*, supply of light from the light sources to the pixels 15 connected to the scan lines GL1 to GL*h* is stopped. As a result, image data are written to the reflective regions 14 of the pixels 15, and a monochrome image can be displayed in the pixel portion 10 by utilizing external light.

Note that in the case of the monochrome moving image display period 302, after the above operations are performed in the pixels connected to the scan lines GL1 to GL3*j*, the same operation may be repeated again, so that a monochrome image is displayed in the pixel portion continually.

<Configuration Example 2 of Pulse Output Circuit>

Figure 15A:
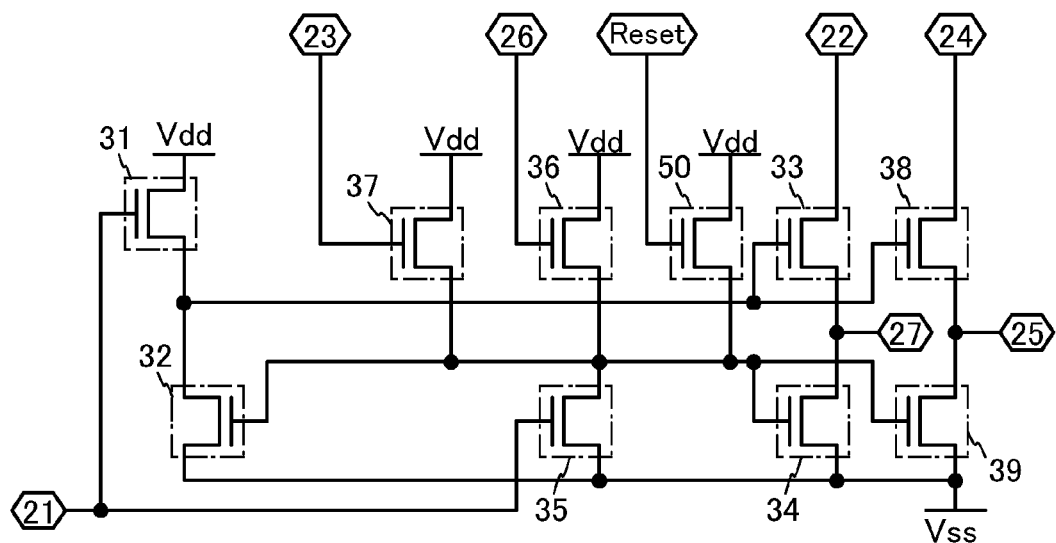
FIGS. 15A and 15B are diagrams each showing a configuration of a pulse output circuit.

FIG. 15A illustrates another configuration example of the pulse output circuit. The pulse output circuit illustrated in FIG. 15A includes a transistor 50 in addition to the configuration of the pulse output circuit illustrated in FIG. 8A. A first terminal of the transistor 50 is connected to the node supplied with the high power supply potential. A second terminal of the transistor 50 is connected to the gate electrode of the transistor 32, the gate electrode of the transistor 34, and the gate electrode of the transistor 39. A gate electrode of the transistor 50 is connected to a reset terminal (Reset).

A high-level potential is input to the reset terminal in a period which follows the round of switching of hues of the backlight in the pixel portion; a low-level potential is input in the other periods. Note that the transistor 50 is turned on when a high-level potential is input. Thus, the potential of each node can be initialized in the period after the backlight is turned on, so that malfunction can be prevented.

Note that in the case where the initialization is performed, it is necessary to provide an initialization period between periods in each of which an image is formed in the pixel portion. In addition, in the case where the backlight is turned off after one image is formed in the pixel portion, the initialization can be performed in the period in which the backlight is off.

Figure 15B:
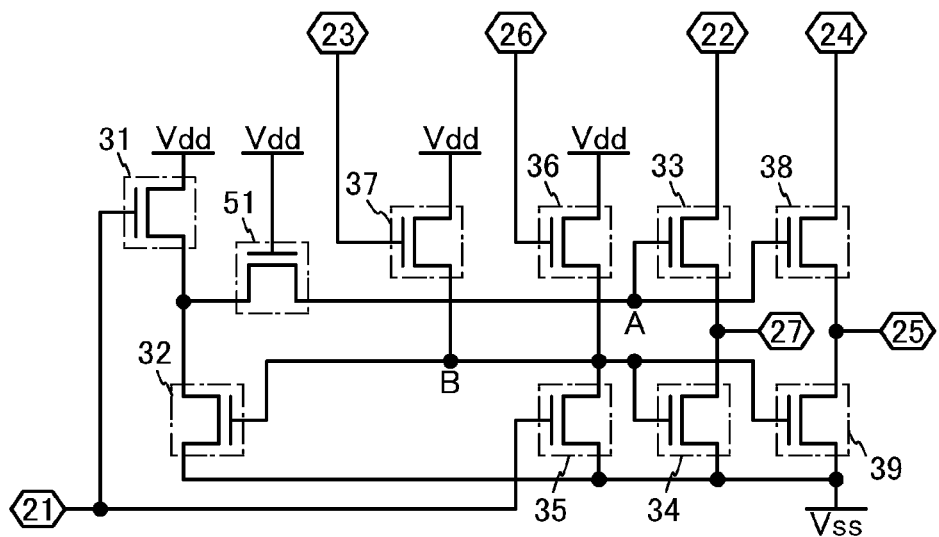

FIG. 15B illustrates another configuration example of the pulse output circuit. The pulse output circuit illustrated in FIG. 15B includes a transistor 51 in addition to the configuration of the pulse output circuit illustrated in FIG. 8A. A first terminal of the transistor 51 is connected to the second terminal of the transistor 31 and the second terminal of the transistor 32. A second terminal of the transistor 51 is connected to the gate electrode of the transistor 33 and the gate electrode of the transistor 38. A gate electrode of the transistor 51 is connected to the node supplied with the high power supply potential.

Note that the transistor 51 is off in the periods t1 to t6 shown in FIGS. 8B and 8C. Therefore, with the configuration including the transistor 51, the gate electrode of the transistor 33 and the gate electrode of the transistor 38 can be disconnected to the second terminal of the transistor 31 and the second terminal of the transistor 32 in the periods t1 to t6. Thus, a load at the time of the bootstrapping in the pulse output circuit can be reduced in the periods t1 to t6.

Figure 16A:
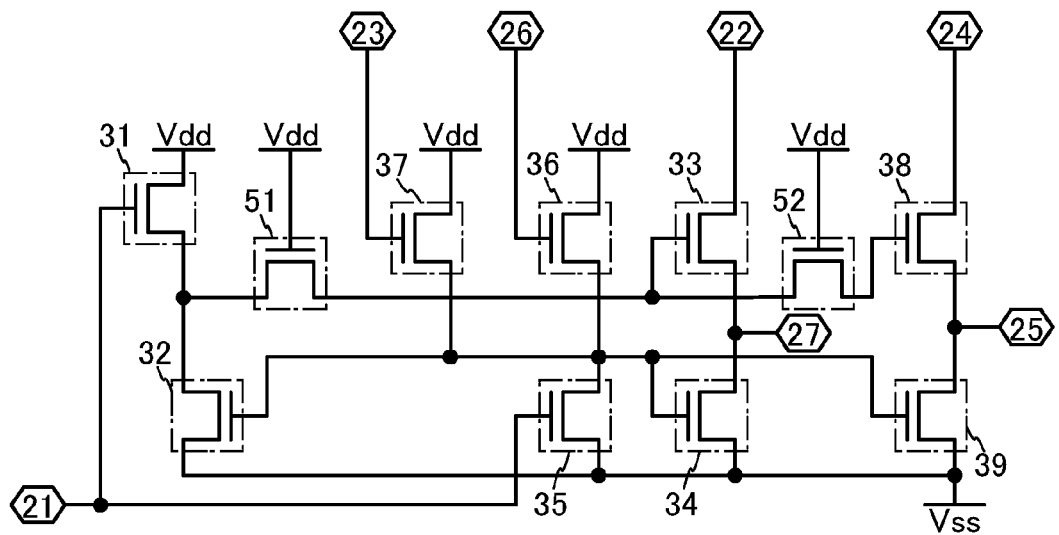
FIGS. 16A and 16B are diagrams each showing a configuration of a pulse output circuit.

FIG. 16A illustrates another configuration example of the pulse output circuit. The pulse output circuit illustrated in FIG. 16A includes a transistor 52 in addition to the configuration of the pulse output circuit illustrated in FIG. 15B. A first terminal of the transistor 52 is connected to the gate electrode of the transistor 33 and the second terminal of the transistor 51. A second terminal of the transistor 52 is connected to the gate electrode of the transistor 38. A gate electrode of the transistor 52 is connected to the node supplied with the high power supply potential.

A load at the time of the bootstrapping in the pulse output circuit can be reduced with the transistor 52. In particular, the effect of reducing the load is enhanced in the case where the potential of a node connected to the gate electrode of the transistor 33 is increased simply by capacitive coupling of the source electrode and the gate electrode of the transistor 33 in the pulse output circuit.

Figure 16B:
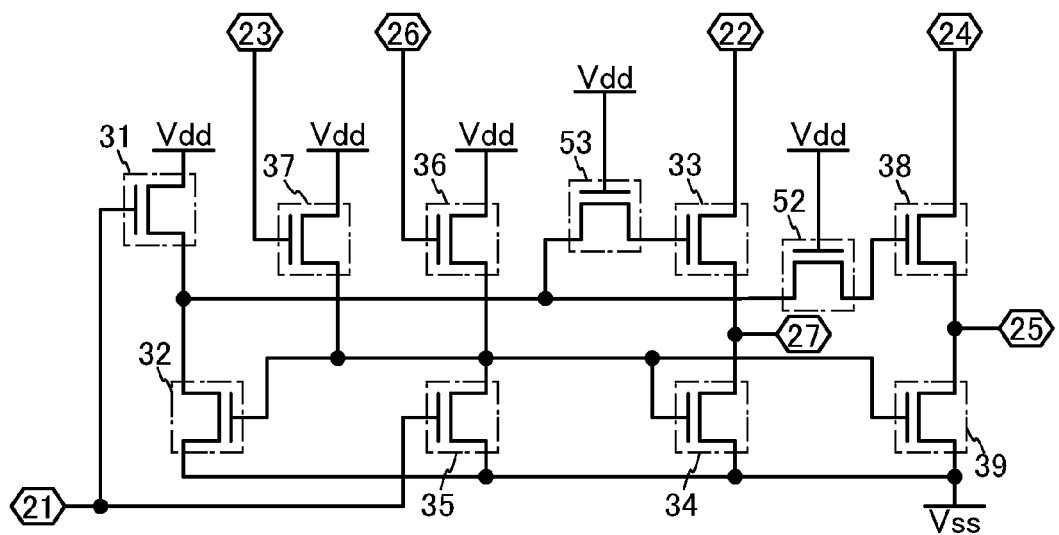

FIG. 16B illustrates another configuration example of the pulse output circuit. The pulse output circuit illustrated in FIG. 16B includes a transistor 53 in addition to the configuration of the pulse output circuit illustrated in FIG. 16A and does not include the transistor 51. A first terminal of the transistor 53 is connected to the second terminal of the transistor 31, the second terminal of the transistor 32, and the first terminal of the transistor 52. A second terminal of the transistor 53 is connected to the gate electrode of the transistor 33. A gate electrode of the transistor 53 is connected to the node supplied with the high power supply potential.

With the transistor 53, a load at the time of the bootstrapping in the pulse output circuit can be reduced. Further, an adverse effect of an irregular pulse generated in the pulse output circuit on the switching of the transistor 33 and the transistor 38 can be reduced.

As described in this embodiment, the liquid crystal display device according to one embodiment of the present invention performs color image display in such a manner that the pixel portion is divided into a plurality of regions and lights having different hues are sequentially supplied per region. At each time, the hues of the lights supplied to the adjacent regions can be different from each other. Accordingly, the images of different colors can be prevented from being perceived separately without being synthesized, and a color break, which is likely to occur when a moving image is displayed, can be prevented.

Note that in the case where a color image is displayed using a plurality of light sources having different hues, it is necessary to sequentially switch the plurality of light sources when light emission is performed unlike in the case where a light source of a single color and a color filter are used in combination. In addition, a frequency at which the light sources are switched needs be higher than a frame frequency in the case of using a single-color light source. For example, when the frame frequency in the case of using the single-color light source is 60 Hz, in the case where field-sequential driving is performed using light sources corresponding to colors of red, green, and blue, the frequency at which the light sources are switched is about three times as high as the frame frequency, i.e., 180 Hz. Accordingly, the driver circuits, which are operated in accordance with the frequency of the light sources, are operated at an extremely high frequency. Therefore, power consumption in the driver circuits tends to be higher than in the case of using the combination of the single-color light source and the color filter.

However, in one embodiment of the present invention, the transistor whose off-state current is extremely low is used, whereby the period in which a voltage applied to the liquid crystal element is held can be longer. Therefore, the driving frequency of a still image display can be lower than that of moving image display. Accordingly, it is possible to obtain a liquid crystal display device whose power consumption is reduced.

(Embodiment 2)

In this embodiment, a manufacturing method of a transistor including an oxide semiconductor will be described.

Figure 17A:
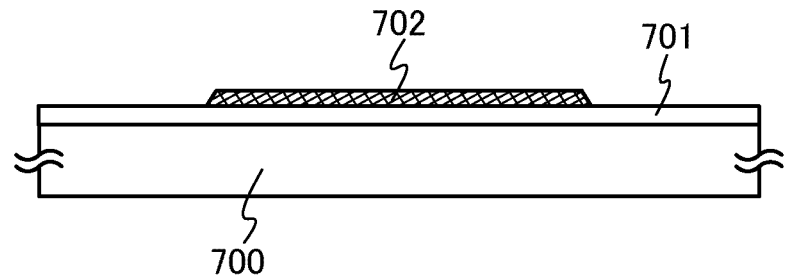
FIGS. 17A to 17C are cross-sectional views illustrating a method for manufacturing a transistor.

First, as illustrated in FIG. 17A, an insulating film 701 is formed over an insulating surface of a substrate 700, and a gate electrode 702 is formed over the insulating film 701.

Although there is no particular limitation on a substrate which can be used as the substrate 700 as long as it has a light-transmitting property, it is necessary that the substrate have at least enough heat resistance to heat treatment performed later. For example, a glass substrate manufactured by a fusion method or a float method, a quartz substrate, a ceramic substrate, or the like can be used as the substrate 700. In the case where a glass substrate is used and the temperature at which the heat treatment is to be performed later is high, a glass substrate whose strain point is higher than or equal to 730° C. is preferably used. Although a substrate formed of a flexible synthetic resin such as plastic generally has a lower resistance temperature than the aforementioned substrates, it may be used as long as being resistant to a processing temperature during manufacturing steps.

The insulating film 701 is formed using a material which can withstand a temperature of heat treatment in a later manufacturing step. The insulating film 701 serves as a base layer. Specifically, it is preferable that the insulating film 701 have a single-layer structure or a stacked-layer structure using one or more of insulating layers selected from a silicon oxide layer, a silicon nitride layer, a silicon nitride oxide layer, a silicon oxynitride layer, an aluminum nitride layer, an aluminum oxide layer, an aluminum oxynitride layer, an aluminum nitride oxide layer, a gallium oxide layer, and the like. With the use of any of the above materials, diffusion of an impurity element from the substrate 700 can be prevented.

When a halogen element such as chlorine or fluorine is contained in the base layer, a function of preventing diffusion of an impurity element from the substrate 700 can be further improved. The concentration of a halogen element to be contained in the base layer is measured by secondary ion mass spectrometry (SIMS) and its peak is preferably greater than or equal to $1\times10^{15}/cm^3$ and less than or equal to $1\times10^{20}/cm^3$.

Gallium oxide may be used for the base layer. Alternatively, a stacked-layer structure of a gallium oxide layer and the above insulating layer may be used for the base layer. Gallium oxide is a material which is hardly charged; therefore, variation in threshold voltage due to charge buildup of the insulating layer can be suppressed.

In this specification, an oxynitride denotes a material in which the amount of oxygen is larger than that of nitrogen, and a nitride oxide denotes a material in which the amount of nitrogen is larger than that of oxygen.

The gate electrode 702 can be formed with a single layer or a stacked layer using one or more of conductive films including a metal material such as molybdenum (Mo), titanium (Ti), chromium (Cr), tantalum (Ta), tungsten (W), neodymium (Nd), scandium (Sc), or magnesium (Mg), or an alloy material which includes any of these metal materials as a main component, or a nitride of these metals. Note that aluminum (Al) or copper (Cu) can also be used as such a metal material if it can withstand the temperature of heat treatment to be performed in a later process. Aluminum or copper is preferably combined with a refractory metal material so as to prevent a heat resistance problem and a corrosive problem. As the refractory metal material, molybdenum, titanium, chromium, tantalum, tungsten, neodymium, scandium, or the like can be used.

The thickness of the gate electrode 702 is in the range of 10 nm to 400 nm, preferably 100 nm to 200 nm. In this embodiment, after a conductive film for the gate electrode is formed to have a thickness of 150 nm by a sputtering method using a tungsten target, the conductive film is processed (patterned) into a desired shape by etching, whereby the gate electrode 702 is formed. Note that when end portions of the formed gate electrode are tapered, coverage with a gate insulating film stacked thereover is improved, which is preferable. Note that a resist mask may be formed by an inkjet method. Formation of the resist mask by an inkjet method needs no photomask; thus, manufacturing cost can be reduced.

Figure 17B:
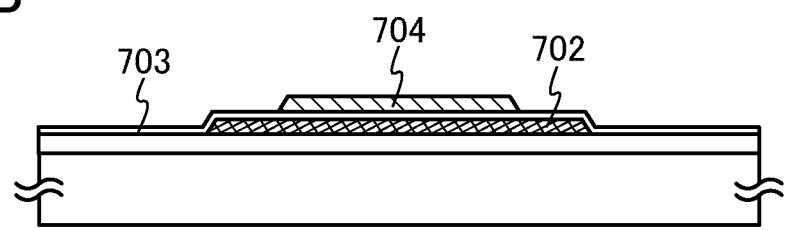

Next, as illustrated in FIG. 17B, a gate insulating film 703 is formed over the gate electrode 702, and an island-shaped oxide semiconductor film 704 is formed over the gate insulating film 703 in a position overlapping with the gate electrode 702.

The gate insulating film 703 can be formed with a single layer or a stacked layer using silicon oxide, silicon nitride, silicon oxynitride, silicon nitride oxide, aluminum oxide, aluminum nitride, aluminum oxynitride, aluminum nitride oxide, tantalum oxide, gallium oxide, lanthanum oxide, cesium oxide, magnesium oxide, yttrium oxide, hafnium oxide, hafnium silicate ($HfSi_xO_y$ (x>0, y>0)), hafnium silicate to which nitrogen is added ($HfSi_xO_yN_z$(x>0, y>0, z>0)), hafnium aluminate to which nitrogen is added ($HfAl_xO_yN_z$ (x>0, y>0, z>0)), or the like. A plasma CVD method, a sputtering method, or the like can be employed. It is preferable that the gate insulating film 703 contain an impurity such as moisture or hydrogen as little as possible. In the case where a silicon oxide film is formed by a sputtering method, a silicon target or a quartz target is used as a target and oxygen or a mixed gas of oxygen and argon is used as a sputtering gas.

An oxide semiconductor which is made to be an i-type or substantially i-type oxide semiconductor by reduction of oxygen deficiency is extremely sensitive to an interface state. Therefore, the interface between the oxide semiconductor and the gate insulating film 703 is important. Thus, higher quality is demanded for the gate insulating film (GI) in contact with the oxide semiconductor.

For example, a high-density plasma enhanced CVD using a microwave (frequency: 2.45 GHz) is preferably used, in which case an insulating film which is dense, has high withstand voltage, and is of high quality can be formed. When the oxide semiconductor and the high-quality gate insulating film are in close contact with each other, the interface state density can be reduced and favorable interface characteristics can be obtained.

Needless to say, other film formation methods, such as a sputtering method or a plasma CVD method, can be applied as long as a high-quality insulating film can be formed as the gate insulating film 703. In any case, any insulating film that has a reduced interface state density between a gate insulating film and the oxide semiconductor and can form a favorable interface as well as having a favorable film quality as the gate insulating film can be used.

In this embodiment, the gate insulating film 703 having a structure in which an aluminum oxide film having a thickness of 100 nm formed by a sputtering method is stacked over a silicon nitride film having a thickness of 50 nm formed by a sputtering method is formed. The thickness of the gate insulating film 703 may be set as appropriate depending on characteristics needed for the transistor and may be about 350 nm to 400 nm.

Note that the gate insulating film 703 is in contact with the oxide semiconductor to be formed later. When hydrogen is contained in the oxide semiconductor, characteristics of the transistor are adversely affected; therefore, it is preferable that the gate insulating film 703 do not contain hydrogen, a hydroxyl group, and moisture. In order that the gate insulating film 703 contains as little hydrogen, a hydroxyl group, and moisture as possible, it is preferable that an impurity adsorbed on the substrate 700, such as moisture or hydrogen, be eliminated and removed by preheating the substrate 700, over which the gate electrode 702 is formed, in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable. Note that this preheating treatment can be omitted.

The island-shaped oxide semiconductor film can be formed by processing an oxide semiconductor film formed over the gate insulating film 703 into a desired shape. The thickness of the oxide semiconductor film is greater than or equal to 2 nm and less than or equal to 200 nm, preferably greater than or equal to 3 nm and less than or equal to 50 nm, further preferably greater than or equal to 3 nm and less than or equal to 20 nm. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

In this embodiment, as the oxide semiconductor film, an In—Ga—Zn—O-based oxide semiconductor thin film with a thickness of 30 nm, which is obtained by a sputtering method using a metal oxide target including indium (In), gallium (Ga), and zinc (Zn), is used. As the target, for example, a target of $In_2O_3$:$Ga_2O_3$:ZnO=1:1:2 (molar ratio), $In_2O_3$:$Ga_2O_3$:ZnO=1:1:1 (molar ratio), or $In_2O_3$:$Ga_2O_3$:ZnO=1:1:4 (molar ratio) can be used. Note that an In—Ga—Zn—O-based oxide semiconductor can be referred to as IGZO.

An In—Sn—Zn—O-based oxide semiconductor can be referred to as ITZO. In the case where an ITZO thin film is used as the oxide semiconductor film, a target for formation of a film of ITZO by a sputtering method may have a composition ratio of In:Sn:Zn=1:2:2, In:Sn:Zn=2:1:3, In:Sn:Zn=1:1:1, or In:Sn:Zn=20:45:35 in an atomic ratio, for example.

The relative density of the metal oxide target is greater than or equal to 90% and less than or equal to 100%, preferably greater than or equal to 95% and less than 100%.

In this embodiment, the oxide semiconductor film is formed over the substrate 700 in such a manner that the substrate is placed in a treatment chamber kept at reduced pressure, a sputtering gas from which hydrogen and moisture have been removed is introduced into the treatment chamber while remaining moisture therein is removed, and the above target is used. For example, when argon is used as a sputtering gas, it is preferable that the purity be 9N, the dew point be −121° C., the content of $H_2O$ be 0.1 ppb or less, and the content of $H_2$ be 0.5 ppb or less. When oxygen is used as a sputtering gas, it is preferable that the purity be 8N, the dew point be −112° C., the content of $H_2O$ be 1 ppb or less, and the content of $H_2$ be 1 ppb or less.

The substrate temperature in film formation may be higher than or equal to 100° C. and lower than or equal to 600° C., preferably higher than or equal to 200° C. and lower than or equal to 400° C. By forming the oxide semiconductor film in a state where the substrate is heated, the concentration of an impurity contained in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of an impurity contained in the oxide semiconductor film formed in the deposition chamber can be reduced.

An example of the deposition conditions is as follows: the distance between the substrate and the target is 100 mm, the pressure is 0.6 Pa, the electric power of the direct-current (DC) power source is 0.5 kW, and oxygen (the flow rate of oxygen is 100%) is used as a sputtering gas. Note that a pulsed direct-current (DC) power source is preferable because dust generated in deposition can be reduced and the film thickness can be made uniform.

In order that the oxide semiconductor film contains as little hydrogen, a hydroxyl group, and moisture as possible, it is preferable that an impurity adsorbed on the substrate 700, such as moisture or hydrogen, be eliminated and removed by preheating the substrate 700, over which films up to and including the gate insulating film 703 are formed, in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an exhaustion unit, a cryopump is preferably provided for the preheating chamber. Note that this preheating treatment can be omitted. This preheating may be similarly performed on the substrate 700 over which films up to and including a conductive film 705 and a conductive film 706 are formed, before the formation of an insulating film 707 which will be formed later.

The concentration of an alkali metal such as Na or Li in the oxide semiconductor film is preferably less than or equal to $1 \times 10^{18}$ atoms/cm$^3$, further preferably less than or equal to $2 \times 10^{16}$ atoms/cm$^3$.

Note that etching for forming the island-shaped oxide semiconductor film 704 may be wet etching, dry etching, or both dry etching and wet etching. As the etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, ITO-07N (produced by KANTO CHEMICAL CO., INC.) may be used.

A resist mask for forming the island-shaped oxide semiconductor film 704 may be formed by an inkjet method. Formation of the resist mask by an inkjet method needs no photomask; thus, manufacturing cost can be reduced.

Note that the oxide semiconductor film formed by sputtering or the like contains a large amount of moisture or hydrogen (including a hydroxyl group) as an impurity in some cases. Moisture or hydrogen easily forms a donor level and thus serves as an impurity in the oxide semiconductor. In one embodiment of the present invention, in order to reduce an impurity such as moisture or hydrogen in the oxide semiconductor film (dehydration or dehydrogenation), the island-shaped oxide semiconductor film 704 is subjected to heat treatment in a reduced-pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

By performing heat treatment on the island-shaped oxide semiconductor film 704, moisture or hydrogen in the island-shaped oxide semiconductor film 704 can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately more than or equal to 3 minutes and less than or equal to 6 minutes. When an RTA method is used for the heat treatment, dehydration or dehydrogenation can be performed in a short time; therefore, treatment can be performed even at a temperature higher than the strain point of a glass substrate.

In this embodiment, an electrical furnace that is one of heat treatment apparatuses is used.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

Note that it is preferable that in the heat treatment, moisture, hydrogen, or the like be not contained in nitrogen or a rare gas such as helium, neon, or argon. Alternatively, the purity of nitrogen or the rare gas such as helium, neon, or argon which is introduced into a heat treatment apparatus is set to be 6N (99.9999%) or higher, preferably 7N (99.99999%) or higher (that is, the impurity concentration is 1 ppm or lower, preferably 0.1 ppm or lower).

Through the above-described process, the concentration of hydrogen in the island-shaped oxide semiconductor film 704 can be reduced and the island-shaped oxide semiconductor film 704 can be purified. In addition, the transistor can be manufactured using a large-sized substrate, so that the productivity can be increased. The above heat treatment can be performed at any time after the oxide semiconductor film is formed.

Note that in the case where the oxide semiconductor film is heated, although depending on a material of the oxide semiconductor film or heating conditions, plate-shaped crystals are formed at the surface of the oxide semiconductor film in some cases. The plate-shaped crystal is preferably a single crystal which is c-axis-aligned in a direction perpendicular to the surface of the oxide semiconductor film. Note that when a surface of the gate insulating film 703 in contact with the oxide semiconductor film is uneven, a plate-shaped crystal is a polycrystal. Therefore, the surface of the base is preferably as even as possible. Specifically, the surface of the base may have an average surface roughness (Ra) of 1 nm or less, preferably 0.3 nm or less, further preferably 0.1 nm or less. Ra can be measured using an atomic force microscope (AFM).

Figure 17C:
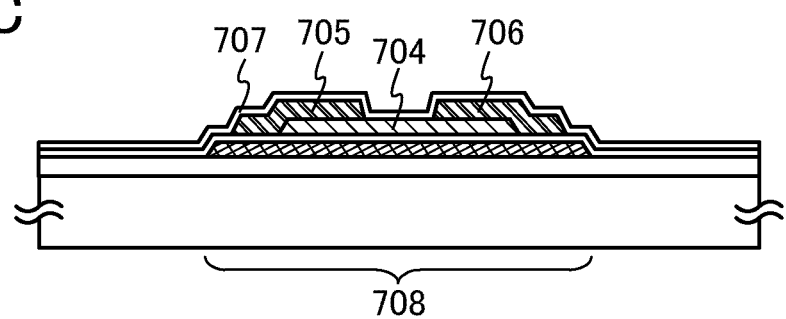

Next, as illustrated in FIG. 17C, the conductive film 705 and the conductive film 706 functioning as a source electrode and a drain electrode are formed, and an insulating film 707 is formed over the conductive film 705, the conductive film 706, and the island-shaped oxide semiconductor film 704.

The conductive film 705 and the conductive film 706 are formed in the following manner: a conductive film is formed to cover the island-shaped oxide semiconductor film 704 by a sputtering method or a vacuum evaporation method, and then the conductive film is patterned by etching or the like.

The conductive film 705 and the conductive film 706 are in contact with the island-shaped oxide semiconductor film 704. As a material of the conductive film for forming the conductive film 705 and the conductive film 706, any of the following materials can be used: an element selected from aluminum, chromium, copper, tantalum, titanium, molybdenum, or tungsten; an alloy including any of these elements; an alloy film including the above elements in combination; or the like. Alternatively, a structure may be employed in which a film of a refractory metal such as chromium, tantalum, titanium, molybdenum, or tungsten is stacked over or below a metal film of aluminum or copper. Aluminum or copper is preferably combined with a refractory metal material so as to prevent a heat resistance problem and a corrosion problem. As the refractory metal material, molybdenum, titanium, chromium, tantalum, tungsten, neodymium, scandium, yttrium, or the like can be used.

Further, the conductive film may have a single-layer structure or a stacked-layer structure of two or more layers. For example, a single-layer structure of an aluminum film containing silicon; a two-layer structure in which a titanium film is stacked over an aluminum film; a three-layer structure in which a titanium film, an aluminum film, and a titanium film are stacked in this order; and the like can be given.

For the conductive film for forming the conductive film 705 and the conductive film 706, a conductive metal oxide may be used. As the conductive metal oxide, indium oxide, tin oxide, zinc oxide, an alloy of indium oxide and tin oxide, an alloy of indium oxide and zinc oxide, or the metal oxide material containing silicon or silicon oxide can be used.

In the case where heat treatment is performed after formation of the conductive film, the conductive film preferably has heat resistance enough to withstand the heat treatment.

Note that the material and etching conditions are adjusted as appropriate so that the island-shaped oxide semiconductor film 704 is not removed in etching of the conductive film as much as possible. Depending on the etching conditions, there are some cases in which an exposed portion of the island-shaped oxide semiconductor film 704 is partly etched and thereby a groove (a depression portion) is formed.

In this embodiment, a titanium film is used for the conductive film. Therefore, wet etching can be selectively performed on the conductive film using a solution (ammonia hydrogen peroxide mixture) containing ammonia and hydrogen peroxide water; however, the island-shaped oxide semiconductor film 704 is partly etched in some cases. As the ammonia hydrogen peroxide mixture, specifically, an aqueous solution in which oxygenated water of 31 wt %, ammonia water of 28 wt %, and water are mixed at a volume ratio of 2:1:1 is used. Alternatively, dry etching may be performed on the conductive film with the use of a gas containing chlorine ($Cl_2$), boron trichloride ($BCl_3$), or the like.

In order to reduce the number of photomasks and steps in a photolithography step, etching may be performed with the use of a resist mask formed using a multi-tone mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Note that before formation of the insulating film 707, the island-shaped oxide semiconductor film 704 is subjected to plasma treatment with the use of a gas such as $N_2O$, $N_2$, or Ar. By the plasma treatment, adsorbed water or the like attached to an exposed surface of the island-shaped oxide semiconductor film 704 is removed. Plasma treatment may be performed using a mixture gas of oxygen and argon as well.

The insulating film 707 preferably contains an impurity such as moisture or hydrogen as little as possible. An insulating film of a single layer or a plurality of insulating films stacked may be employed for the insulating film 707. When hydrogen is contained in the insulating film 707, entry of the hydrogen to the oxide semiconductor film or extraction of oxygen from the oxide semiconductor film by the hydrogen occurs, whereby a back channel portion of the island-shaped oxide semiconductor film 704 has lower resistance (n-type conductivity); thus, a parasitic channel might be formed. Therefore, it is important that a film formation method in which hydrogen is not used be employed in order to form the insulating film 707 containing as little hydrogen as possible.

A material having a high barrier property is preferably used for the insulating film 707. For example, a silicon nitride film, a silicon nitride oxide film, an aluminum nitride film, an aluminum nitride oxide film, an aluminum oxide film, a gallium oxide film, or the like can be used as the insulating film having a high barrier property. When the insulating film having a high barrier property is used, an impurity such as moisture or hydrogen can be prevented from entering the island-shaped oxide semiconductor film 704, the gate insulating film 703, or the interface between the island-shaped oxide semiconductor film 704 and another insulating film and the vicinity thereof.

In this embodiment, the insulating film 707 having a structure in which an aluminum oxide film with a thickness of 100 nm formed by a sputtering method is stacked over a gallium oxide film with a thickness of 200 nm formed by a sputtering method is formed. The substrate temperature in film formation may be higher than or equal to room temperature and lower than or equal to 300° C. and in this embodiment, is 100° C.

The insulating film in contact with the oxide semiconductor preferably contains much oxygen that exceeds the stoichiometric proportion, preferably at a proportion greater than 1 time and less than twice of the stoichiometric proportion. By provision of such an insulating film including an oxygen excess region in contact with the island-shaped oxide semiconductor film 704, oxygen can supplied to the interface between the insulating film and the island-shaped oxide semiconductor film 704 and the inside of the island-shaped oxide semiconductor film 704; thus, oxygen deficiency can be reduced.

After the insulating film 707 is formed, heat treatment may be performed. The heat treatment is performed in a nitrogen atmosphere, an atmosphere of ultra-dry air, or a rare gas (e.g., argon, helium) atmosphere preferably at a temperature higher than or equal to 200° C. and lower than or equal to 400° C., for example, higher than or equal to 250° C. and lower than or equal to 350° C. It is desirable that the content of water in the gas be 20 ppm or less, preferably 1 ppm or less, further preferably 10 ppb or less. In this embodiment, for example, heat treatment is performed at 250° C. for one hour under a nitrogen atmosphere. Alternatively, RTA treatment for a short time at a high temperature may be performed before the formation of the conductive film 705 and the conductive film 706 in a manner similar to that of the previous heat treatment performed on the oxide semiconductor film for reduction of moisture or hydrogen.

Even when oxygen deficiency is generated in the island-shaped oxide semiconductor film 704 by the previous heat treatment, oxygen is supplied to the island-shaped oxide semiconductor film 704 from the insulating film including an oxygen excess region by performing heat treatment after the insulating film including an oxygen excess region is provided in contact with the island-shaped oxide semiconductor film 704. By supplying oxygen to the island-shaped oxide semiconductor film 704, oxygen deficiency that serves as a donor is reduced in the island-shaped oxide semiconductor film 704 and the stoichiometric proportion can be satisfied. The island-shaped oxide semiconductor film 704 preferably contains oxygen whose amount is greater than that in the stoichiometric proportion. As a result, the island-shaped oxide semiconductor film 704 can be made to be i-type or substantially i-type and variation in electric characteristics of the transistor due to oxygen deficiency can be reduced; thus, electric characteristics can be improved. The timing of this heat treatment is not particularly limited as long as it is after the formation of the insulating film 707. When this heat treatment doubles as another step such as heat treatment for formation of a resin film or heat treatment for reduction of the resistance of a light-transmitting conductive film, the island-shaped oxide semiconductor film 704 can be made to be i-type or substantially i-type without the number of steps increased.

Moreover, the oxygen deficiency that serves as a donor in the island-shaped oxide semiconductor film 704 may be reduced by subjecting the island-shaped oxide semiconductor film 704 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably 6N (99.9999%) or higher, further preferably 7N (99.99999%) or higher (that is, the impurity concentration in the oxygen is 1 ppm or lower, preferably 0.1 ppm or lower).

Alternatively, oxygen may be added to the island-shaped oxide semiconductor film 704 by an ion implantation method, an ion doping method, or the like to reduce oxygen deficiency serving as a donor. For example, oxygen which is made into a plasma state by a microwave at 2.45 GHz may be added to the island-shaped oxide semiconductor film 704.

Note that a back gate electrode may be formed in a position overlapping with the island-shaped oxide semiconductor film 704 by forming a conductive film over the insulating film 707 and then patterning the conductive film. In the case where the back gate electrode is formed, an insulating film is preferably formed to cover the back gate electrode. The back gate electrode can be formed using a material and a structure similar to those of the gate electrode 702 or the conductive films 705 and 706.

The thickness of the back gate electrode is set to be 10 nm to 400 nm, preferably 100 nm to 200 nm. For example, the back gate electrode may be formed in a such a manner that a conductive film in which a titanium film, an aluminum film, and a titanium film are stacked is formed, a resist mask is formed by a photolithography method or the like, and unnecessary portions are removed by etching so that the conductive film is processed (patterned) to a desired shape. The back gate electrode also functions as a light-blocking film, whereby photodegradation of the transistor such as negative-bias temperature stress photodegradation can be reduced and the reliability can be increased.

Through the above-described process, a transistor 708 is formed.

The transistor 708 includes the gate electrode 702, the gate insulating film 703 over the gate electrode 702, the island-shaped oxide semiconductor film 704 which is over the gate insulating film 703 and overlaps with the gate electrode 702, and a pair of the conductive film 705 and the conductive film 706 formed over the island-shaped oxide semiconductor film 704. Further, the transistor 708 may include the insulating film 707 as its constituent. The transistor 708 illustrated in FIG. 17C has a channel-etched structure in which part of the island-shaped oxide semiconductor film 704 between the conductive film 705 and the conductive film 706 is etched.

Although the transistor 708 is described as a single-gate transistor, a multi-gate transistor including a plurality of channel formation regions can be manufactured as needed. The multi-gate transistor includes a plurality of the gate electrodes 702 electrically connected to each other.

This embodiment can be implemented in combination with other embodiments as appropriate.

(Embodiment 3)

In this embodiment, structural examples of a transistor will be described. Note that the same portions as those in the above embodiments, portions having functions similar to those in the above embodiments, the same steps as those in the above embodiments, and steps similar to those in the above embodiments may be described as in the above embodiments, and repeated description thereof is omitted in this embodiment. Further, a specific description for the same portions is omitted.

Figure 18A:
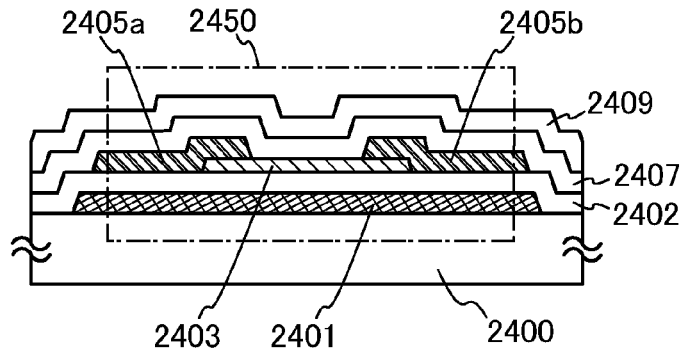
FIGS. 18A to 18D are cross-sectional views of transistors.

A transistor 2450 illustrated in FIG. 18A includes a gate electrode 2401 over a substrate 2400, a gate insulating film 2402 over the gate electrode 2401, an oxide semiconductor layer 2403 over the gate insulating film 2402, and a source electrode 2405*a* and a drain electrode 2405*b* over the oxide semiconductor layer 2403. An insulating film 2407 is formed over the oxide semiconductor layer 2403, the source electrode 2405*a*, and the drain electrode 2405*b*. A protective insulating film 2409 may be formed over the insulating film 2407. The transistor 2450 is a bottom-gate transistor, and is also an inverted staggered transistor.

Figure 18B:
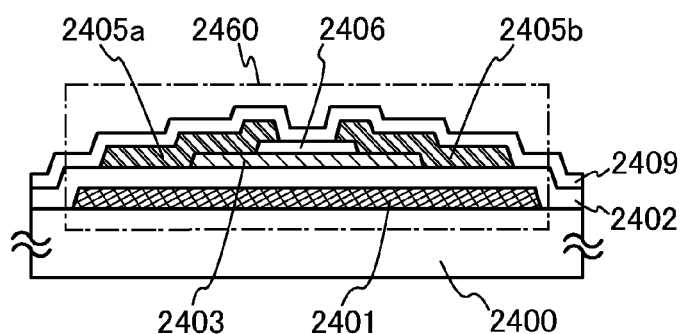

A transistor 2460 illustrated in FIG. 18B includes the gate electrode 2401 over the substrate 2400, the gate insulating film 2402 over the gate electrode 2401, the oxide semiconductor layer 2403 over the gate insulating film 2402, a channel protective layer 2406 over the oxide semiconductor layer 2403, and the source electrode 2405*a* and the drain electrode 2405*b* over the channel protective layer 2406 and the oxide semiconductor layer 2403. The protective insulating film 2409 may be formed over the source electrode 2405*a* and the drain electrode 2405*b*. The transistor 2460 is a bottom-gate transistor called a channel-protective type (also referred to as a channel-stop type) transistor and is also an inverted staggered transistor. The channel protective layer 2406 can be formed using a material and a method similar to those of any other insulating film.

Figure 18C:
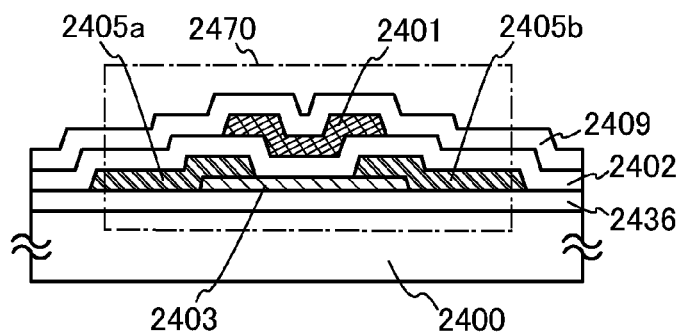

A transistor 2470 illustrated in FIG. 18C includes a base film 2436 over the substrate 2400, the oxide semiconductor layer 2403 over the base film 2436, a source electrode 2405*a* and a drain electrode 2405*b* over the oxide semiconductor layer 2403 and the base film 2436, the gate insulating film 2402 over the oxide semiconductor layer 2403, the source electrode 2405*a*, and the drain electrode 2405*b*, and the gate electrode 2401 over the gate insulating film 2402. The protective insulating film 2409 may be formed over the gate electrode 2401. The transistor 2470 is a top-gate transistor.

Figure 18D:
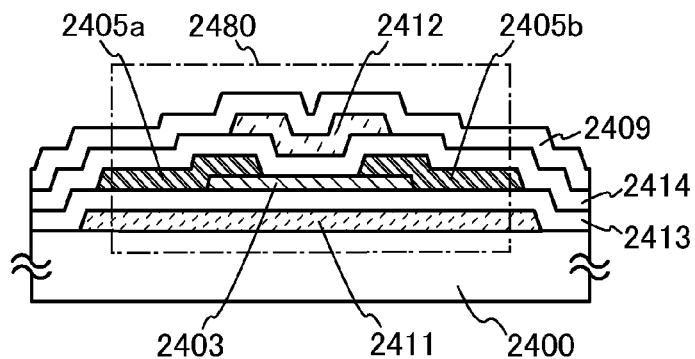

A transistor 2480 illustrated in FIG. 18D includes a first gate electrode 2411 over the substrate 2400, a first gate insulating film 2413 over the first gate electrode 2411, the oxide semiconductor layer 2403 over the first gate insulating film 2413, and the source electrode 2405*a* and the drain electrode 2405*b* over the oxide semiconductor layer 2403 and the first gate insulating film 2413. A second gate insulating film 2414 is formed over the oxide semiconductor layer 2403, the source electrode 2405*a*, and the drain electrode 2405*b*, and a second gate electrode 2412 is formed over the second gate insulating film 2414. The protective insulating film 2409 may be formed over the second gate electrode 2412.

The transistor 2480 has a structure combining the transistor 2450 and the transistor 2470. The first gate electrode 2411 and the second gate electrode 2412 can be electrically connected to each other, so that they function as one gate electrode. Either the first gate electrode 2411 or the second gate electrode 2412 may be simply referred to as a gate electrode and the other may be referred to as a back gate electrode.

Figure 19A:
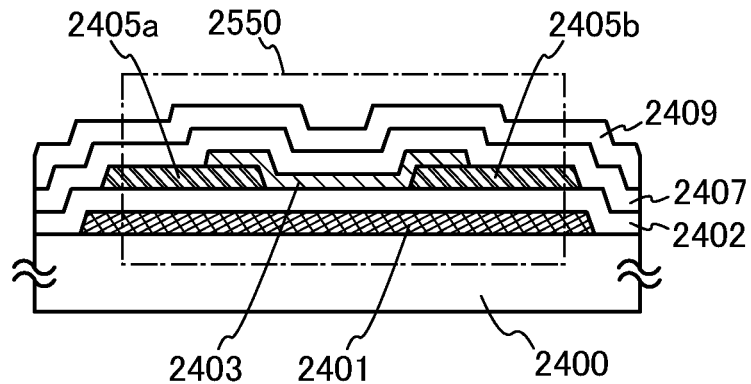
FIGS. 19A to 19C are cross-sectional views of transistors.

A transistor 2550 illustrated in FIG. 19A includes the gate electrode 2401 over the substrate 2400, the gate insulating film 2402 over the gate electrode 2401, the source electrode 2405*a* and the drain electrode 2405*b* over the gate insulating film 2402, and the oxide semiconductor layer 2403 over the gate insulating film 2402, the source electrode 2405*a*, and the drain electrode 2405*b*. The insulating film 2407 is formed over the oxide semiconductor layer 2403, the source electrode 2405*a*, and the drain electrode 2405*b*. The protective insulating film 2409 may be formed over the insulating film 2407. The transistor 2550 is a bottom-gate transistor and is also an inverted staggered transistor.

Figure 19B:
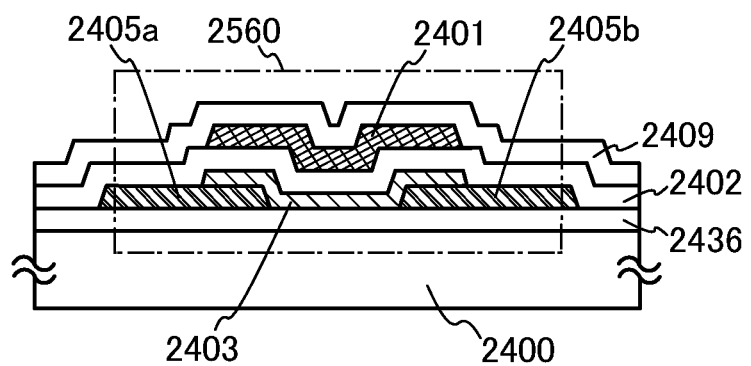

A transistor 2560 illustrated in FIG. 19B includes the base film 2436 over the substrate 2400, the source electrode 2405*a* and the drain electrode 2405*b* over the base film 2436, the oxide semiconductor layer 2403 over the base film 2436, the source electrode 2405*a*, and the drain electrode 2405*b*, the gate insulating film 2402 over the oxide semiconductor layer 2403, the source electrode 2405*a*, and the drain electrode 2405*b*, and the gate electrode 2401 over the gate insulating film 2402. The protective insulating film 2409 may be formed over the gate electrode 2401. The transistor 2560 is a top-gate transistor.

Figure 19C:
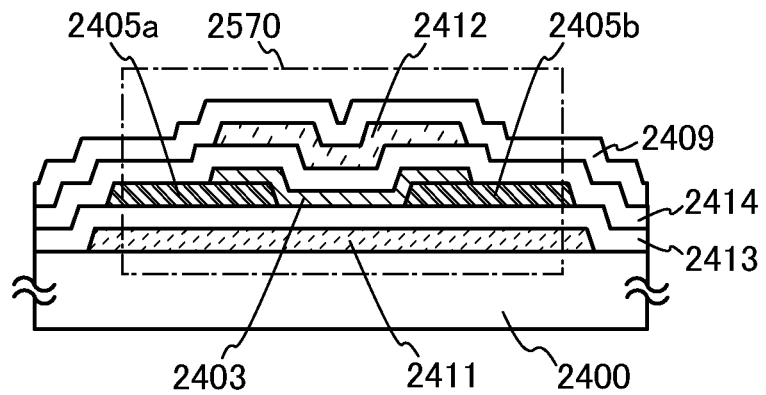

A transistor 2570 illustrated in FIG. 19C includes the first gate electrode 2411 over the substrate 2400, the first gate insulating film 2413 over the first gate electrode 2411, the source electrode 2405*a* and the drain electrode 2405*b* over the first gate insulating film 2413, the oxide semiconductor layer 2403 over the first gate insulating film 2413, the source electrode 2405*a*, and the drain electrode 2405*b*, the second gate insulating film 2414 over the oxide semiconductor layer 2403, the source electrode 2405*a*, and the drain electrode 2405*b*, and the second gate electrode 2412 over the second gate insulating film 2414. The protective insulating film 2409 may be formed over the second gate electrode 2412.

The transistor 2570 has a structure combining the transistor 2550 and the transistor 2560. The first gate electrode 2411 and the second gate electrode 2412 can be electrically connected to each other, so that they function as one gate electrode. Either the first gate electrode 2411 or the second gate electrode 2412 may be simply referred to as a gate electrode and the other may be referred to as a back gate electrode.

By changing a potential of the back gate electrode, the threshold voltage of the transistor can be changed. The back gate electrode is formed so as to overlap with a channel formation region in the oxide semiconductor layer 2403. Further, the back gate electrode may be electrically insulated and in a floating state, or may be in a state where the back gate electrode is supplied with a potential. In the latter case, the back gate electrode may be supplied with a potential at the same level as that of the gate electrode, or may be supplied with a fixed potential such as a ground potential. The level of the potential applied to the back gate electrode is controlled, so that the threshold voltage of the transistor 2480 or the transistor 2570 can be controlled.

When the oxide semiconductor layer 2403 is covered with the back gate electrode, light from the back gate electrode side can be prevented from entering the oxide semiconductor layer 2403. Therefore, photodegradation of the oxide semiconductor layer 2403 can be prevented and deterioration in characteristics such as a shift of the threshold voltage of the transistor can be prevented.

An insulating film in contact with the oxide semiconductor layer 2403 (in this embodiment, corresponding to the gate insulating film 2402, the insulating film 2407, the channel protective layer 2406, the base film 2436, the first gate insulating film 2413, and the second gate insulating film 2414) is preferably formed of an insulating material containing a Group 13 element and oxygen. Many oxide semiconductor materials contain a Group 13 element, and an insulating material containing a Group 13 element works well with an oxide semiconductor. By using an insulating material containing a Group 13 element for the insulating film in contact with the oxide semiconductor, an interface with the oxide semiconductor can keep a favorable state.

An insulating material containing a Group 13 element refers to an insulating material containing one or more Group 13 elements. As the insulating material containing a Group 13 element, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor film containing gallium, a material containing gallium oxide may be used for the insulating film, so that favorable characteristics can be kept at the interface between the oxide semiconductor film and the insulating film. When the oxide semiconductor film and the insulating film containing gallium oxide are provided in contact with each other, pileup of hydrogen at the interface between the oxide semiconductor film and the insulating film can be reduced, for example. Note that a similar effect can be obtained in the case where an element in the same group as a constituent element of the oxide semiconductor film is used in an insulating film. For example, it is effective to form an insulating film with the use of a material containing aluminum oxide. Note that aluminum oxide has a property of not easily transmitting water. Thus, it is preferable to use a material containing aluminum oxide in terms of preventing entry of water to the oxide semiconductor film.

The insulating material of the insulating film in contact with the oxide semiconductor layer 2403 is preferably made to include a region containing oxygen in a proportion higher than that in the stoichiometric composition (an oxygen excess region) by heat treatment in an oxygen atmosphere or by oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating film in contact with the oxide semiconductor layer 2403 is formed of gallium oxide, the composition of gallium oxide can be set to be $Ga_2O_x$ ($x=3+\alpha$, $0<\alpha<1$) by heat treatment in an oxygen atmosphere or by oxygen doping.

In the case where the insulating film in contact with the oxide semiconductor layer 2403 is formed of aluminum oxide, the composition of aluminum oxide can be set to be $Al_2O_x$ ($x=3+\alpha$, $0<\alpha<1$) by heat treatment in an oxygen atmosphere or by oxygen doping.

In the case where the insulating film in contact with the oxide semiconductor layer 2403 is formed of gallium aluminum oxide (aluminum gallium oxide), the composition of gallium aluminum oxide (aluminum gallium oxide) can be set to be $Ga_xAl_{2-x}O_{3+\alpha}$, ($0<x<2$, $0<\alpha<1$) by heat treatment in an oxygen atmosphere or by oxygen doping.

When the insulating film including an oxygen excess region is in contact with the oxide semiconductor film, oxygen that exists excessively in the insulating film is supplied to the oxide semiconductor film, and oxygen deficiency in the oxide semiconductor film or at the interface between the oxide semiconductor film and the insulating film is reduced. Thus, the oxide semiconductor film can be an i-type or substantially i-type oxide semiconductor.

The insulating film including an oxygen excess region may be applied to either the insulating film located on the upper side of the oxide semiconductor layer or the insulating film located on the lower side of the oxide semiconductor layer of the insulating films in contact with the oxide semiconductor layer 2403; however, it is preferable to apply such an insulating film to both of the insulating films in contact with the oxide semiconductor layer 2403. The above-described effect can be enhanced with a structure where the oxide semiconductor layer 2403 is sandwiched between the insulating films each including a region containing oxygen with a higher proportion than that in the stoichiometric composition, which are used as the insulating films in contact with the oxide semiconductor layer 2403 and placed on the upper side and the lower side of the oxide semiconductor layer 2403.

The insulating films on the upper side and the lower side of the oxide semiconductor layer 2403 may contain the same constituent element or different constituent elements. For example, the insulating films on the upper side and the lower side may be both formed of gallium oxide whose composition is $Ga_2O_x$ ($x=3+\alpha$, $0<\alpha<1$). Alternatively, one of the insulating films on the upper side and the lower side may be formed of gallium oxide whose composition is $Ga_2O_x$ ($x=3+\alpha$, $0<\alpha<1$) and the other may be formed of aluminum oxide whose composition is $Al_2O_x$ ($x=3+\alpha$, $0<\alpha<1$).

The insulating film in contact with the oxide semiconductor layer 2403 may be formed by stacking insulating films which each include an oxygen excess region. For example, the insulating film on the upper side of the oxide semiconductor layer 2403 may be formed as follows: gallium oxide whose composition is $Ga_2O_x$ ($x=3+a$, $0<a<1$) is formed and gallium aluminum oxide (aluminum gallium oxide) whose composition is $Ga_xAl_{2-x}O_{3+a}$ ($0<x<2$, $0<a<1$) is formed thereover.

Figure 28A:
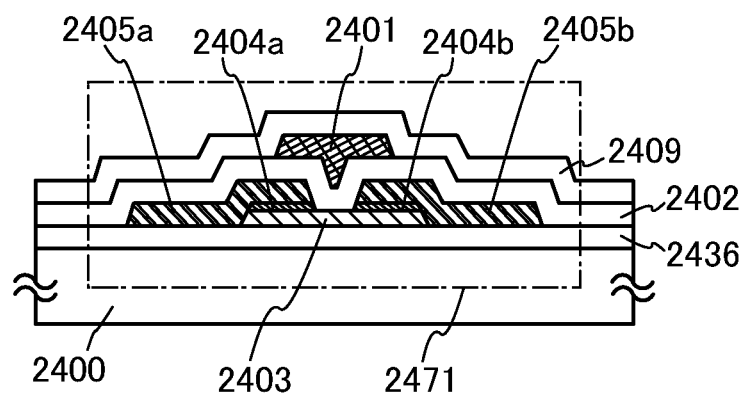
FIGS. 28A and 28B are cross-sectional views of transistors.
Figure 28B:
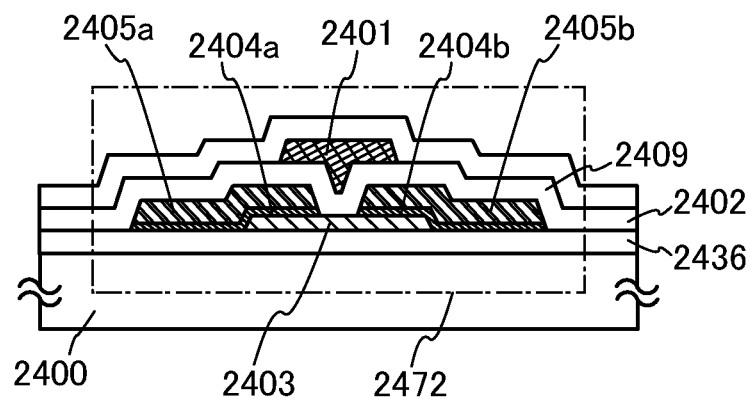

Oxide conductive layers functioning as a source region and a drain region may be provided between the oxide semiconductor layer 2403 and the source and drain electrodes 2405a and 2405b, as buffer layers. FIGS. 28A and 28B illustrate transistors 2471 and 2472, respectively, each having a structure in which the transistor 2470 in FIG. 18C further includes oxide conductive layers.

The transistors 2471 and 2472 in FIGS. 28A and 28B each include oxide conductive layers 2404a and 2404b functioning as a source region and a drain region between the oxide semiconductor layer 2403 and the source and drain electrodes 2405a and 2405b. The transistors 2471 and 2472 in FIGS. 28A and 28B are examples where the oxide conductive layers 2404a and 2404b have different shapes depending on a manufacturing process.

In the transistor 2471 in FIG. 28A, an oxide semiconductor film and an oxide conductive film are stacked and processed by the same photolithography step, so that the oxide semiconductor layer 2403 having an island shape and an oxide conductive film having an island shape are formed. After the source electrode 2405a and the drain electrode 2405b are formed over the oxide semiconductor layer and the oxide conductive film, the island-shaped oxide conductive film is etched with the use of the source electrode 2405a and the drain electrode 2405b as masks, so that the oxide conductive layers 2404a and 2404b serving as a source region and a drain region are formed.

In the transistor 2472 in FIG. 28B, an oxide conductive film is formed over the oxide semiconductor layer 2403, a metal conductive film is formed thereover, and the oxide conductive film and the metal conductive film are processed by the same photolithography step, so that the oxide conductive layers 2404a and 2404b serving as a source region and a drain region and the source and drain electrodes 2405a and 2405b are formed.

In the etching treatment for processing the shape of the oxide conductive film, etching conditions (such as the kind of the etchant, the concentration, and the etching time) are adjusted as appropriate so that the oxide semiconductor layer is not etched excessively.

As a formation method of the oxide conductive layers 2404a and 2404b, a sputtering method, a vacuum evaporation method (such as an electron beam evaporation method), an arc discharge ion plating method, or a spray method is used. As a material of the oxide conductive layers, zinc oxide, zinc aluminum oxide, zinc aluminum oxynitride, zinc gallium oxide, indium tin oxide, or the like can be used. In addition, the above materials may contain silicon oxide.

When oxide conductive layers are provided between the oxide semiconductor layer 2403 and the source and drain electrodes 2405a and 2405b, as a source region and a drain region, contact resistance can be reduced than in the case where the oxide semiconductor layer 2403 and the source and drain electrodes 2405a and 2405b are in direct contact with each other, so that the transistors 2471 and 2472 can operate at high speed.

Further, a structure including the oxide conductive layers 2404a and 2404b between the oxide semiconductor layer 2403 and the source and drain electrodes 2405a and 2405b can improve the withstand voltage of the transistors 2471 and 2472.

Any of the above-described insulating films having barrier properties may be used as the protective insulating film, so that elimination of oxygen from the oxide semiconductor layer can be prevented. As an example of the insulating film having a barrier property, an aluminum oxide film can be given. By providing insulating films having barrier properties on the upper side and the lower side of the oxide semiconductor layer, the effect of preventing elimination of oxygen from the oxide semiconductor layer can be enhanced. In other words, reliability of a semiconductor device can be improved.

This embodiment can be implemented in combination with other embodiments as appropriate.

(Embodiment 4)

Figure 29A:
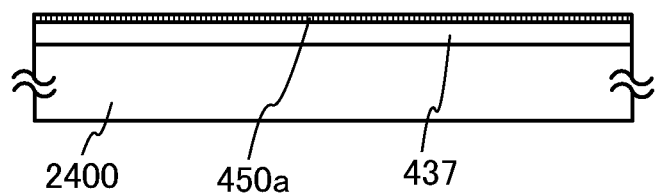
FIGS. 29A to 29C illustrate one embodiment of an oxide semiconductor layer.
Figure 29B:
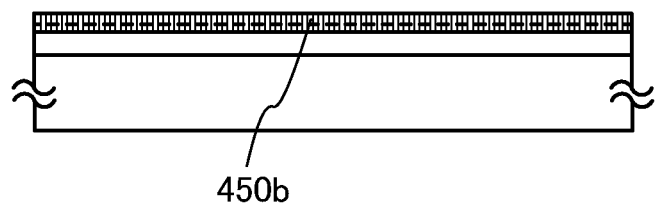

In this embodiment, one embodiment of an oxide semiconductor layer which can be used as the semiconductor layers of the transistors disclosed in this specification will be described with reference to FIGS. 29A to 29C.

The oxide semiconductor layer of this embodiment has a structure including a first crystalline oxide semiconductor layer and a second crystalline oxide semiconductor layer which is stacked over the first crystalline oxide semiconductor layer and has a larger thickness than the first crystalline oxide semiconductor layer.

An insulating layer 437 is formed over a substrate 2400. In this embodiment, an oxide insulating layer with a thickness greater than or equal to 50 nm and less than or equal to 600 nm is formed as the insulating layer 437 by a PCVD method or a sputtering method. For example, a single layer selected from a silicon oxide film, a gallium oxide film, an aluminum oxide film, a silicon oxynitride film, an aluminum oxynitride film, and a silicon nitride oxide film or a stack of any of these films can be used.

Next, a first oxide semiconductor film with a thickness greater than or equal to 1 nm and less than or equal to 10 nm is formed over the insulating layer 437. The first oxide semiconductor film is formed by a sputtering method, and the substrate temperature in the film formation by a sputtering method is set to be higher than or equal to 200° C. and lower than or equal to 400° C.

In this embodiment, the first oxide semiconductor film is formed to a thickness of 5 nm in an oxygen atmosphere, an argon atmosphere, or an atmosphere including argon and oxygen under conditions where a metal oxide target for an oxide semiconductor (a target for an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the electric power of the direct current (DC) power source is 0.5 kW.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 450a is formed (see FIG. 29A).

Depending on the substrate temperature at the time of deposition or the temperature of the first heat treatment, the deposition temperature or the first heat treatment causes crystallization from a film surface and crystal grows from the film surface toward the inside of the film; thus, c-axis aligned crystal is obtained. By the first heat treatment, a large amount of zinc and oxygen gather to the film surface, and one or more layers of graphen-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor layer 450a or the vicinity of the interface (within ±5 nm from the interface), whereby oxygen deficiency in the first crystalline oxide semiconductor layer is reduced. Therefore, it is preferable that oxygen be included in (in a bulk of) the insulating layer 437 used as a base insulating layer or at the interface between the first crystalline oxide semiconductor layer 450a and the insulating layer 437 at an amount that exceeds at least the stoichiometric proportion.

Next, a second oxide semiconductor film with a thickness more than 10 nm is formed over the first crystalline oxide semiconductor layer 450a. The second oxide semiconductor film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor film formed over and in contact with the surface of the first crystalline oxide semiconductor layer and so-called orderliness can be obtained.

In this embodiment, the second oxide semiconductor film is formed to a thickness of 25 nm using oxygen, argon, or a mixed gas of argon and oxygen as a sputtering gas under conditions where a metal oxide target for an oxide semiconductor (a target for an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the electric power of the direct current (DC) power source is 0.5 kW.

Next, second heat treatment is performed under a condition where the atmosphere of a chamber in which the substrate is set is a nitrogen atmosphere, an oxygen atmosphere, or a mixed atmosphere of nitrogen and oxygen. The temperature of the second heat treatment is higher than or equal to 400° C. and lower than or equal to 750° C. Through the second heat treatment, a second crystalline oxide semiconductor layer 450b is formed (see FIG. 29B). The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is reduced. By the second heat treatment, crystal growth proceeds in the thickness direction with the use of the first crystalline oxide semiconductor layer 450a as a nucleus, that is, crystal growth proceeds from the bottom to the inside; thus, the second crystalline oxide semiconductor layer 450b is formed.

It is preferable that steps from the formation of the insulating layer 437 to the second heat treatment be successively performed without exposure to the air. The steps from the formation of the insulating layer 437 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 29C:
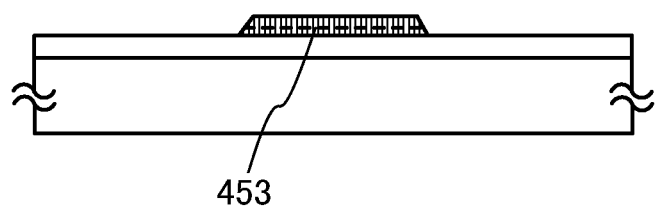

Next, the stack of the oxide semiconductor layers, the first crystalline oxide semiconductor layer 450a and the second crystalline oxide semiconductor layer 450b, is processed into an oxide semiconductor layer 453 including a stack of island-shaped oxide semiconductor layers (see FIG. 29C). In the drawing, the interface between the first crystalline oxide semiconductor layer 450a and the second crystalline oxide semiconductor layer 450b are indicated by a dotted line, and the first crystalline oxide semiconductor layer 450a and the second crystalline oxide semiconductor layer 450b are illustrated as a stack of oxide semiconductor layers; however, the interface is actually not distinct and is illustrated for easy understanding.

The stack of the oxide semiconductor layers can be processed by being etched after a mask having a desired shape is formed over the stack of the oxide semiconductor layers. The mask can be formed by a method such as photolithography. Alternatively, the mask may be formed by a method such as an ink jet method.

For the etching of the stack of the oxide semiconductor layers, either dry etching or wet etching may be employed. Needless to say, both of them may be employed in combination.

A feature of the first crystalline oxide semiconductor layer and the second crystalline oxide semiconductor layer obtained by the above formation method is that they have c-axis alignment. Note that the first crystalline oxide semiconductor layer and the second crystalline oxide semiconductor layer comprise an oxide including a crystal with c-axis alignment (also referred to as C-axis Aligned Crystal (CAAC)), which has neither a single crystal structure nor an amorphous structure. The first crystalline oxide semiconductor layer and the second crystalline oxide semiconductor layer partly include a crystal grain boundary.

Note that examples of a material for the first crystalline oxide semiconductor layer and the second crystalline oxide semiconductor layer include a four-component metal oxide such as an In—Sn—Ga—Zn—O-based material; three-component metal oxides such as an In—Ga—Zn—O-based material (also referred to as IGZO), an In—Sn—Zn—O-based material (also referred to as ITZO), an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, and an In—Lu—Zn—O-based material; two-component metal oxides such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material; and single-component metal oxides such as an In—O-based material, a Sn—O-based material, and a Zn—O-based material. In addition, the above materials may include $SiO_2$. Here, for example, an In—Ga—Zn—O-based material means an oxide material including indium (In), gallium (Ga), and zinc (Zn), and there is no particular limitation on the composition ratio. Further, the In—Ga—Zn—O-based material may include an element other than In, Ga, and Zn.

Without limitation to the two-layer structure in which the second crystalline oxide semiconductor layer is formed over the first crystalline oxide semiconductor layer, a stacked structure including three or more layers may be formed by repeatedly performing a process of film formation and heat treatment for forming a third crystalline oxide semiconductor layer after the second crystalline oxide semiconductor layer is formed.

The oxide semiconductor layer 453 including the stack of the oxide semiconductor layers formed by the above formation method can be used as appropriate for a transistor which can be applied to a semiconductor device disclosed in this specification.

In the transistor 2470 in Embodiment 3, in which the stack of the oxide semiconductor layers of this embodiment is used as the oxide semiconductor layer 2403, an electric field is not applied from one surface to the other surface of the oxide semiconductor layer and current does not flow in the thickness direction (from one surface to the other surface; specifically, in the vertical direction in FIG. 18C) of the stack of the oxide semiconductor layers. The transistor has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of a first crystalline oxide semiconductor layer and a second crystalline oxide semiconductor layer, like the oxide semiconductor layer 453, the transistor can have stable electric characteristics and high reliability.

This embodiment can be implemented in an appropriate combination with any of the structures described in the other embodiments.

(Embodiment 5)

In this embodiment, an example of a substrate used in a liquid crystal display device according to one embodiment of the present invention will be described with reference to FIGS. 20A, 20B, 20C, 20C', 20D, 20D', 20E, and 20E'.

First, a layer to be separated 6116 which includes a transistor, an interlayer insulating film, a wiring, and a pixel electrode, and depending on a case, a counter electrode, a light-blocking film, an alignment film, or the like, is formed over a substrate 6200 with a separation layer 6201 interposed therebetween.

The substrate 6200 may be a quartz substrate, a sapphire substrate, a ceramic substrate, a glass substrate, a metal substrate, or the like. Note that such a substrate which is thick enough to be definitely flexible enables precise formation of an element such as a transistor. The degree "not to be definitely flexible" means that the elastic modulus of the substrate is higher than or equivalent to that of a glass substrate used in generally fabricating a liquid crystal display.

The separation layer 6201 is formed with a single layer or a stacked layer using any of elements selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), an alloy material containing any of the above elements as its main component, and a compound material containing any of the above elements as its main component by a sputtering method, a plasma CVD method, a coating method, a printing method, or the like.

When the separation layer 6201 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

In the case where the separation layer 6201 has a stacked-layer structure, it is preferable that a metal layer and a metal oxide layer be formed as a first layer and a second layer, respectively. Typically, it is preferable to form a tungsten layer, a molybdenum layer, or a layer containing a mixture of tungsten and molybdenum as the first layer and to form an oxide, an oxynitride, or a nitride oxide of tungsten, molybdenum, or a mixture of tungsten and molybdenum as the second layer. When the metal oxide layer is formed as the second layer, an oxide layer (such as a silicon oxide which can be utilized as an insulating layer) may be formed over the metal layer as the first layer so that an oxide of the metal is formed on a surface of the metal layer.

Then, the layer to be separated 6116 is formed over the separation layer 6201 (see FIG. 20A). The layer to be separated 6116 includes components necessary for an element substrate, such as a transistor, an interlayer insulating film, a wiring, and a pixel electrode, and further, depending on a case, a counter electrode, a light-blocking film, an alignment film, or the like. Such components can be normally formed over the separation layer 6201. Materials, manufacturing methods, and structures of these components are similar to those described in any of the above embodiments, and repeated description thereof is omitted in this embodiment. Thus, the transistor and the electrode can be formed precisely using a known material and a known method.

Next, the layer to be separated 6116 is bonded to a temporary supporting substrate 6202 with the use of an adhesive 6203 for separation and then, the layer to be separated 6116 is separated from the separation layer 6201 over the substrate 6200 to be transferred (see FIG. 20B). Through this process, the layer to be separated 6116 is placed on the temporary supporting substrate side. Note that in this specification, a process in which a layer to be separated is transferred to a temporary supporting substrate from a formation substrate is referred to as a transfer process.

As the temporary supporting substrate 6202, a glass substrate, a quartz substrate, a sapphire substrate, a ceramic substrate, a metal substrate, or the like can be used. Alternatively, a plastic substrate which can withstand the temperature of the following process may be used.

As the adhesive 6203 for separation which is used here, an adhesive which is soluble in water or a solvent, an adhesive which is capable of being plasticized upon irradiation of UV light, or the like is used so that the temporary supporting substrate 6202 and the layer to be separated 6116 can be separated when necessary.

Any of various methods can be used as appropriate in a transfer process to the temporary supporting substrate 6202. For example, when a film including a metal oxide film is formed as the separation layer 6201 so as to be in contact with the layer to be separated, the metal oxide film is embrittled by crystallization, whereby the layer to be separated 6116 can be separated from the substrate 6200. When an amorphous silicon film containing hydrogen is formed as the separation layer 6201 between the substrate 6200 and the layer to be separated 6116, the amorphous silicon film containing hydrogen is removed by laser light irradiation or etching, so that the layer to be separated 6116 can be separated from the substrate 6200. In the case where a film containing nitrogen, oxygen, hydrogen, or the like (for example, an amorphous silicon film containing hydrogen, an alloy film containing hydrogen, an alloy film containing oxygen, or the like) is used as the separation layer 6201, the separation layer 6201 can be irradiated with laser light to release the nitrogen, oxygen, or hydrogen contained in the separation layer 6201 as a gas, so that separation between the layer to be separated 6116 and the substrate 6200 can be promoted. Alternatively, a liquid may be made to penetrate the interface between the separation layer 6201 and the layer to be separated 6116 to cause separation of the layer to be separated 6116 from the substrate 6200. Still alternatively, when the separation layer 6201 is formed using tungsten, the separation may be performed while the separation layer 6201 is etched with the use of an ammonia hydrogen peroxide mixture.

Further, the transfer process can be facilitated by using plural kinds of separation methods described above in combination. That is, the separation can be performed with physical force (by a machine or the like) after performing laser light irradiation on part of the separation layer, etching on part of the separation layer with a gas, a solution, or the like, or mechanical removal of part of the separation layer with a sharp knife, a scalpel, or the like, in order that the separation layer and the layer to be separated can be easily separated from each other. In the case where the separation layer 6201 is formed to have a stacked-layer structure of metal and a metal oxide, the layer to be separated can be physically separated easily from the separation layer by using a groove formed by laser light irradiation or a scratch made by a sharp knife, a scalpel, or the like as a trigger.

Alternatively, the separation may be performed while a liquid such as water is poured.

As a method for separating the layer to be separated 6116 from the substrate 6200, a method may alternatively be employed in which the substrate 6200 over which the layer to be separated 6116 is formed is removed by mechanical polishing or by etching using a solution or a halogen fluoride gas such as $NF_3$, $BrF_3$, or $ClF_3$, or the like. In that case, the separation layer 6201 is not necessarily provided.

Next, a surface of the layer to be separated 6116 or the separation layer 6201 exposed due to separation of the layer to be separated 6116 from the substrate 6200 is bonded to a transfer substrate 6110 with the use of a first adhesive layer 6111 including an adhesive different from the adhesive 6203 for separation (see FIG. 20C).

As a material of the first adhesive layer 6111, various curable adhesives, e.g., a light curable adhesive such as a UV curable adhesive, a reactive curable adhesive, a thermal curable adhesive, and an anaerobic adhesive can be used.

As the transfer substrate 6110, various substrates with high toughness, such as an organic resin film and a metal substrate, can be preferably used. Substrates with high toughness have high impact resistance and thus are less likely to be damaged. An organic resin film and a thin metal substrate, which are lightweight, enable significant weight reduction as compared to a general glass substrate. With the use of such a substrate, it is possible to fabricate a lightweight liquid crystal display device which is not easily damaged.

In the case of a transmissive or transflective liquid crystal display device, a substrate which has high toughness and transmits visible light may be used as the transfer substrate 6110. As a material of such a substrate, for example, polyester resins such as polyethylene terephthalate (PET) and polyethylene naphthalate (PEN), an acrylic resin, a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinylchloride resin can be given. A substrate made of such an organic resin has high toughness and thus has high impact resistance and is less likely to be damaged. Further, a film of such an organic resin, which is lightweight, enables significant reduction in weight of a display device unlike a general glass substrate. In this case, it is preferable that the transfer substrate 6110 further include a metal plate 6206 provided with an opening in a portion overlapped with at least a region of each pixel through which light is transmitted. With the above structure, the transfer substrate 6110 which has high toughness and high impact resistance and is less likely to be damaged can be formed while a change in dimension is suppressed. Further, when the thickness of the metal plate 6206 is reduced, the transfer substrate 6110 which is lighter than a general glass substrate can be formed. With the use of such a substrate, it is possible to fabricate a lightweight liquid crystal display device which is not easily damaged (see FIG. 20D).

Figure 21A:
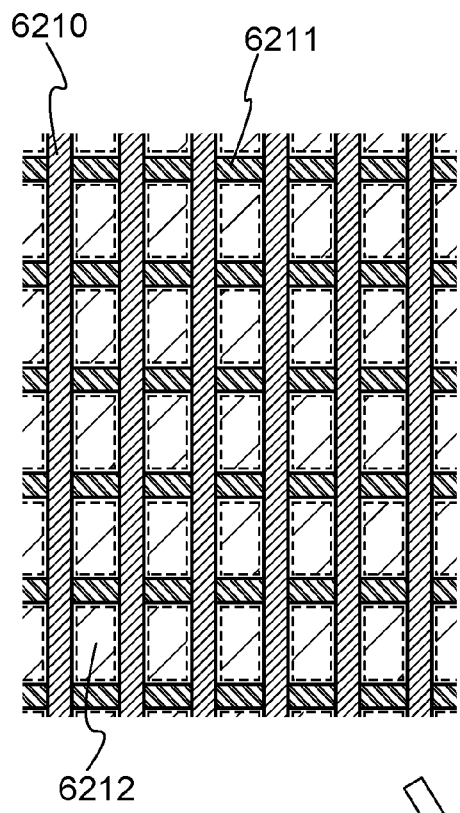
FIGS. 21A to 21C are diagrams illustrating a manufacturing method of a liquid crystal display device.
Figure 21B:
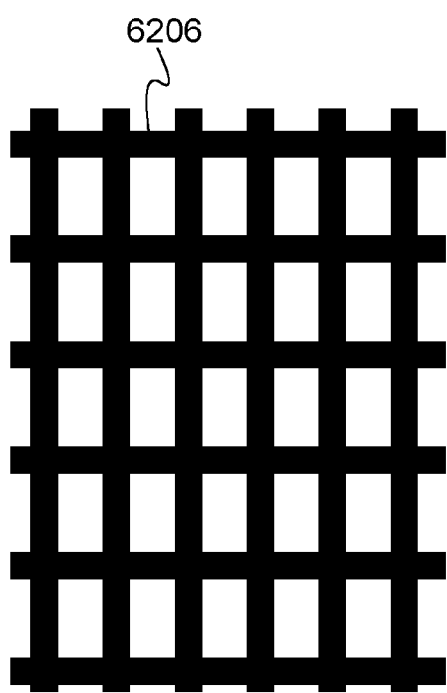
Figure 21C:
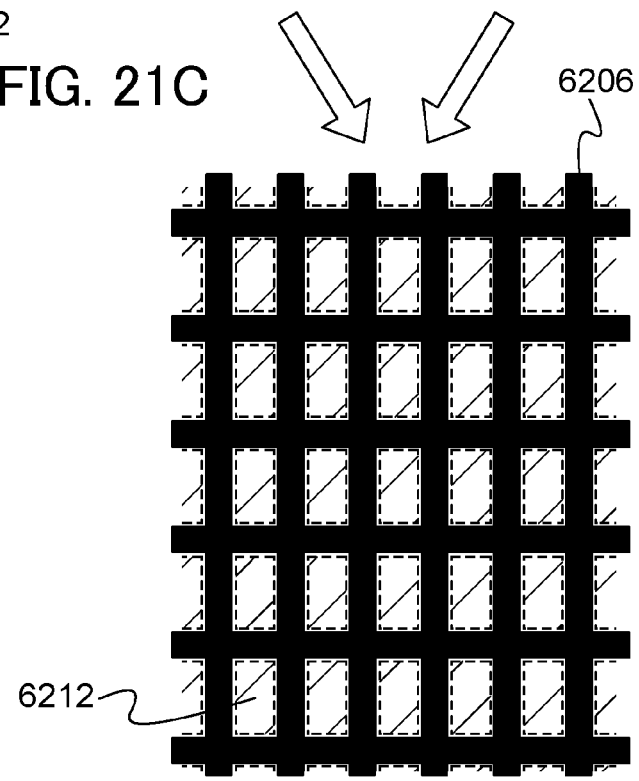

FIG. 21A is an example of a top view of a liquid crystal display device. In the case of a display device in which a first wiring layer 6210 and a second wiring layer 6211 intersect with each other, and a region surrounded by the first wiring layer 6210 and the second wiring layer 6211 is a light-transmitting region 6212 as illustrated in FIG. 21A, the metal plate 6206 having openings formed in a grid so as to leave a portion overlapping with the first wiring layer 6210 and/or the second wiring layer 6211 as in FIG. 21B may be used. Attachment of the metal plate 6206 makes it possible to suppress a change in dimension due to unfavorable alignment or extension of a substrate because of the use of a substrate made of an organic resin (see FIG. 21C). Note that when a polarizing plate (not illustrated) is necessary, it may be provided between the transfer substrate 6110 and the metal plate 6206 or outside the metal plate 6206. The polarizing plate may be attached to the metal plate 6206 in advance. Note that in terms of weight reduction, a substrate which is thin but has dimension stability is preferably used as the metal plate 6206.

After that, the temporary supporting substrate 6202 is separated from the layer to be separated 6116. Since the adhesive 6203 for separation includes a material capable of separating the temporary supporting substrate 6202 and the layer to be separated 6116 from each other when necessary, the temporary supporting substrate 6202 may be separated by a method depending on the material. Note that light is emitted from the backlight as shown by arrows in the drawing (see FIG. 20E).

Thus, the layer to be separated 6116, which includes components such as the transistor and the pixel electrode (a counter electrode, a light-blocking film, an alignment film, or the like may also be provided as necessary), can be formed over the transfer substrate 6110, whereby a lightweight element substrate with high impact resistance can be formed.

<Modification Example>

The liquid crystal display device having the above structure is one embodiment of the present invention, and the present invention also includes a liquid crystal display device having a structure different from that of the above liquid crystal display device. After the above transfer process (FIG. 20B), the metal plate 6206 may be attached to a surface of the exposed separation layer 6201 or the layer to be separated 6116 before attachment of the transfer substrate 6110 (see FIG. 20C'). In that case, a barrier layer 6207 is preferably provided between the metal plate 6206 and the layer to be separated 6116 so that a contaminant from the metal plate 6206 can be prevented from adversely affecting characteristics of the transistor in the layer to be separated 6116. In the case of providing the barrier layer 6207, the barrier layer 6207 may be provided over the surface of the exposed separation layer 6201 or the layer to be separated 6116 before attachment of the metal plate 6206. The barrier layer 6207 may be formed using an inorganic material, an organic material, or the like and typically silicon nitride and the like can be given. However, one embodiment of the present invention is not limited thereto as long as contamination of the transistor can be prevented. The barrier layer is formed using a light-transmitting material or formed to a thickness small enough to transmit light so that the barrier layer can transmit at least visible light. Note that the metal plate 6206 may be bonded with the use of a second adhesive layer (not illustrated) including an adhesive different from the adhesive 6203 for separation.

After that, the first adhesive layer 6111 is formed over a surface of the metal plate 6206 and the transfer substrate 6110 is attached to the first adhesive layer 6111 (FIG. 20D') and the temporary supporting substrate 6202 is separated from the layer to be separated 6116 (FIG. 20E'), whereby a lightweight element substrate with high impact resistance can be formed. Note that light is emitted from the backlight as shown by arrows in the drawing.

The lightweight element substrate with high impact resistance formed as described above is firmly attached to a counter substrate with the use of a sealant with a liquid crystal layer provided between the substrates, whereby a lightweight liquid crystal display device with high impact resistance can be manufactured. As the counter substrate, a substrate which has high toughness and transmits visible light (similar to a plastic substrate which can be used as the transfer substrate 6110) can be used. Further, a polarizing plate, a light-blocking film, a counter electrode, or an alignment film may be provided as necessary. As a method for forming the liquid crystal layer, a dispenser method, an injection method, or the like can be employed as in the conventional case.

In the case of the lightweight liquid crystal display device with high impact resistance manufactured as described above, a fine element such as the transistor can be formed over a glass substrate or the like which has relatively high dimensional stability, and the conventional manufacturing method can be applied, so that even such a fine element can be formed precisely. Therefore, the lightweight liquid crystal display device with high impact resistance can display images with high precision and high quality.

Further, the liquid crystal display device manufactured as described above may be flexible.

This embodiment can be implemented in combination with any of the above embodiments as appropriate.

(Embodiment 6)

Figure 22A:
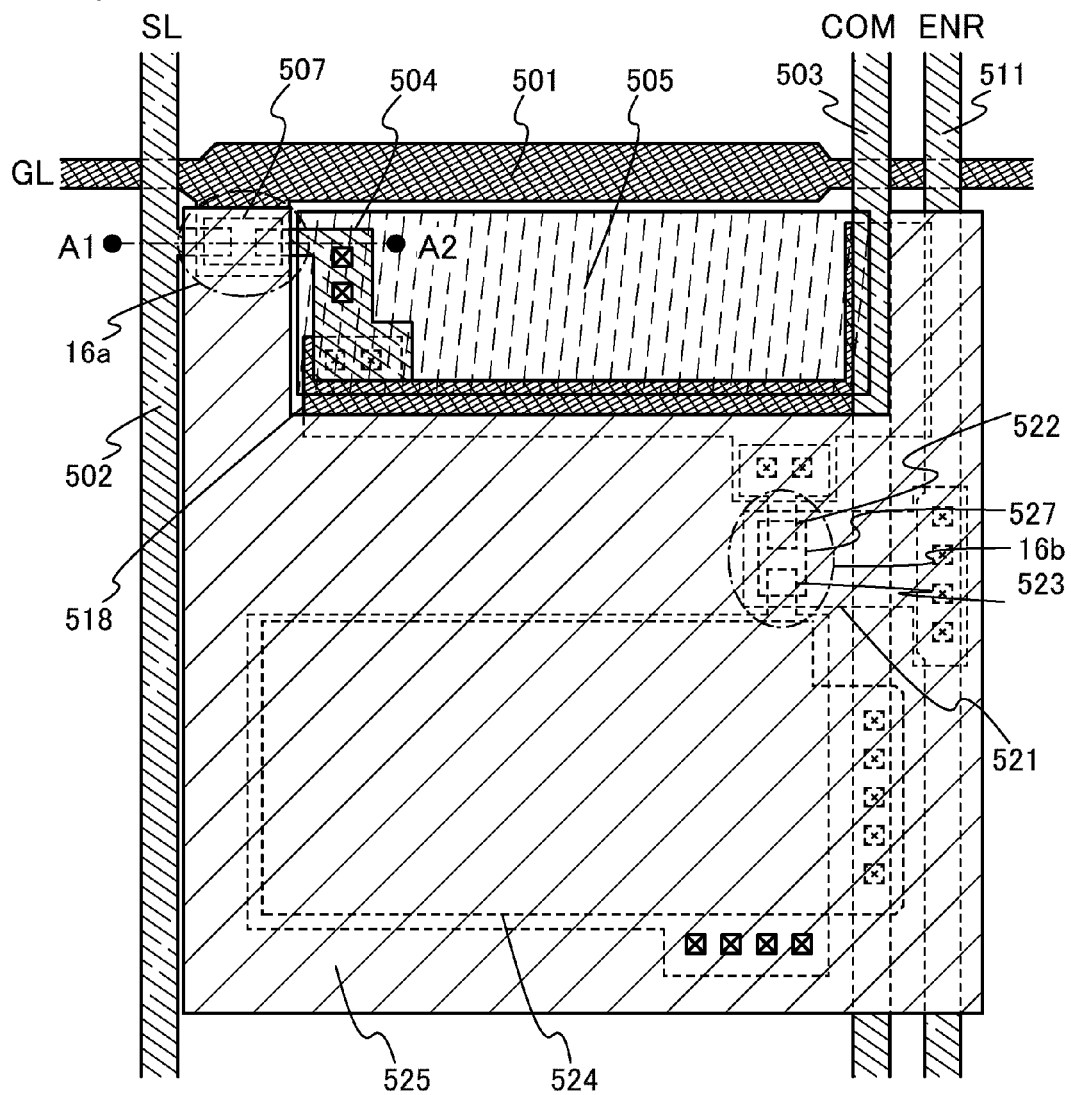
FIGS. 22A and 22B illustrate an example of a top view and a cross-sectional view of a pixel.
Figure 22B:
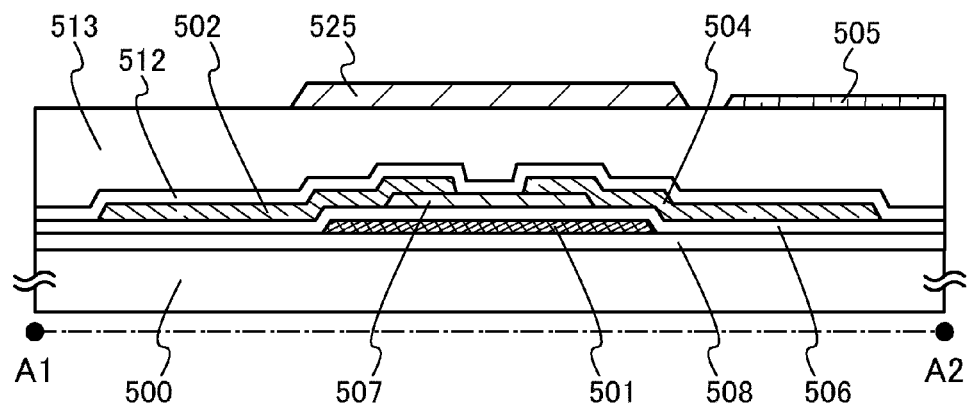

FIGS. 22A and 22B illustrate an example of a pixel which can be used for a liquid crystal display device. FIG. 22A is a top view of the pixel, and FIG. 22B is a cross-sectional view taken along dashed line A1-A2 in FIG. 22A. FIG. 23 is the top view in which a transmissive pixel electrode 505 and a reflective pixel electrode 525 in FIG. 22A are omitted so that a structure of the pixel described in this embodiment can be easily understood.

In FIGS. 22A and 22B, the same reference numerals are used for the same portions as those in FIGS. 2A and 2B. The pixel illustrated in FIGS. 22A and 22B includes a wiring 501 functioning as a scan line GL, a wiring 502 functioning as a signal line SL, a wiring 503 functioning as a common wiring COM, the first pixel transistor 16a, a wiring 504 functioning as the second terminal of the first pixel transistor 16a, and a wiring 518. The wiring 501 also functions as the gate electrode of the first pixel transistor 16a illustrated in FIG. 2B. In addition, the wiring 502 also functions as the first terminal of the first pixel transistor 16a.

The pixel illustrated in FIGS. 22A and 22B includes a wiring 511 functioning as an enable line ENR, the second pixel transistor 16b, a wiring 521 also functioning as the gate electrode of the second pixel transistor 16b, a wiring 522 also functioning as the first terminal of the second pixel transistor 16b, a wiring 523 also functioning as the second terminal of the second pixel transistor 16b, and a capacitor electrode 524.

The wiring 501, the wiring 518, the wiring 521, and the capacitor electrode 524 can be formed by processing one conductive film formed over a substrate 500 having an insulating surface with a base film 508 provided therebetween into a desired shape. A gate insulating film 506 is formed over the wiring 501, the wiring 518, the wiring 521, and the capacitor electrode 524. The wiring 502, the wiring 503, the wiring 504, the wiring 511, the wiring 522, and the wiring 523 can be formed by processing one conductive film formed over the gate insulating film 506 into a desired shape.

An active layer 507 of the first pixel transistor 16a is formed over the gate insulating film 506 so as to overlap with the wiring 501. The active layer 507 preferably overlaps completely with the wiring 501 functioning as a gate electrode. An active layer 527 of the second pixel transistor 16b is formed over the gate insulating film 506 so as to overlap with the wiring 521. The active layer 527 preferably overlaps completely with the wiring 521 functioning as a gate electrode. With such a structure, an oxide semiconductor in the active layer 507 and the active layer 527 can be prevented from deteriorating owing to incident light from the substrate 500 side; thus, deterioration of characteristics of the first pixel transistor 16a and the second pixel transistor 16b, such as a shift of the threshold voltage, can be prevented.

In the pixel illustrated in FIG. 22B, an insulating film 512 and an insulating film 513 are sequentially formed so as to cover the active layer 507, the wiring 502, the wiring 504, the active layer 527, the wiring 522, and the wiring 523. In addition, the transmissive pixel electrode 505 in a transmissive region and the reflective pixel electrode 525 in a reflective region are formed over the insulating film 513, and the wiring 504 and the wiring 523 are connected to the transmissive pixel electrode 505 and the reflective pixel electrode 525, respectively, through contact holes formed in the insulating film 512 and the insulating film 513.

The wiring 518, the wiring 511, the wiring 522, and the wiring 503 are connected to the wiring 504, the wiring 521, the wiring 518, and the capacitor electrode 524, respectively, through contact holes formed in the gate insulating film 506. A portion where the wiring 503 overlaps with the wiring 518 with the gate insulating film 506 provided therebetween functions as the first capacitor 17a and a portion where the wiring 523 overlaps with the capacitor electrode 524 with the gate insulating film 506 provided therebetween functions as the second capacitor 17b.

A surface of the insulating film 513 may be etched selectively so as to be uneven such that the reflective pixel electrode 525 has an uneven surface. When the reflective pixel electrode 525 has an uneven surface, incident light from the outside is irregularly reflected, so that more favorable display can be performed. Accordingly, visibility of display is improved.

By providing the reflective pixel electrode 525 so as to overlap with the active layer 507 of the first pixel transistor 16a and the active layer 527 of the second pixel transistor 16b, the oxide semiconductor in the active layer 507 and the active layer 527 can be prevented from deteriorating owing to stray light entered from the pixel electrode side; thus, deterioration of characteristics of the first pixel transistor 16a and the second pixel transistor 16b, such as a shift of the threshold voltage, can be prevented.

Note that in the case of forming a driver circuit on a panel, also by blocking light to a transistor used in the driver circuit with the use of a gate electrode or a light-blocking film, deterioration of characteristics of the transistor, such as a shift of the threshold voltage, can be prevented.

In FIG. 22B, an example in which the transmissive pixel electrode 505 (or the reflective pixel electrode 525) overlaps with a counter electrode (not shown) with a liquid crystal layer (not shown) therebetween is described; however, the structure of the liquid crystal display device according to one embodiment of the present invention is not limited to this structure. Like an IPS liquid crystal element or a liquid crystal element using a liquid crystal exhibiting a blue phase, the pixel electrode and the counter electrode may be formed over one substrate.

Figure 24A:
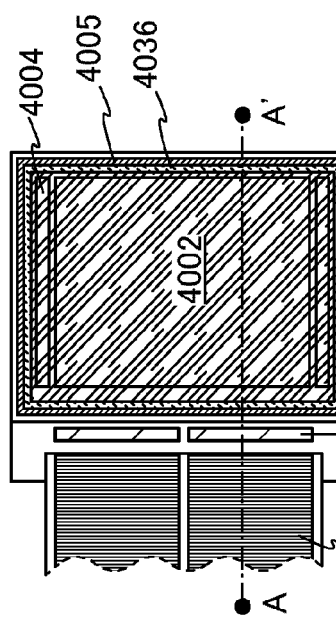
FIGS. 24A and 24B are a top view and a cross-sectional view illustrating a liquid crystal display device.
Figure 24B:
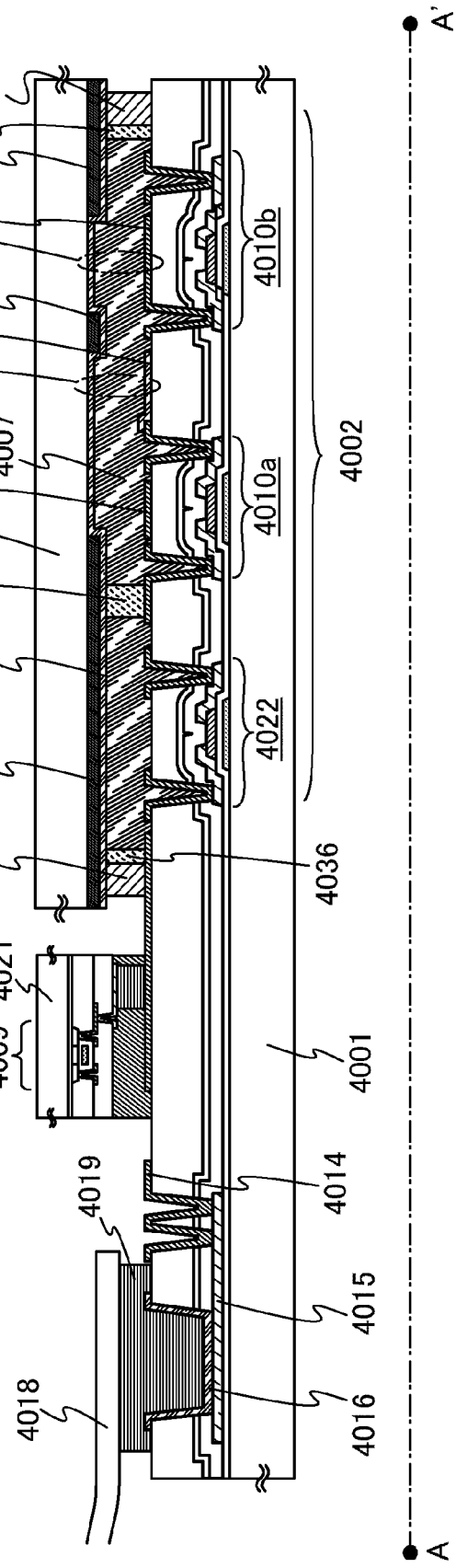

Next, a panel in the liquid crystal display device according to one embodiment of the present invention will be described with reference to FIGS. 24A and 24B. FIG. 24A is a top view of a panel where a substrate 4001 and a counter substrate 4006 are bonded to each other with a sealant 4005. FIG. 24B corresponds to a cross-sectional view taken along broken line A-A' in FIG. 24A.

The sealant 4005 is provided so as to surround a pixel portion 4002 and a scan line driver circuit 4004 provided over the substrate 4001. In addition, the counter substrate 4006 is provided over the pixel portion 4002 and the scan line driver circuit 4004. Thus, the pixel portion 4002 and the scan line driver circuit 4004 are sealed together with a liquid crystal layer 4007 by the substrate 4001, the sealant 4005, and the counter substrate 4006.

A substrate 4021 provided with a signal line driver circuit 4003 is mounted in a region which is different from a region surrounded by the sealant 4005 over the substrate 4001. FIG. 24B illustrates a transistor 4009 included in the signal line driver circuit 4003.

A plurality of transistors are included in the pixel portion 4002 and the scan line driver circuit 4004 which are provided over the substrate 4001. FIG. 24B illustrates transistors 4010a, 4010b, and 4022 which are included in the pixel portion 4002. Each of the transistors 4010a, 4010b, and 4022 includes an oxide semiconductor in a channel formation region. A light-blocking film 4040 provided for the counter substrate 4006 overlaps with a channel formation region of the transistor 4022. By blocking light to the transistor 4022, deterioration of an oxide semiconductor of the transistor 4022 due to light is prevented; thus, deterioration of characteristics of the transistor 4022, such as a shift of the threshold voltage, can be prevented.

A light-blocking metal film 4013 formed in the same process as a wiring 4014 formed using a metal material overlaps with a channel formation region of the transistor 4010a. By blocking light to the transistor 4010a with the light-blocking metal film 4013, deterioration of an oxide semiconductor due to light is prevented; thus, deterioration of characteristics of the transistor 4010a, such as a shift of the threshold voltage, can be prevented. The light-blocking metal film 4013 may be an electrode in a floating state, an electrode electrically connected to the oxide semiconductor of the transistor 4010a, or an electrode electrically connected to a gate electrode of the transistor 4010a.

Although the number of manufacturing steps is increased, a light-blocking resin film may be used instead of the light-blocking metal film 4013. The light-blocking resin film containing black colorant such as carbon black may be formed by an inkjet method or the like so as to overlap with the channel formation region of the transistor 4010a.

A pixel electrode 4030a formed using a light-transmitting conductive film is electrically connected to the transistor 4010a. A counter electrode 4031 is provided for the counter substrate 4006. A portion where the pixel electrode 4030a, the counter electrode 4031, and the liquid crystal layer 4007 overlap with one another corresponds to a liquid crystal element 4011a in a transmissive region.

A pixel electrode 4030b which is a reflective electrode is electrically connected to the transistor 4010b. A portion where the pixel electrode 4030b, the counter electrode 4031, and the liquid crystal layer 4007 overlap with one another corresponds to a liquid crystal element 4011b in a reflective region. The pixel electrode 4030b which is the reflective electrode overlaps with the channel formation region of the transistor 4010b. By blocking light to the transistor 4010b, deterioration of an oxide semiconductor of the transistor 4010b due to light is prevented; thus, deterioration of characteristics of the transistor 4010b, such as a shift of the threshold voltage, can be prevented.

A spacer 4035 is provided to control a distance (cell gap) between the pixel electrode 4030a and the counter electrode 4031 and between the pixel electrode 4030b and the counter electrode 4031. FIG. 24B shows the case where the spacer 4035 is formed in a columnar shape by patterning of an insulating film; alternatively, a spherical spacer may be used.

A variety of signals and potentials that are applied to the signal line driver circuit 4003, the scan line driver circuit 4004, and the pixel portion 4002 are supplied from a connection terminal 4016 through the wiring 4014 and a wiring 4015. The connection terminal 4016 is electrically connected to a FPC 4018 and an anisotropic conductive film 4019.

Note that a dispenser method (a dropping method) or a dip method (a pumping method) by which a liquid crystal is injected utilizing a capillary action after the attachment of the counter substrate 4006 can be used as a method for forming the liquid crystal layer 4007. As illustrated in FIGS. 24A and 24B, in the formation of the liquid crystal layer 4007, a partition 4036 is preferably provided between the liquid crystal layer 4007 and the sealant 4005 so that the liquid crystal layer 4007 and the sealant 4005 are prevented from being mixed with each other.

The partition 4036 can be formed using the same material and the same steps as those of the spacer 4035. The partition 4036 can be formed using, for example, an inorganic material such as silicon oxide, silicon nitride, silicon oxynitride, silicon nitride oxide, aluminum oxide, aluminum nitride, aluminum oxynitride, or aluminum nitride oxide, polyimide, an acrylic resin, a benzocyclobutene-based resin, polyamide, an epoxy resin, a siloxane-based resin, or the like.

As a method for forming the partition 4036, for example, a thin film may be formed by a sputtering method, a vacuum evaporation method, a PVD method, or a CVD method such as a low-pressure CVD (LPCVD) method or a plasma CVD method, and then etched into a desired shape. The partition 4036 can be formed by a droplet discharge method by which a pattern can be selectively formed, a printing method by which a pattern can be transferred or drawn (a method for forming a pattern, such as screen printing or offset printing), a coating method such as a spin coating method, a dipping method, a dispenser method, an imprint method, a nanoimprint method, or the like.

An example in which the liquid crystal layer 4007 is formed by a dispenser method will be described with reference to FIG. 25. A liquid crystal dropping apparatus in FIG. 25 includes a control device 40, an imaging means 42, and a head 43. The head 43 is filled with liquid crystal 44. The liquid crystal dropping apparatus, the substrate 4001, and the counter substrate 4006 can be aligned by taking images of a marker 45 on the substrate 4001 and a marker 46 on the counter substrate 4006 using the imaging means 42.

The sealant 4005 and the partition 4036 functioning as a barrier layer formed inside the sealant 4005 are provided for the counter substrate 4006 in a closed loop pattern, and the liquid crystal 44 is dropped therein once or plural times from the head 43. When the liquid crystal material has high viscosity, the liquid crystal material is continuously discharged and attached to a liquid crystal formation region without a break. On the other hand, when the liquid crystal material has low viscosity, the liquid crystal material is intermittently discharged to drop a droplet. When the liquid crystal 44 to be dropped has high viscosity, a heater may be provided in the head 43, so that the viscosity can be adjusted by heating with the heater.

Figure 25:
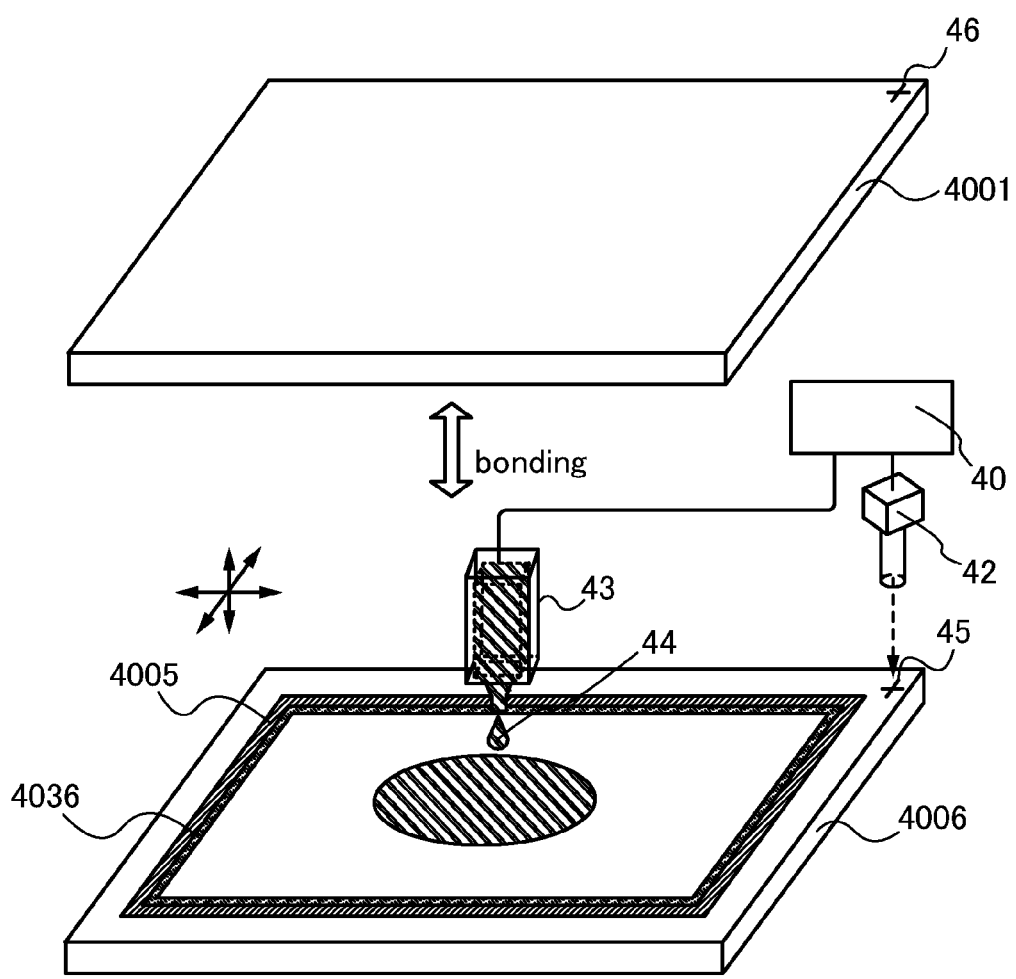
FIG. 25 illustrates an example of forming a liquid crystal layer by a dispenser method.

At the time of dropping the liquid crystal 44 to form the liquid crystal layer 4007, the partition 4036 is formed as a barrier layer inside the sealant 4005 as illustrated in FIGS. 24A and 24B and FIG. 25, so that the sealant 4005 and the liquid crystal layer 4007 are not mixed with each other; thus, reaction between the sealant 4005 and the liquid crystal layer 4007, contamination of the liquid crystal layer 4007 by the sealant 4005, or the like can be prevented.

Then, the substrate 4001 and the counter substrate 4006 are bonded to each other and ultraviolet curing is performed, so that the enclosed space is filled with liquid crystal; thus, the liquid crystal layer 4007 can be formed. Alternatively, the sealant 4005 may be formed on the substrate 4001 side, and a liquid crystal may be dropped. Note that the bonding between the substrate 4001 and the counter substrate 4006 is preferably performed under reduced pressure.

Note that as the substrate 4001, the counter substrate 4006, and the substrate 4021, glass, ceramics, or plastics can be used. Plastics include, in its category, a fiberglass-reinforced plastic (FRP) plate, a polyvinyl fluoride (PVF) film, a polyester film, an acrylic resin film, and the like. In addition, a sheet having a structure in which an aluminum foil is sandwiched between PVF films can be used.

Note that a substrate placed in a direction in which light is extracted through the liquid crystal elements 4011a and 4011b is formed using a light-transmitting material such as a glass plate, plastic, a polyester film, or an acrylic film.

Figure 26:
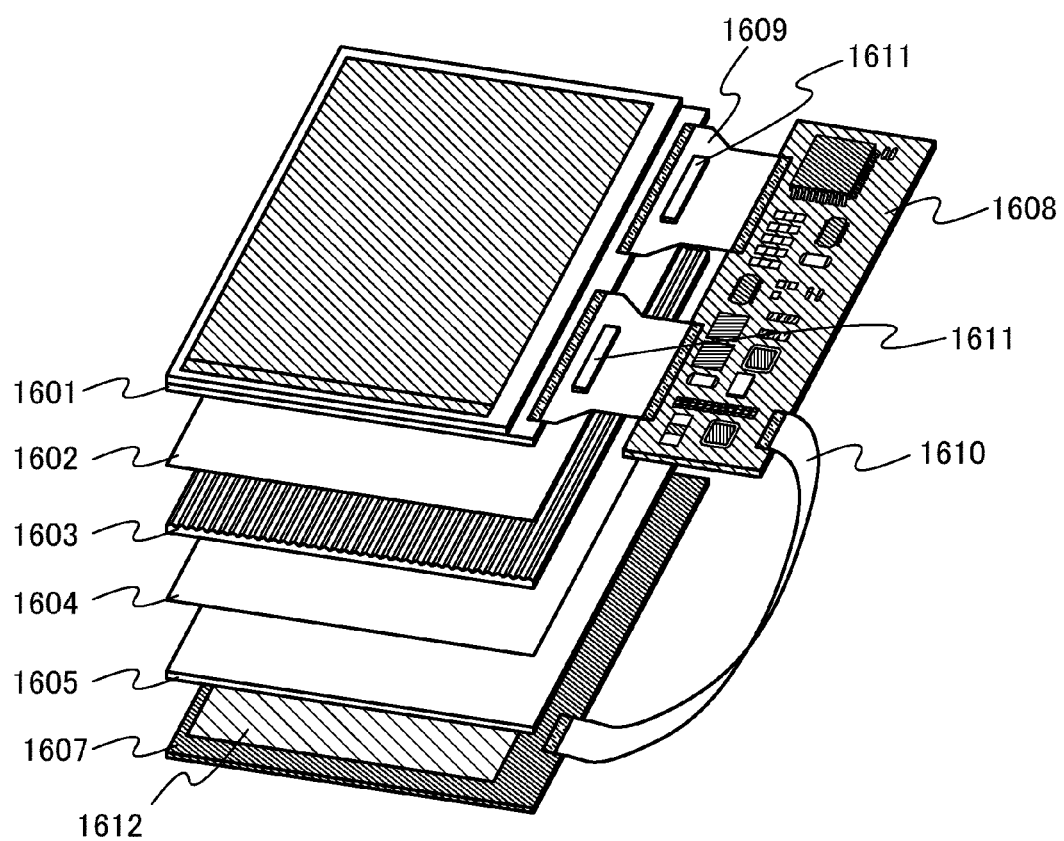
FIG. 26 is a perspective view illustrating a structure of a liquid crystal display device.

FIG. 26 is an example of a perspective view of the structure of the liquid crystal display device according to one embodiment of the present invention. The liquid crystal display device illustrated in FIG. 26 includes a panel 1601 including a pixel portion, a first diffusion plate 1602, a prism sheet 1603, a second diffusion plate 1604, a light guide plate 1605, a backlight panel 1607, a circuit board 1608, and substrates 1611 provided with signal line driver circuits.

The panel 1601, the first diffusion plate 1602, the prism sheet 1603, the second diffusion plate 1604, the light guide plate 1605, and the backlight panel 1607 are sequentially stacked. The backlight panel 1607 includes a backlight 1612 including a plurality of backlight units. Light from the backlight 1612 that is diffused in the light guide plate 1605 is delivered to the panel 1601 through the first diffusion plate 1602, the prism sheet 1603, and the second diffusion plate 1604.

Although the first diffusion plate 1602 and the second diffusion plate 1604 are used in this embodiment, the number of diffusion plates is not limited to two. The number of diffusion plates may be one, or may be three or more. It is acceptable as long as the diffusion plate is provided between the light guide plate 1605 and the panel 1601. Therefore, the diffusion plate may be provided only on the side closer to the panel 1601 than the prism sheet 1603, or may be provided only on the side closer to the light guide plate 1605 than the prism sheet 1603.

Further, the shape of the cross section of the prism sheet 1603, which is shown in FIG. 26, is not limited to a serrate shape; the shape may be a shape with which light from the light guide plate 1605 can be gathered to the panel 1601 side.

The circuit board 1608 is provided with a circuit which generates various signals input to the panel 1601, a circuit which processes the signals, or the like. In addition, in FIG. 26, the circuit board 1608 and the panel 1601 are connected to each other via COF tapes 1609. Further, the substrates 1611 provided with the signal line driver circuits are connected to the COF tapes 1609 by a chip on film (COF) method.

FIG. 26 illustrates an example in which the circuit board 1608 is provided with a control circuit which controls driving of the backlight 1612, and the control circuit and the backlight panel 1607 are connected to each other through an FPC 1610. Note that the control circuit may be formed over the panel 1601. In that case, the panel 1601 and the backlight panel 1607 are connected to each other through an FPC or the like.

This embodiment can be implemented in combination with other embodiments as appropriate.

EXAMPLE 1

With a liquid crystal display device according to one embodiment of the present invention, an electronic device capable of displaying a high-quality image can be provided. With the liquid crystal display device according to one embodiment of the present invention, an electronic device with low power consumption can be provided. In particular, in the case of a portable electronic device to which electric power cannot be easily supplied constantly, continuous use time becomes longer by adding the liquid crystal display device according to one embodiment of the present invention as a component, which is an advantage.

The liquid crystal display device according to one embodiment of the present invention can be used for display devices, laptop personal computers, or image reproducing devices provided with recording media (typically, devices which reproduce the content of recording media such as digital versatile discs (DVDs) and have displays for displaying the reproduced images). In addition to the above examples, as electronic devices each including the liquid crystal display device according to one embodiment of the present invention, mobile phones, portable game machines, portable information terminals, e-book readers, video cameras, digital still cameras, goggle-type displays (head mounted displays), navigation systems, audio reproducing devices (e.g., car audio components and digital audio players), copiers, facsimiles, printers, multifunction printers, automated teller machines (ATM), vending machines, and the like can be given. Specific examples of such an electronic device are illustrated in FIGS. 27A to 27F.

Figure 27A:
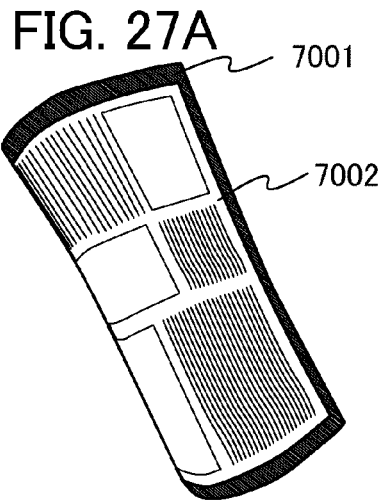
FIGS. 27A to 27F are views of electronic devices.

FIG. 27A illustrates an e-book reader including a housing 7001, a display portion 7002, and the like. A liquid crystal display device according to one embodiment of the present invention can be used for the display portion 7002. With the liquid crystal display device according to one embodiment of the present invention applied to the display portion 7002, an e-book reader capable of displaying a high-quality image or an e-book reader with low power consumption can be provided. Moreover, when a panel is formed with the use of a flexible substrate and a touch panel has flexibility, the liquid crystal display device can have flexibility; thus, a flexible, lightweight, and easy-to-use e-book reader can be provided.

Figure 27B:
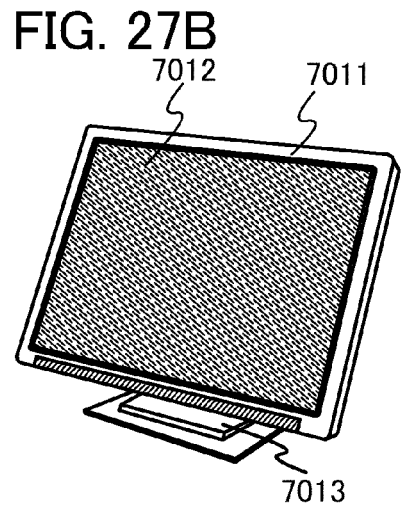

FIG. 27B illustrates a display device including a housing 7011, a display portion 7012, a supporting base 7013, and the like. A liquid crystal display device according to one embodiment of the present invention can be used for the display portion 7012. With the liquid crystal display device according to one embodiment of the present invention applied to the display portion 7012, a display device capable of displaying a high-quality image or a display device with low power consumption can be provided. The display device includes in its category, any information display device for personal computers, TV broadcast reception, advertisement, and the like.

Figure 27C:
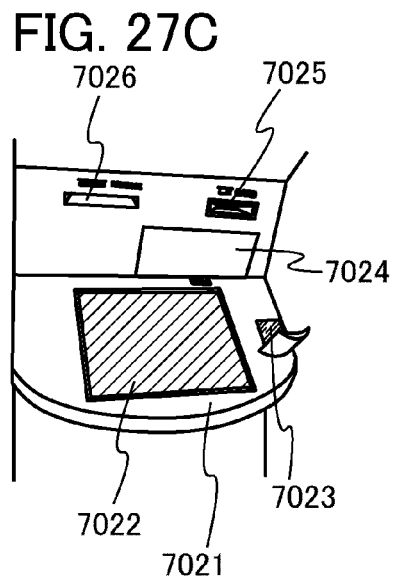

FIG. 27C illustrates an automated teller machine including a housing 7021, a display portion 7022, a coin slot 7023, a bill slot 7024, a card slot 7025, a bankbook slot 7026, and the like. A liquid crystal display device according to one embodiment of the present invention can be used for the display portion 7022. With the liquid crystal display device according to one embodiment of the present invention applied to the display portion 7022, an automated teller machine capable of displaying a high-quality image or an automated teller machine with low power consumption can be provided.

Figure 27D:
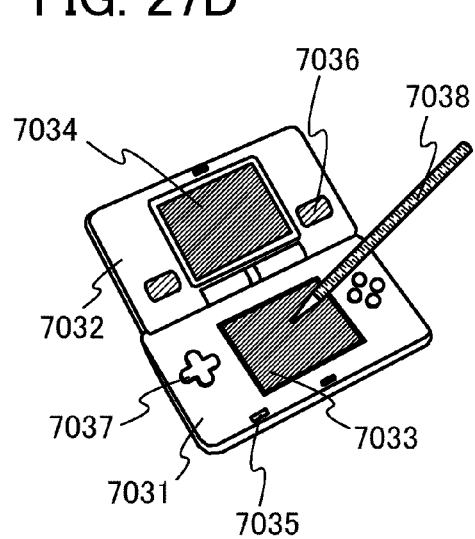

FIG. 27D illustrates a portable game machine including a housing 7031, a housing 7032, a display portion 7033, a display portion 7034, a microphone 7035, speakers 7036, an operation key 7037, a stylus 7038, and the like. A liquid crystal display device according to one embodiment of the present invention can be used for the display portion 7033 or the display portion 7034. With the liquid crystal display device according to one embodiment of the present invention applied to the display portion 7033 or the display portion 7034, a portable game machine capable of displaying a high-quality image or a portable game machine with low power consumption can be provided. Note that the portable game machine illustrated in FIG. 27D has the two display portions 7033 and 7034. However, the number of display portions included in a portable game machine is not limited thereto.

Figure 27E:
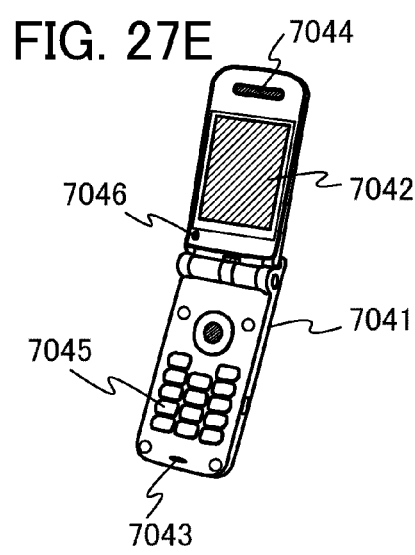

FIG. 27E illustrates a mobile phone which includes a housing 7041, a display portion 7042, an audio input portion 7043, an audio output portion 7044, operation keys 7045, a light-receiving portion 7046, and the like. Light received in the light-receiving portion 7046 is converted into electrical signals, whereby external images can be loaded. A liquid crystal display device according to one embodiment of the present invention can be used for the display portion 7042. With the liquid crystal display device according to one embodiment of the present invention applied to the display portion 7042, a mobile phone capable of displaying a high-quality image or a mobile phone with low power consumption can be provided.

Figure 27F:
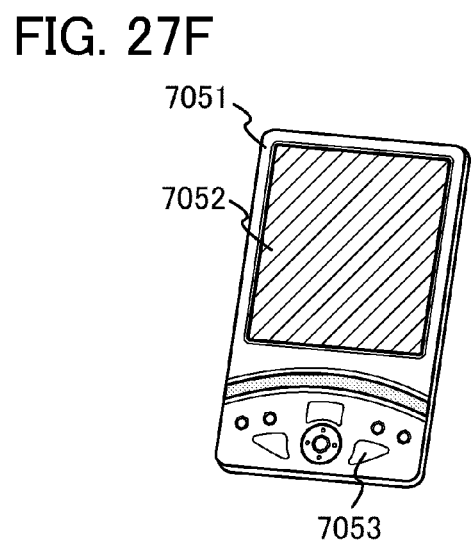

FIG. 27F illustrates a portable information terminal including a housing 7051, a display portion 7052, operation keys 7053, and the like. A modem may be incorporated in the housing 7051 of the portable information terminal illustrated in FIG. 27F. A liquid crystal display device according to one embodiment of the present invention can be used for the display portion 7052. With the liquid crystal display device according to one embodiment of the present invention applied to the display portion 7052, a portable information terminal capable of displaying a high-quality image or a portable information terminal with low power consumption can be provided.

This example can be implemented in combination with any of the above-described embodiments as appropriate.

This application is based on Japanese Patent Application serial no. 2010-178173 filed with Japan Patent Office on Aug. 6, 2010, the entire contents of which are hereby incorporated by reference.

What is claimed is:

1. A liquid crystal display device comprising:
a backlight portion comprising:
a first light source configured to emit a first light exhibiting a first hue; and
a second light source configured to emit a second light concurrently with the first light, the second light exhibiting a second hue which is different from the first hue;
a pixel portion including a plurality of pixels, each pixel comprising:
a first pixel electrode capable of transmitting light;
a second pixel electrode capable of reflecting light;
a first transistor; and
a second transistor,
wherein one of a source and a drain of the first transistor is electrically connected to a signal line,
wherein the other of the source and the drain of the first transistor is electrically connected to the first pixel electrode and one of a source and a drain of the second transistor,
wherein the other of the source and the drain of the second transistor is electrically connected to the second pixel electrode, and
wherein a gate electrode of the first transistor is electrically connected to a scan line and a gate electrode of the second transistor is electrically connected to an input signal line.

2. The liquid crystal display device according to claim 1, wherein the first transistor and the second transistor comprise an oxide semiconductor.

3. The liquid crystal display device according to claim 2, wherein the oxide semiconductor comprises indium and zinc.

4. The liquid crystal display device according to claim 2, wherein a hydrogen concentration of the oxide semiconductor is less than or equal to $5 \times 10^{19}/cm^3$.

5. The liquid crystal display device according to claim 2, wherein the oxide semiconductor is at least partly crystallized.

6. The liquid crystal display device according to claim 1, wherein the second pixel electrode overlaps the first transistor and the second transistor.

7. The liquid crystal display device according to claim 1, wherein each pixel further comprises an enable line electrically connected to the second transistor.

8. The liquid crystal display device according to claim 1, wherein the other of the source and the drain of the first transistor is directly connected to the one of the source and the drain of the second transistor.

9. The liquid crystal display device according to claim 1, wherein the second pixel electrode is electrically connected to the signal line via the first transistor and the second transistor so that an image signal is supplied from the signal line to the second pixel electrode via the first transistor and the second transistor.

10. A liquid crystal display device comprising:
a backlight portion comprising:
a first light source configured to emit a first light exhibiting a first hue; and
a second light source configured to emit a second light concurrently with the first light, the second light exhibiting a second hue which is different from the first hue;
a pixel portion including a plurality of pixels, each pixel comprising:
a first pixel electrode capable of transmitting light;
a second pixel electrode capable of reflecting light;
a first transistor; and
a second transistor,
wherein one of a source and a drain of the first transistor is electrically connected to a signal line,
wherein the other of the source and the drain of the first transistor is electrically connected to the first pixel electrode and one of a source and a drain of the second transistor,
wherein the other of the source and the drain of the second transistor is electrically connected to the second pixel electrode,
wherein color display is configured to be performed by dividing the pixel portion into a plurality of regions, controlling lighting of the first light source and the second light source in each of the plurality of regions, and driving the first transistor to apply a voltage to a part of a liquid crystal layer overlapping with the first pixel electrode,
wherein monochrome display is configured to be performed by driving the first transistor and the second transistor to apply a voltage to a part of the liquid crystal layer overlapping with the second pixel electrode in a period during which the first light source and the second light source are off, and
wherein a gate electrode of the first transistor is electrically connected to a scan line and a gate electrode of the second transistor is electrically connected to an input signal line.

11. The liquid crystal display device according to claim 10, wherein the first transistor and the second transistor comprise an oxide semiconductor.

12. The liquid crystal display device according to claim 11, wherein the oxide semiconductor comprises indium and zinc.

13. The liquid crystal display device according to claim 11, wherein a hydrogen concentration of the oxide semiconductor is less than or equal to $5 \times 10^{19}/cm^3$.

14. The liquid crystal display device according to claim 11, wherein the oxide semiconductor is at least partly crystallized.

15. The liquid crystal display device according to claim 10, wherein the second pixel electrode overlaps the first transistor and the second transistor.

16. The liquid crystal display device according to claim 10, wherein each pixel further comprises an enable line electrically connected to the second transistor.

17. The liquid crystal display device according to claim 10, wherein the other of the source and the drain of the first transistor is directly connected to the one of the source and the drain of the second transistor.

18. The liquid crystal display device according to claim 10, wherein the second pixel electrode is electrically connected to the signal line via the first transistor and the second transistor so that an image signal is supplied from the signal line to the second pixel electrode via the first transistor and the second transistor.

19. A liquid crystal display device comprising:
a backlight portion comprising:
- a first light source configured to emit a first light exhibiting a first hue; and
- a second light source configured to emit a second light concurrently with the first light, the second light exhibiting a second hue which is different from the first hue;

a pixel portion including a plurality of pixels, each pixel comprising:
- a first pixel electrode capable of transmitting light;
- a second pixel electrode capable of reflecting light;
- a first transistor; and
- a second transistor, wherein one of a source and a drain of the first transistor is electrically connected to a signal line,
wherein the other of the source and the drain of the first transistor is electrically connected to the first pixel electrode and one of a source and a drain of the second transistor,
wherein the other of the source and the drain of the second transistor is electrically connected to the second pixel electrode,
wherein the pixel portion is divided into at least a first region and a second region,
wherein the first light is configured to be supplied to the first region and the second light is configured to be supplied to the second region concurrently with an emission of the first light according to a first order, and
wherein a gate electrode of the first transistor is electrically connected to a scan line and a gate electrode of the second transistor is electrically connected to an input signal line.

20. The liquid crystal display device according to claim 19,
wherein the first transistor and the second transistor comprise an oxide semiconductor.

21. The liquid crystal display device according to claim 20,
wherein the oxide semiconductor comprises indium and zinc.

22. The liquid crystal display device according to claim 20,
wherein a hydrogen concentration of the oxide semiconductor is less than or equal to $5 \times 10^{19}/cm^3$.

23. The liquid crystal display device according to claim 20,
wherein the oxide semiconductor is at least partly crystallized.

24. The liquid crystal display device according to claim 19,
wherein the second pixel electrode overlaps the first transistor and the second transistor.

25. The liquid crystal display device according to claim 19, wherein each pixel further comprises an enable line electrically connected to the second transistor.

26. The liquid crystal display device according to claim 19, wherein the other of the source and the drain of the first transistor is directly connected to the one of the source and the drain of the second transistor.

27. The liquid crystal display device according to claim 19, wherein the second pixel electrode is electrically connected to the signal line via the first transistor and the second transistor so that an image signal is supplied from the signal line to the second pixel electrode via the first transistor and the second transistor.

* * * * *